US012133389B2

(12) United States Patent
Jung

(10) Patent No.: US 12,133,389 B2
(45) Date of Patent: Oct. 29, 2024

(54) SEMICONDUCTOR MEMORY DEVICE INCLUDING PASS TRANSISTORS WITH VARIABLE SIZES

(71) Applicant: SK hynix Inc., Icheon-si (KR)

(72) Inventor: Sung Wook Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 170 days.

(21) Appl. No.: 17/723,167

(22) Filed: Apr. 18, 2022

(65) Prior Publication Data

US 2022/0238544 A1    Jul. 28, 2022

Related U.S. Application Data

(63) Continuation-in-part of application No. 16/944,032, filed on Jul. 30, 2020, now Pat. No. 11,309,027.

(30) Foreign Application Priority Data

Apr. 20, 2020    (KR) ........................ 10-2020-0047216

(51) Int. Cl.
*G11C 16/04*    (2006.01)
*G11C 16/08*    (2006.01)
(Continued)

(52) U.S. Cl.
CPC ............. *H10B 43/40* (2023.02); *G11C 16/04* (2013.01); *G11C 16/08* (2013.01); *G11C 16/12* (2013.01);
(Continued)

(58) Field of Classification Search
CPC ......... G11C 16/04; G11C 16/08; G11C 16/12; G11C 16/28; G11C 16/0483; G11C 16/30; G11C 16/10
(Continued)

(56) References Cited

U.S. PATENT DOCUMENTS 7,239,556 B2 *    7/2007    Abe .................... G11C 11/5621
                                              365/185.17
7,301,815 B2 *    11/2007   Kurata ................. G11C 8/14
                                              365/185.24
(Continued)

FOREIGN PATENT DOCUMENTS

KR    1020120115011 A    10/2012
KR    1020170047843 A    5/2017
(Continued)

*Primary Examiner* — Tha-O H Bui
(74) *Attorney, Agent, or Firm* — WILLIAM PARK & ASSOCIATES LTD.

(57) ABSTRACT

A semiconductor memory device includes a memory cell array (MCA) and a pass transistor unit (PTU). The MCA includes memory block(s) that has source selection line(s) (SSL), word lines (WLs), drain selection line(s) (DSL), and dummy WL(s) (DWL). The PTU includes source pass transistor(s) to selectively transmit a source driving signal (source DS) to the SSL, memory pass transistors (MPTs) to selectively transmit a WL DS to the WLs, respectively, drain pass transistor(s) (PT) to selectively transmit a drain DS to the DSL, and dummy PT(s) to selectively transmit a DWL DS to the DWL. The source DS, the WL DS, the drain DS, and the DWL DS may each be associated with a respective (Continued)

voltage range. Sizes of the source PT, the MPTs, the drain PT, and the dummy PTs are set based on the respective voltage ranges.

15 Claims, 30 Drawing Sheets

(51) Int. Cl.
  *G11C 16/12* (2006.01)
  *G11C 16/28* (2006.01)
  *H10B 41/27* (2023.01)
  *H10B 41/41* (2023.01)
  *H10B 43/27* (2023.01)
  *H10B 43/40* (2023.01)

(52) U.S. Cl.
  CPC ............ *G11C 16/28* (2013.01); *H10B 41/27* (2023.02); *H10B 41/41* (2023.02); *H10B 43/27* (2023.02)

(58) Field of Classification Search
  USPC ..................................................... 365/185.17
  See application file for complete search history.

(56) References Cited

U.S. PATENT DOCUMENTS

| | | | |
|---|---|---|---|
| 7,336,541 B2 * | 2/2008 | Aritome | G11C 16/12 |
| | | | 365/185.13 |
| 7,876,618 B2 | 1/2011 | Lee et al. | |
| 8,027,199 B2 * | 9/2011 | Hwang | G11C 16/0483 |
| | | | 365/185.11 |
| 8,760,925 B2 | 6/2014 | Li | |
| 9,437,300 B2 | 9/2016 | Kamata et al. | |
| 10,319,738 B2 * | 6/2019 | Kim | H10B 43/27 |
| 11,107,540 B1 * | 8/2021 | Pachamuthu | G11C 16/3459 |
| 2001/0043483 A1 | 11/2001 | Yang | |
| 2005/0180213 A1 | 8/2005 | Abe et al. | |
| 2009/0268522 A1 | 10/2009 | Maejima | |
| 2012/0257452 A1 | 10/2012 | Kim et al. | |
| 2013/0229871 A1 | 9/2013 | Li | |
| 2014/0035619 A1 | 2/2014 | Zaitsu et al. | |
| 2017/0330628 A1 | 11/2017 | Oh et al. | |
| 2018/0294277 A1 | 10/2018 | Kim et al. | |

FOREIGN PATENT DOCUMENTS

| | | |
|---|---|---|
| KR | 101784999 B1 | 11/2017 |
| KR | 1020180113227 A | 10/2018 |

* cited by examiner

SEMICONDUCTOR MEMORY DEVICE INCLUDING PASS TRANSISTORS WITH VARIABLE SIZES

CROSS-REFERENCES TO RELATED APPLICATION

The present application is a continuation-in-part application of the U.S. patent application Ser. No. 16/944,032 filed with the USPTO on Jul. 30, 2020, and claims priority under 35 U.S.C. § 119(a) to Korean application number 10-2020-0047216, filed on Apr. 20, 2020, in the Korean Intellectual Property Office, which is incorporated herein by reference in its entirety.

BACKGROUND

1. Technical Field

Various embodiments generally relate to an electronic device, and more particularly, to a semiconductor memory device and a method of fabricating the same.

2. Related Art

In order to meet the consumer's standards of excellent performance and low price, an increase in the degree of integration of semiconductor devices is necessary. In particular, an increased degree of integration continues to be necessary because the degree of integration is an important factor in determining the price of a product in the semiconductor memory device. Accordingly, three-dimensional (3D) semiconductor memory devices with memory cells that are disposed in a 3D manner are proposed.

SUMMARY

In an embodiment, a semiconductor memory device may include a cell string in which a plurality of selection transistors, a plurality of dummy transistors and a plurality of memory cell transistors are coupled in series and a pass transistor (TR) unit with a plurality of pass transistors that transmit a plurality of driving signals to the cell string. The pass TR unit may include a plurality of first pass transistors configured to transmit a first driving signal with a first level voltage, among the plurality of driving signals, to the plurality of selection transistors, respectively, and a plurality of second pass transistors configured to transmit a second driving signal with a second level voltage that is higher than the first level voltage, among the plurality of driving signals, to the plurality of dummy transistors, respectively. A channel area of each of the plurality of second pass transistors may be larger than a channel area of each of the plurality of first pass transistors.

At least one of the plurality of pass transistors may include an isolation film formed in a substrate and configured to define an active region; a field stop region formed in the substrate under the isolation film; a channel trench formed in the active region with a depth that is identical to a depth of the isolation film from a surface of the substrate; a gate formed over the substrate that traverses both the active region and the isolation film and partially buried in the channel trench; and a source and drain formed in the active region on both sides of the gate. A line width of the isolation film and a line width of the channel trench may be identical in a first direction in which the gate extends. A line width of the channel trench may be identical to or smaller than a line width of the gate in a second direction that intersects the first direction.

At least one of the plurality of pass transistors may include an isolation film formed in a substrate and configured to define an active region; a field stop region formed in the substrate under the isolation film; a channel trench and junction trench formed in the active region and coupled together; a gate formed over the substrate that traverses both the active region and the isolation film and partially buried in the channel trench; an impurity region formed in the active region on both sides of the gate and separated by the junction trench; a junction insulation film configured to gap-fill a part of the junction trench; and a conductive film configured to gap-fill the remaining junction trench on the junction insulation film and to electrically couple the separated impurity regions.

A depth of the isolation film, a depth of the channel trench, and a depth of the junction trench from a surface of the substrate may be identical. A line width of the isolation film, a line width of the channel trench and a line width of the junction trench may be identical in a first direction in which the gate extends. A line width of the channel trench may be identical to a line width of the gate in a second direction that intersects the first direction. The channel trench and the junction trench may be couple to have a line-type pattern that is extended in the second direction. An interface where the junction insulation film and the conductive film adjoin may be located at a position that is higher than a bottom of the impurity region.

In an embodiment, a semiconductor memory device may include a plurality of memory blocks and a pass transistor (TR) unit configured to transmit a plurality of driving signals to any one memory block, selected among the plurality of memory blocks, in response to a block selection signal and comprising a plurality of pass transistors. The pass TR unit may include a first pass transistor configured to transmit a first driving signal with a first level voltage among the plurality of driving signals and formed in a first active region, a second pass transistor configured to transmit a second driving signal with a second level voltage that is higher than the first level voltage, among the plurality of driving signals, and formed in a second active region, and a third pass transistor configured to transmit a third driving signal with a third level voltage that is higher than the second level voltage, among the plurality of driving signals, and formed in a third active region. The area of the third active region may be the largest, and the area of the first active region may be the smallest.

In an embodiment, a method of fabricating at least one of a plurality of pass transistors for transmitting a plurality of driving signals to any one memory block, selected among a plurality of memory blocks, in response to a block selection signal in a semiconductor memory device may include forming an isolation film to define an active region by selectively etching a substrate, forming a channel trench with a depth that is identical to a depth of the isolation film from a surface of the substrate, forming, over the substrate, a gate that traverses both the active region and the isolation film and partially bury the channel trench, and forming impurity regions in the active region on both sides of the gate.

The forming of the isolation film may include forming an isolation trench by selectively etching the substrate; forming a field stop region by implanting impurity ions into the substrate under a bottom of the isolation trench; and forming a gap-fill insulating film to bury the isolation trench. A line width of the isolation film and a line width of the channel trench may be identical in a first direction in which the gate extends. A line width of the channel trench may be identical to or smaller than a line width of the gate in a second direction that intersects the first direction.

In an embodiment, a method of fabricating at least one of a plurality of pass transistors for transmitting a plurality of driving signals to any one memory block, selected among a plurality of memory blocks, in response to a block selection signal in a semiconductor memory device may include forming an isolation film to define an active region by selectively etching a substrate, forming a channel trench and junction trench each with a depth identical to a depth of the isolation film from a surface of the substrate, forming a junction insulation film to gap-fill the junction trench, forming, over the substrate, a gate that traverses both the active region and the isolation film and partially bury the channel trench, forming impurity regions in the active region on both sides of the gate, and partially recessing the junction insulation film and forming a conductive film to adjoin the impurity regions in the recessed region.

The forming of the isolation film may include forming an isolation trench by selectively etching the substrate; forming a field stop region by implanting impurity ions into the substrate under a bottom of the isolation trench; and forming a gap-fill insulating film to bury the isolation trench. A line width of the isolation film, a line width of the channel trench, and a line width of the junction trench may be identical in a first direction in which the gate extends. A line width of the channel trench may be identical to a line width of the gate in a second direction that intersects the first direction. The channel trench and the junction trench may be couple to form a line-type pattern that is extended in the second direction. In the forming of the conductive film, an interface where the conductive film and the junction insulation film adjoin may be located at a position that is higher than a bottom of the impurity region.

In an embodiment, a memory cell array may include at least one memory block that may include at least one source selection line, a plurality of word lines, at least one drain selection line, and at least one dummy word line, which are stacked.

The memory cell array may also include a pass transistor (TR) unit that may include: at least one source pass transistor configured to selectively transmit a source driving signal to the source selection line, a plurality of memory pass transistors configured to selectively transmit a word line driving signal to the plurality of word lines, respectively, at least one drain pass transistor configured to selectively transmit a drain driving signal to the drain selection line, and at least one dummy pass transistor configured to selectively transmit a dummy word line driving signal to the at least one dummy word line.

The source driving signal, the word line driving signal, the drain driving signal, and the dummy word line driving signal may each be associated with a respective voltage range.

Sizes of the source pass transistor, the plurality of memory pass transistors, the drain pass transistor, and the plurality of dummy pass transistors may be set based on the respective voltage ranges.

In an embodiment, a semiconductor memory device may include a substrate, a memory cell array disposed over the substrate. The memory cell array may include a lower memory stack and an upper memory stack arranged over the lower memory stack. Each of the lower and the upper memory stacks may include at least one selection line and a plurality of word lines that are stacked. The upper memory stack may be farther from the substrate than the lower memory stack.

The semiconductor memory device may also include a pass transistor (TR) unit disposed between the substrate and the memory cell array. The pass TR unit may include at least one first pass transistor configured to selectively transmit a first driving signal to the selection line of the lower memory stack, a plurality of first memory pass transistors configured to selectively transmit a word line driving signal to the plurality of word lines of the lower memory stack, a plurality of second memory pass transistors configured to selectively transmit the word line driving signal to the plurality of word lines of the upper memory stack, and at least one second pass transistor may be configured to selectively transmit a second driving signal to the selection line of the upper memory stack.

The at least one first pass transistor, the plurality of first memory pass transistors, the plurality of second memory pass transistors, and the at least one second pass transistor may be configured to be simultaneously turned on in response to a selection signal. Driving forces of the plurality of second memory pass transistors may be greater than driving forces of the plurality of first memory pass transistors.

DETAILED DESCRIPTION

Figure 1:
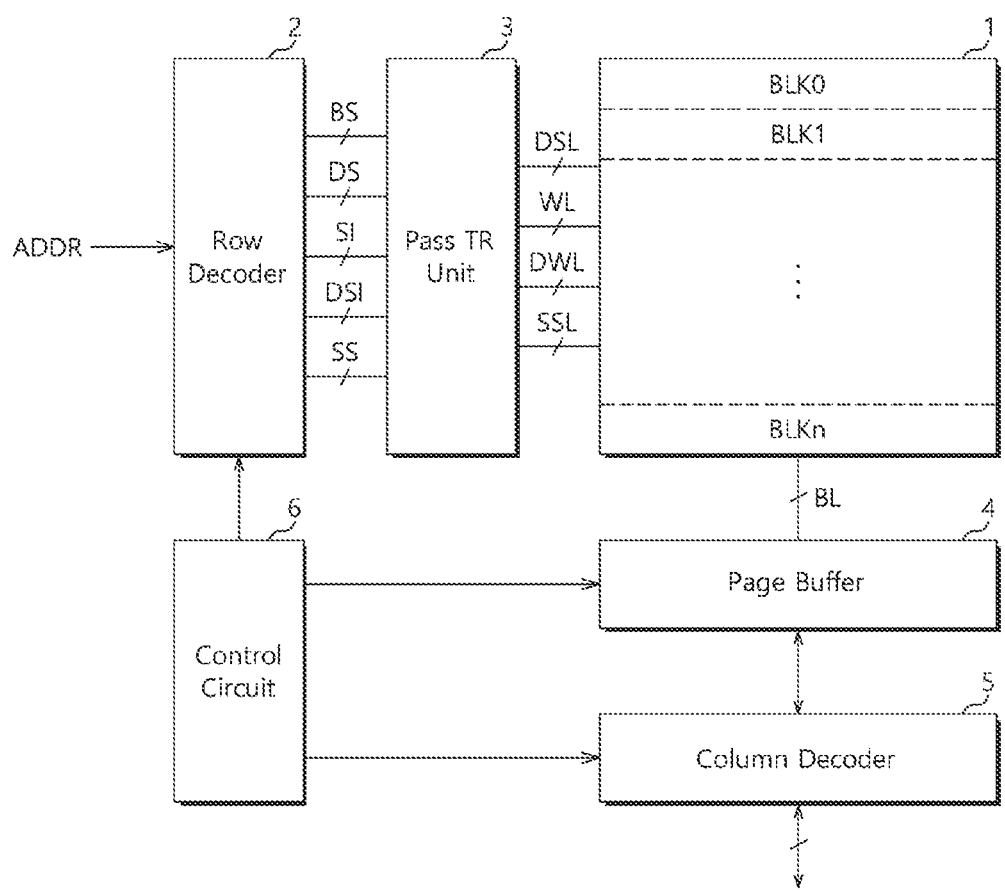
FIG. 1 is a diagram, describing a schematic configuration of a semiconductor memory device, according to an embodiment.

Advantages and characteristics of the present disclosure and a method of achieving advantages and characteristics will become more apparent from the embodiments described in detail in conjunction with the accompanying drawings. However, the present disclosure is not limited to the disclosed embodiments, but may be implemented in various different ways. The embodiments are provided to only complete the present disclosure and to allow those skilled in the art to fully understand the scope of the present disclosure. The present disclosure is only defined by the claims. In the drawings, the sizes and relative sizes of layers and regions may have been exaggerated for the clarity of description.

The same reference numerals refer to the same elements throughout the specification.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Embodiments to be described later are for providing a semiconductor memory device with a stabilized structure, an improved characteristic and an increased degree of integration and a method of fabricating the same. More specifically, the embodiments relate to a semiconductor memory device with a plurality of memory blocks and a pass transistor (TR) unit configured to transmit a plurality of driving signals to any one memory block selected among the plurality of memory blocks in response to a block selection signal, and a method of fabricating the same.

For reference, in a semiconductor memory device with a three-dimensional (3D) structure that is introduced to increase the degrees of integration of semiconductor memory devices, for example, a 3D NAND flash memory device, the area occupied by a pass TR unit within the region of a row decoder (X-DEC) to drive a memory cell array (or memory cell stack) has been continuously increased in proportion to an increase in the number of stacks of word lines in the memory cell array. Accordingly, even in a per-under cell (PUC) structure in which a peripheral circuit with the pass TR unit is positioned under the memory cell array, the area of the pass TR unit becomes larger than the area occupied by a stepwise contact region for coupling the memory cell array and the peripheral circuit, acting as a bottleneck to reduce the chip size. In particular, the entire layout of the pass TR unit has a bar type shape with a long axis in the direction in which the gate lines of the pass transistor extend due to a contact connection relation with the memory cell array, by using a package fit-in problem. Accordingly, it is necessary to reduce the area of the entire layout of the pass TR unit by reducing the size of a pass transistor without degrading operating characteristics of the pass transistor.

Hereinafter, a semiconductor memory device and a method of fabricating the same according to embodiments are described in detail with reference to the accompanying drawings.

Embodiments provide a semiconductor memory device with a stabilized structure, an improved characteristic and an increased degree of integration and a method of fabricating the same.

FIG. 1 is a diagram, describing a schematic configuration of a semiconductor memory device, according to an embodiment.

As illustrated in FIG. 1, the semiconductor memory device may include a memory cell array 1, a row decoder 2, a pass transistor (TR) unit 3, a page buffer 4, a column decoder 5, and a control circuit 6.

The memory cell array 1 may include a plurality of memory blocks BLK0 to BLKn. Each of the memory blocks BLK0 to BLKn may include a plurality of memory cells that are disposed in a 3D manner and may include a plurality of word lines WL and bit lines BL that are electrically coupled to the memory cells.

The row decoder 2 may select any one of the memory blocks BLK0 to BLKn by decoding an external input address ADDR and may select any one of the word lines WL of the selected memory block. Furthermore, the row decoder 2 may be coupled to the plurality of memory blocks BLK0 to BLKn, in common, and may provide the word lines WL and DWL of a memory block (i.e., one of the memory blocks BLK0 to BLKn), selected in response to a block selection signal BS, and selection lines SSL and DSL with driving signals SS, DS, SI, and DSI that are generated by a voltage generator (not illustrated). For reference, "SS", "DS", "SI", and "DSI" may denote driving signals that are applied to a source selection transistor, a drain selection transistor, a memory cell transistor and a dummy memory cell transistor, respectively.

The pass TR unit 3 may be coupled to the memory cell array 1 through the word lines WL and DWL and the selection lines DSL and SSL. The pass TR unit 3 may be controlled by the block selection signal BS that is provided by the row decoder 2. The pass TR unit 3 may transmit the word line driving signals SI and the dummy word line driving signals DSI and the selection signals SS and DS to the word lines WL and DWL of the selected memory blocks BLK0 to BLKn and the selection lines DSL and SSL.

In one embodiment, the memory cell array 1 may include 3D NAND flash memory cells. A program voltage, a read voltage, a pass voltage, and a verification voltage that are generated by the voltage generator (not illustrated) may be provided to the word lines WL and DWL of the memory cell array 1 as the word line signals SI and DSI. In this case, the program voltage may be a voltage that is relatively higher than the read voltage, the pass voltage, or the verification voltage. Accordingly, the pass TR unit 3 may include high voltage transistors that are capable of withstanding a high voltage.

The page buffer 4 may be coupled to the memory cell array 1 through the bit lines BL and may read information that is stored in memory cells. The page buffer 4 may be coupled to a bit line selected based on an address that is decoded by the column decoder 5. The page buffer 4 may temporarily store data to be stored in memory cells or may detect data that is stored in memory cells based on an operating mode. For example, the page buffer 4 may operate as a write driver circuit in a program operation mode and may operate as a sense amplifier circuit in a read operation mode. The page buffer 4 may receive power (e.g., voltage or current) from the control circuit 6 and may provide the power to a selected bit line.

The column decoder 5 may provide a data transmission path between the page buffer 4 and an external device (e.g., memory controller). The column decoder 5 may select any one of the bit lines by decoding an external input address. The column decoder 5 may be coupled to the plurality of memory blocks BLK0 to BLKn, in common, and may provide data (or information) to the bit lines of the memory blocks BLK0 to BLKn selected in response to the block selection signal BS.

The control circuit 6 may control an overall operation of the 3D semiconductor memory device. The control circuit 6 may receive a control signal and an external voltage and may operate in response to the received control signal. The control circuit 6 may include the voltage generator (not illustrated) for generating voltages (e.g., program voltage, read voltage, and erase voltage) necessary for an internal operation by using the external voltage. The control circuit 6 may control a read, write and/or erase operation in response to the control signals.

Figure 2:
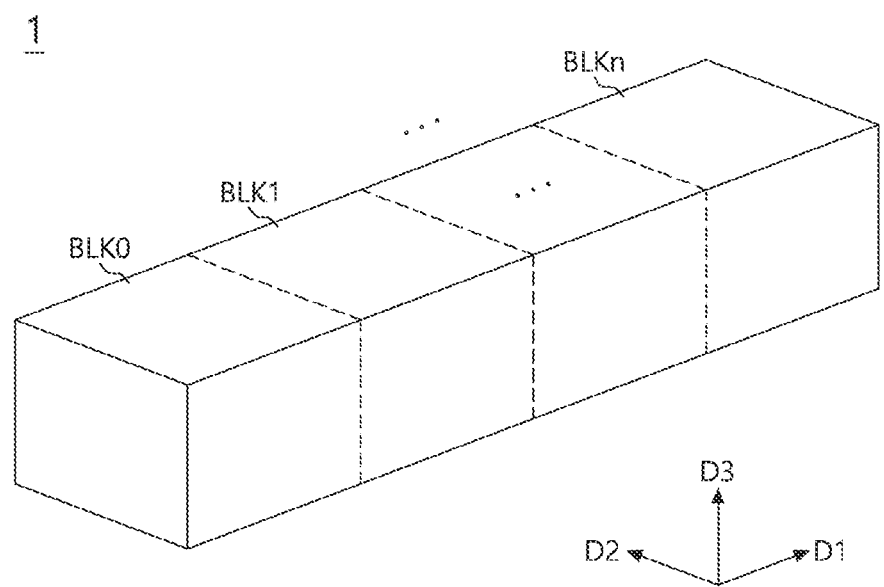
FIG. 2 is a block diagram, illustrating a memory cell array of the semiconductor memory device, according to an embodiment.

FIG. 2 is a block diagram, illustrating the memory cell array 1 of the semiconductor memory device, according to an embodiment.

As illustrated in FIG. 2, in the semiconductor memory device, the memory cell array 1 may include the plurality of memory blocks BLK0 to BLKn. Each of the memory blocks BLK0 to BLKn may include a memory cell stack with word lines that are stacked in a third direction D3 on a plane that is elongated in a first direction D1 and a second direction D2.

In this case, the word lines of the memory cell stack may configure memory cells that are disposed in a 3D manner in combination with a plurality of vertical semiconductor pillars. Furthermore, each of the memory blocks BLK0 to BLKn may include bit lines that are electrically coupled to the memory cells. For reference, the memory cell stack may have various publicly-known structures and the technical spirit of the present disclosure may be applied to all the memory cell stacks with various publicly-known structures. In the present embodiment, a detailed description of the memory cell stack is omitted.

Figure 3:
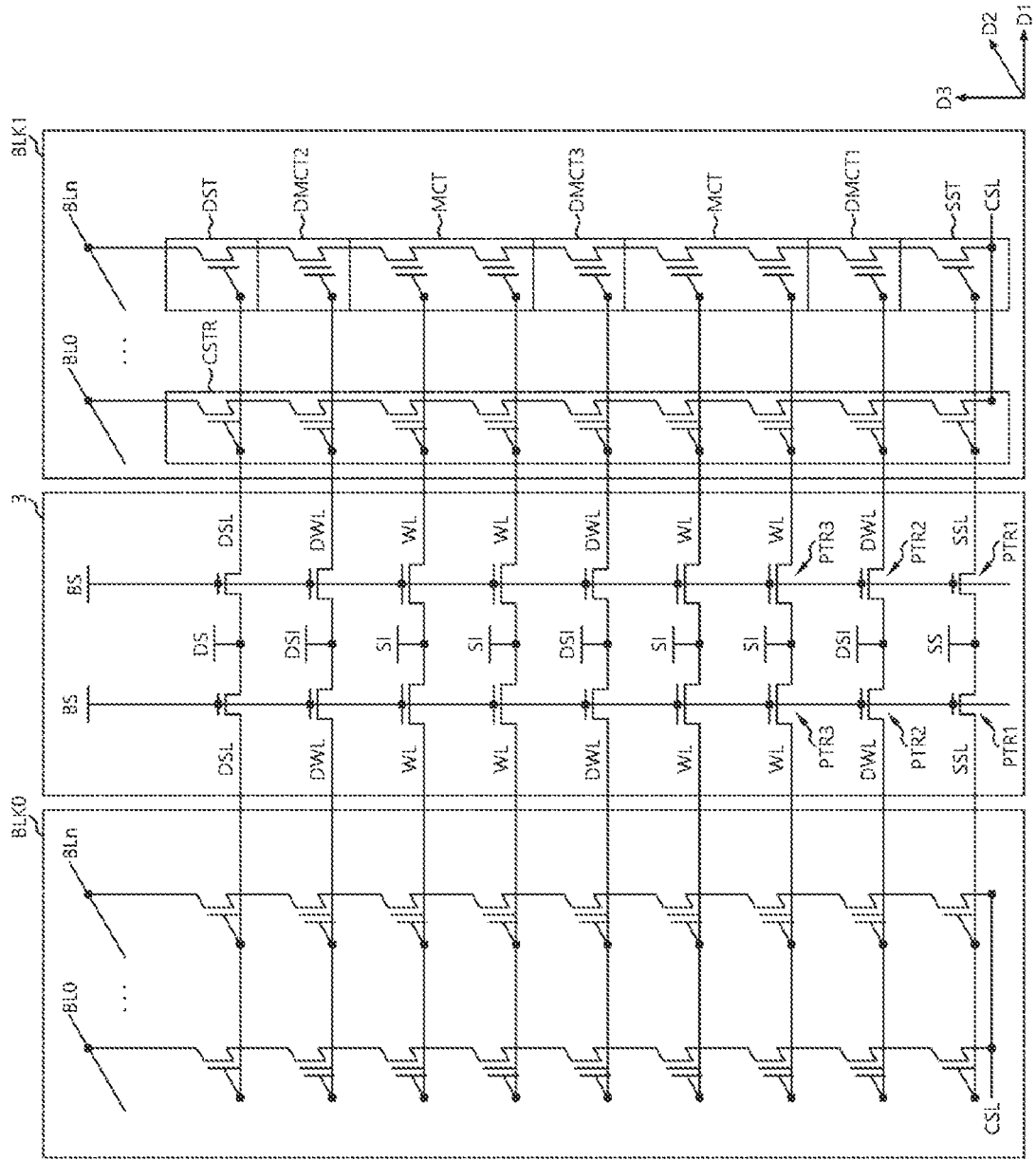
FIG. 3 is an equivalent circuit diagram, illustrating memory blocks and a pass TR unit in the semiconductor memory device, according to an embodiment.

FIG. 3 is an equivalent circuit diagram, illustrating the memory blocks BLK0 and BLK1 and the pass TR unit 3 in the semiconductor memory device according to an embodiment.

As illustrated in FIG. 3, in the semiconductor memory device, the pass TR unit 3 may be coupled to correspond to each of the memory blocks BLK0 and BLK1. FIG. 3 illustrates a case where the pass TR unit 3 is configured with two pass transistor arrays that correspond to the first memory block BLK0 and the second memory block BLK1, respectively. Each of the memory blocks BLK0 and BLK1 may include a common source line CSL, a plurality of bit lines BL0 to BLn, and a plurality of cell strings CSTR that are disposed between the common source line CSL and the bit lines BL0 to BL2.

The bit lines BL0 to BLn may be disposed in a 2D manner. The plurality of cell strings CSTR may be coupled in parallel to each of the bit lines BL0 to BLn. The cell strings CSTR may be coupled to the common source line CSL in common. That is, the plurality of cell strings CSTR may be disposed between the plurality of bit lines BL0 to BLn and one common source line CSL. For example, the common source line CSL may be disposed in a 2D manner in a plural number. In this case, the same voltage may be electrically applied to the common source lines CSL or the common source lines CSL may be independently controlled.

Each of the cell strings CSTR may be configured with a source selection transistor SST that is coupled to the common source line CSL, a drain selection transistor DST that is coupled to the bit lines BL0 to BLn, and a plurality of memory cell transistors MCT and a plurality of dummy memory cell transistors DMCT1 to DMCT3 that are disposed between the source selection transistor SST and the drain selection transistor DST. Furthermore, the source selection transistor SST, the drain selection transistor DST, the memory cell transistors MCT and the dummy memory cell transistors DMCT1 to DMCT3 may be coupled in series. In this case, each of the plurality of dummy memory cell transistors DMCT1 to DMCT3 may have the same structure as the memory cell transistor MCT, but may function to couple adjacent transistors to prevent the deterioration in characteristics attributable to the difference between driving voltages. Specifically, the first dummy memory cell transistor DMCT1 of the dummy memory cell transistors DMCT1 to DMCT3 may be positioned between the source selection transistor SST and the memory cell transistor MCT. The second dummy memory cell transistor DMCT2 may be positioned between the drain selection transistor DST and the memory cell transistor MCT. Furthermore, the third dummy memory cell transistor DMCT3 may be positioned between the memory cell transistors MCT. The present embodiment illustrates a case where a memory cell stack is formed twice, that is, a case where the memory cell stack has a structure in which an upper memory stack and a lower memory stack are stacked. In this case, the third dummy memory cell transistor DMCT3 may be positioned in the middle of a plurality of memory cell transistors MCT, that is, in the lowermost layer of the upper memory stack that adjoins the lower memory stack. In other words, the third dummy memory cell transistor DMCT3 may be positioned in the middle of the cell strings CSTR. For reference, if a memory cell stack is formed twice by being divided into a lower memory stack and an upper memory stack, memory cell transistors MCT that are formed in the boundary area between the lower memory stack and upper memory stack may have different characteristics due to a process deviation. In order to prevent this problem, as in the present embodiment, the third dummy memory cell transistor DMCT3 may be positioned in the boundary area between the lower memory stack and upper memory stack, for example, in the lowermost layer of the upper memory stack that adjoins the lower memory stack. Accordingly, it is possible to minimize the difference between the characteristics of memory cell transistors MCT that are attributable to a process deviation, positioned above and below the third dummy memory cell transistor DMCT3, respectively.

If a memory cell stack is formed three times, that is, the memory cell stack is formed to have a structure in which a first memory cell stack to a third memory cell stack are sequentially stacked, third dummy memory cell transistors DMCT3 may be disposed between the first memory cell stack and the second memory cell stack and between the second memory cell stack and the third memory cell stack. In this case, the number of memory cell transistors DMCT that are disposed above may be the same as or different from the number of memory cell transistors DMCT that are disposed below the third dummy memory cell transistor DMCT3.

The cell strings CSTR may be extended in the third direction D3 on the plane that is elongated in the first direction D1 and the second direction D2. For reference, FIG. 3 illustrates a case where one cell string CSTR has one source selection transistor SST and one drain selection transistor DST, but each of the source selection transistor SST and the drain selection transistor DST may be configured with a plurality of selection transistors that are coupled in series. In this case, the number of selection transistors SST that are coupled in series may be equal to or larger than the number of drain selection transistors DST that are coupled in series.

The common source line CSL may be coupled to the sources of the source selection transistors SST in common. The source selection line SSL, the plurality of word lines WL, the plurality of dummy word lines DWL, and the drain selection lines DSL, which are disposed between the common source line CSL and the bit lines BL0 to BLn, may be used as the gate electrodes of the source selection transistor SST, the memory cell transistors MCT, the dummy memory cell transistor DMCT, and the drain selection transistor DST, respectively.

The gate electrodes of the source selection transistors SST may be coupled to the source selection line SSL in common. The gate electrodes of the plurality of memory cell transistors MCT that are disposed at the same distance from the common source line CSL may be coupled to one of the word lines WL in common. The gate electrodes of the drain selection transistor DST may be coupled to the drain selection line DSL in common. The drain selection line DSL may be extended in the first direction D1 that intersects the bit lines BL0 to BLn.

In addition, each of the memory cell transistors MCT may include a data storage element. In the present embodiment, the data storage element may be a charge storage film. For example, the charge storage film may be any one of a trap insulating film, a floating gate electrode and an insulating film with conductive nano dots. Furthermore, the data storage element may be a variable resistance film. For example, the variable resistance film may be any one of material films with a bandgap, a chemical potential, ion mobility, filament generation, an atom movement, an electron spin, or a phase change characteristic.

The pass TR unit 3 may include a plurality of pass transistors PTR that are coupled to the word lines WL, the dummy word lines DWL, and the selection lines SSL and DSL, respectively. The pass TR unit 3 may transmit the driving signals DS, SI, DSI, and SS to the selected memory blocks BLK0 and BLK1 in response to the block selection signal BS. In this case, the driving signals may have voltages of different levels. For example, the selection line driving signals DS and SS may each have a first level voltage. The dummy word line driving signal DSI may have a second level voltage that is higher than the first level voltage. The word line driving signal SI may have a third level voltage that is higher than the second level voltage.

In order to reduce the area of the entire layout of the pass TR unit 3, two or more pass transistors PTR that are adjacent to each other in the pass TR unit 3 may have a structure in which the two or more pass transistors PTR are coupled in series by sharing an active region and a drain. In this case, the pair of pass transistors PTR that share the drain may transmit the driving signals DS, SI, DSI, and SS, transmitted through the shared drain, to the different memory blocks BLK0 and BLK1 through sources thereof. Furthermore, different block selection signals BS may be applied to the gates of the pair of pass transistors PTR that share the drain, respectively.

Furthermore, in order to reduce the area of the entire layout of the pass TR unit 3 and the entire layout width in the direction in which the gate of the pass transistor extends, the plurality of pass transistors PTR that configure the pass TR unit 3 may have different channel areas based on the type of driving signals DS, SI, DSI, and SS. For example, in the pass TR unit 3, each of the pass transistors PTR that is coupled to the word lines WL may have a larger channel area than each of the pass transistors PTR that is coupled to the dummy word lines DWL and the selection lines SSL and DSL. Furthermore, each of the pass transistors PTR that is coupled to the dummy word lines DWL may have a larger channel area than each of the pass transistors PTR that is coupled to the selection lines SSL and DSL.

Furthermore, the pass TR unit 3 may be formed on a substrate that is adjacent to the memory cell array (or memory cell stack), formed on the substrate, or may have a structure in which the pass TR unit 3 and the memory cell array are sequentially stacked on a substrate. In the latter case, the area of the semiconductor memory device may be more easily reduced because the pass TR unit 3 and the memory cell array would overlap.

Figure 4A:
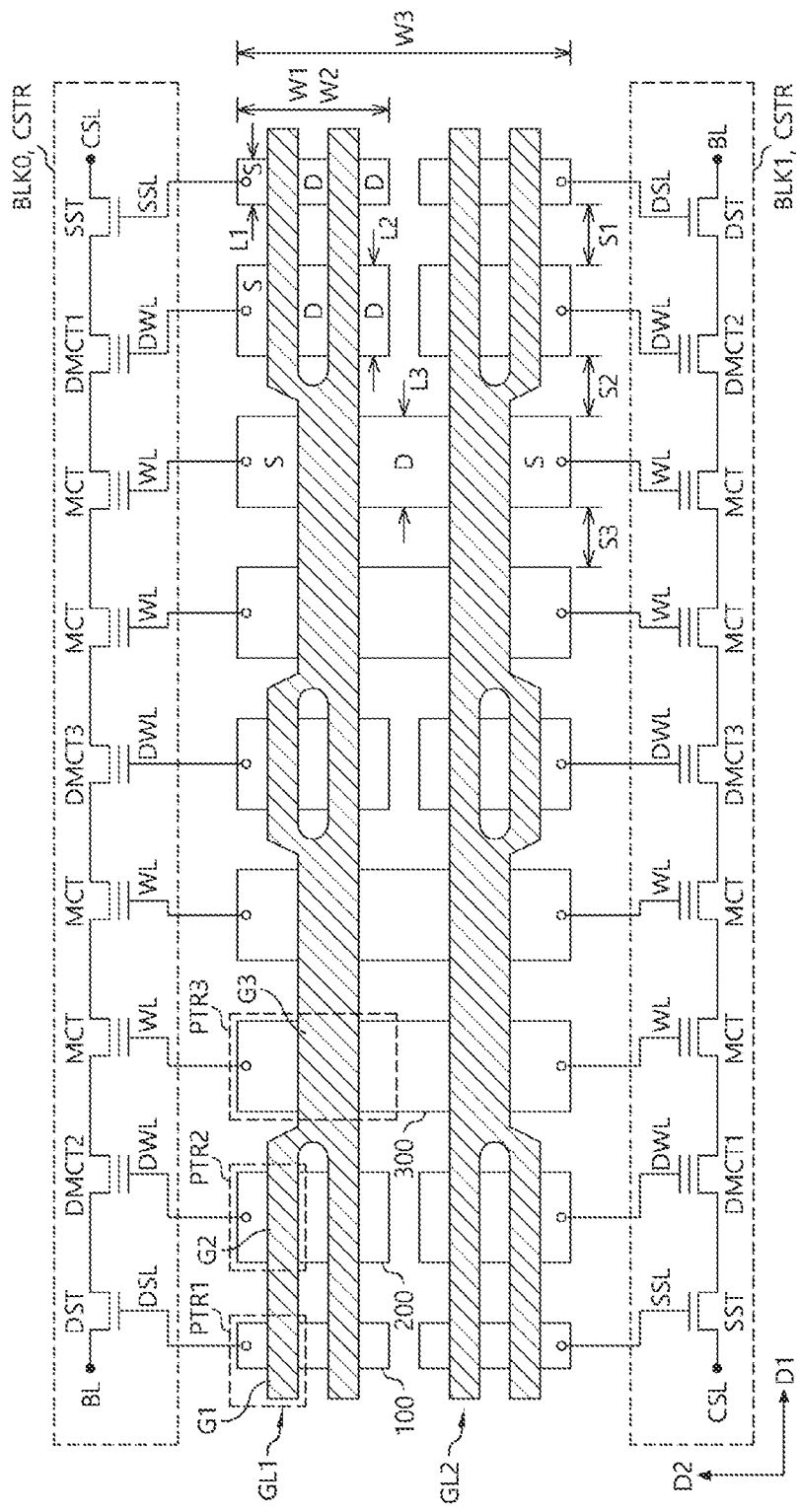
FIG. 4A is a plan view, illustrating a pass TR unit of the semiconductor memory device, according to a first embodiment.
Figure 4B:
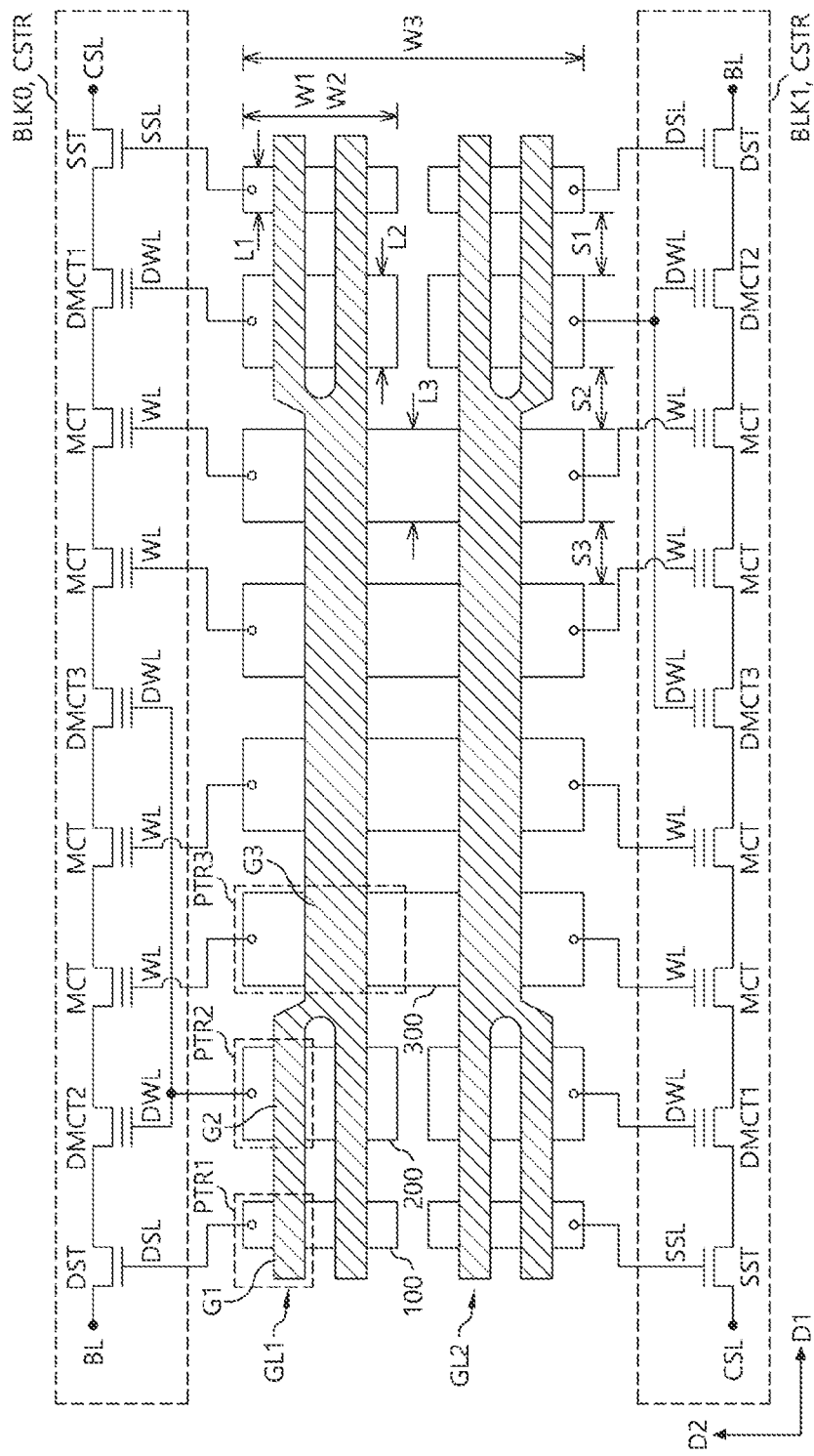
FIGS. 4B and 4C are plan views, illustrating modified examples of the pass TR unit of the semiconductor memory device, according to the first embodiment.
Figure 4C:
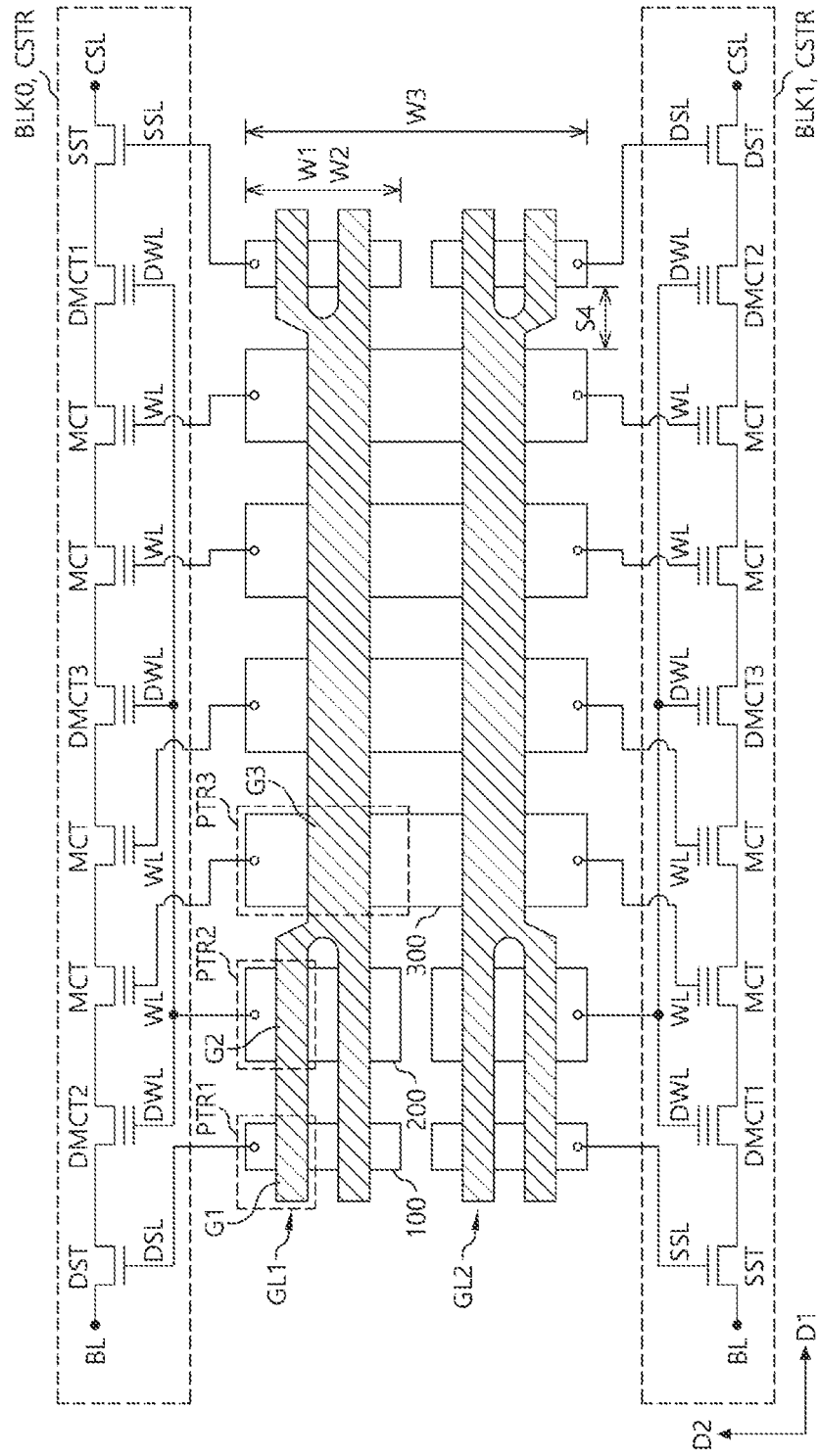

FIG. 4A is a plan view, illustrating a pass TR unit of the semiconductor memory device, according to a first embodiment. FIGS. 4B and 4C are plan views, illustrating modified examples of the pass TR unit of the semiconductor memory device, according to the first embodiment.

As illustrated in FIGS. 3 and 4A, the pass TR unit may include a plurality of first pass transistors PTR1, a plurality of second pass transistors PTR2 and a plurality of third pass transistors PTR3.

Each of the plurality of first pass transistors PTR1 may have a drain D to which the driving signal SS, DS, having a first level voltage, is applied, and may supply the first level voltage to the gate of the source selection transistor SST and the gate of the drain selection transistor DST in response to the block selection signal BS that is applied to a gate thereof. In a pass TR unit or pass transistor array that corresponds to any one of the memory blocks BLK0 and BLK1, the number of first pass transistors PTR1 may be the same as the sum of the number of source selection transistors SST and the number of drain selection transistors DST in the cell string CSTR.

In a pass TR unit that corresponds to any one of the memory blocks BLK0 and BLK1, a plurality of first pass transistors PTR1 may be disposed in the outermost part in the first direction D1. That is, the arrangement of the first pass transistors PTR1 in the first direction D1 in the pass TR unit may correspond to the arrangement of the source selection transistor SST and the drain selection transistor DST in the cell string CSTR that is extended vertically to a surface of the substrate. Among the plurality of first pass transistors PTR1 in the first direction D1, a first pass transistor PTR1 that is coupled to the source selection transistor SST that is positioned at the bottom of the cell string CSTR may be positioned to be adjacent to the cell string CSTR, and a first pass transistor PTR1 that is coupled to the drain selection transistor DST that is positioned at the top of the cell string CSTR may be positioned at the furthest distance from the cell string CSTR.

Each of the plurality of first pass transistors PTR1 may include a first active region 100, a first gate G1 that is formed in the first active region 100 and extended in the first direction D1, and a source S and a drain D that are formed in the first active region 100 on both sides of the first gate G1 in the second direction D2. In this case, two first gates G1 may be formed in the first active region 100. In order to reduce the area, the plurality of first pass transistors PTR1 may have a structure in which a pair of the first pass transistors PTR1, that share the drain D, shares one first active region 100. FIG. 4A illustrates a case where only one of the pair of first pass transistors PTR1, sharing the first active region 100, is coupled to the selection transistor, for convenience of description. However, the other first pass transistor PTR1 may also be coupled to the selection transistor. In this case, the pair of first pass transistors PTR1 may be coupled to the same selection transistor or different selection transistors.

The first active region 100 may have a bar type shape with a long axis that is extended in the second direction D2 and a short axis that is extended in the first direction D1. A short-axis line width L1 of the first active region 100 may correspond to the channel width of the first pass transistor PTR1.

Each of the plurality of second pass transistors PTR2 may have a drain D thereof to which the driving signal DSI, having a second level voltage that is higher than the first level voltage, is applied, and may supply the second level voltage to the gates of the dummy transistors DMCT in response to the block selection signal BS that is applied to a gate thereof. In a pass TR unit or pass transistor array that corresponds to any one of the memory blocks BLK0 and BLK1, the number of second pass transistors PTR2 may be equal to or smaller than the number of dummy transistors DMCT in the cell string CSTR. The latter case will be described in detail in a modified example to be described later.

In a pass TR unit that corresponds to any one of the memory blocks BLK0 and BLK1, some of the plurality of second pass transistors PTR2 may be disposed between the first pass transistor PTR1 and the third pass transistor PTR3 in the first direction D1 and may transmit the driving signal DSI, having the second level voltage, to the first dummy transistor DMCT1 and the second dummy transistor DMCT2. The remainder of the plurality of second pass transistors PTR2 may be disposed in the middle of the pass TR unit, that is, between the third pass transistors PTR3. The second pass transistor PTR2 that is positioned between the third pass transistors PTR3 may transmit the driving signal DSI, having the second level voltage, to the third dummy transistor DMCT3. That is, the arrangement of the second pass transistors PTR2 in the first direction D1 in the pass TR unit may correspond to the arrangement of the dummy transistors DMCT in the cell string CSTR.

Each of the plurality of second pass transistors PTR2 may include a second active region 200, a second gate G2 that is formed in the second active region 200 and extended in the first direction D1, and a source S and a drain D that are formed in the second active region 200 on both sides of the second gate G2 in the second direction D2. In this case, two second gates G2 may be formed in one second active region 200. In order to reduce the area, the plurality of second pass transistors PTR2 may have a structure in which a pair of second pass transistors PTR2 that share the drain D shares one second active region 200. Furthermore, for efficient wiring coupling, the second gates G2 may be coupled to the first gate G1 and may have the same line width in the second direction D2. Accordingly, the first pass transistor PTR1 and the second pass transistor PTR2 may have the same channel length. FIG. 4A illustrates a case where only one of the pair of second pass transistors PTR2 sharing the second active region 200 is coupled to the dummy transistor DMCT, for convenience of a description, but the other second pass transistor PTR2 may also be coupled to the dummy transistor DMCT. In this case, the pair of second pass transistors PTR2 may be coupled to the same dummy transistor DMCT or different dummy transistors DMCT.

The second active region 200 may have a bar type shape with a long axis that is extended in the second direction D2 and a short axis that is extended in the first direction D1. A short-axis line width L2 of the second active region 200 may correspond to the channel width of the second pass transistor PTR2. A long-axis line width W2 of the second active region 200 may be equal to a long-axis line width W1 of the first active region 100 (W1=W2), and the short-axis line width L2 of the second active region 200 may be larger than the short-axis line width L1 of the first active region 100 (L1<L2). Accordingly, the area of the second active region 200 may be larger than the area of the first active region 100, and the first pass transistor PTR1 and the second pass transistor PTR2 may have different channel widths. Accordingly, the channel area of the first pass transistor PTR1 may be smaller than the channel area of the second pass transistor PTR2. The operating characteristics of the first pass transistor PTR1 might not deteriorate although the first pass transistor PTR1 has a smaller channel area than the second pass transistor PTR2 because it transmits the driving signal DS, SS, having the first level voltage that is lower than the second level voltage. That is, each of the first pass transistor PTR1 and the second pass transistor PTR2 may be configured to have a channel area that corresponds to the voltage level of the driving signal that is transmitted by the pass transistor.

Each of the plurality of third pass transistors PTR3 may have a drain D to which the driving signal SI, having a third level voltage that is higher than the second level voltage, is applied, and may supply the third level voltage to the gate of the memory cell transistor MCT in response to the block selection signal BS that is applied to a gate thereof. In a pass TR unit or pass transistor array that corresponds to any one of the memory blocks BLK0 and BLK1, the number of third pass transistors PTR3 may be the same as the number of memory cell transistors MCT in the cell string CSTR.

In a pass TR unit that corresponds to any one of the memory blocks BLK0 and BLK1, the plurality of third pass transistors PTR3 may be disposed between the second pass transistors PTR2, but may be symmetrically disposed on both sides of the second pass transistor PTR2 that is positioned in the middle of the pass TR unit in the first direction D1. The arrangement of the third pass transistor PTR3 in the first direction D1 in the pass TR unit may correspond to the arrangement of the memory cell transistors MCT in the cell string CSTR.

Each of the plurality of third pass transistors PTR3 may include a third active region 300, a third gate G3 that is formed in the third active region 300 and extended in the first direction D1, and a source S and a drain D that are formed in the third active region 300 on both sides of the third gate G3 in the second direction D2. In this case, two third gates G3 may be formed in the third active region 300. In order to reduce the area, the plurality of third pass transistors PTR3 may have a structure in which a pair of the third pass transistors PTR3 that share the drain D shares one third active region 300. For efficient wiring coupling, the third gate G3 may be coupled to the first gate G1 and the second gate G2, but the pair of first gate G1 and second gate G2 may be coupled to the one third gate G3 to form gate lines GL1 and GL2. In this case, different block selection signals BS may be applied to the first gate line GL1 and the second gate line GL2. For example, a block selection signal BS for selecting the first memory block BLK0 may be applied to the first gate line GL1, and the block selection signal BS for selecting the second memory block BLK1 may be applied to the second gate line GL2. Furthermore, the line width of the third gate G3 in the second direction D2 may be larger than each of the line width of the first gate G1 and the line width of the second gate G2 in the second direction D2. Accordingly, the third pass transistor PTR3 may have a longer channel length than each of the first pass transistor PTR1 and the second pass transistor PTR2.

The third active region 300 may have a bar type shape with a long axis that is extended in the second direction D2 and a short axis that is extended in the first direction D1. A short-axis line width L3 of the third active region 300 may correspond to the channel width of the third pass transistor PTR3. A long-axis line width W3 of the third active region 300 may be larger than each of the long-axis line width W1 of the first active region 100 and the long-axis line width W2 of the second active region 200 (W3>W1=W2). In this case, the long-axis line width W3 of the third active region 300 may be more than twice as large as each of the long-axis line width W1 of the first active region 100 and the long-axis line width W2 of the second active region 200. The short-axis line width L3 of the third active region 300 may be larger than the short-axis line width L1 of the first active region 100 and may be equal to the short-axis line width L2 of the second active region 200 (L1<L3=L2). Accordingly, the area of the third active region 300 may be larger than each of the area of the second active region 200 and the area of the first active region 100. The third pass transistor PTR3 may have a larger channel area than each of the first pass transistor PTR1 and the second pass transistor PTR2. In other words, the channel area of the third pass transistor PTR3 that drives the driving signal SI with the third level voltage may be larger than the channel area of the second pass transistor PTR2 that drives the driving signal DSI with the second level voltage that is lower than the third level voltage. The channel area of the second pass transistor PTR2 may be larger than the channel area of the first pass transistor PTR1 that drives the driving signal SS, DS, having the first level voltage that is lower than the second level voltage. Furthermore, two second active regions 200 may be disposed in an area that corresponds to one third active region 300, and two or more first active regions 100 may be disposed in the area.

The first active region 100 and second active region 200 that are adjacent to each other may be spaced apart and disposed at a first interval S1 in the first direction D1. The second active region 200 and third active region 300 that are adjacent to each other may be spaced apart and disposed at a second interval S2 in the first direction D1. The third active regions 300 that are adjacent to each other may be spaced apart and disposed at a third interval S3 in the first direction D1. In this case, all of the first interval S1 to the third interval S3 may be the same. If all of the first interval S1 to the third interval S3 are the same, the layout design may become easier and the level of difficulty in the process may be lowered.

As described above, in the semiconductor memory device according to the first embodiment, the pass TR unit is configured with a plurality of pass transistors with different channel areas based on voltage levels of the driving signals DS, SS, SI, and DSI. Accordingly, the area of the entire layout of the pass TR unit may be reduced, and the degradation in operating characteristics attributable to a reduction in the area may also be prevented.

Furthermore, since the pass TR unit is configured with a plurality of pass transistors with different channel areas based on voltage levels of the driving signals DS, SS, SI, and DSI, the length of the entire layout of the pass TR unit is reduced in the direction in which the gate lines GL1 and GL2 are extended, that is, in the first direction D1. Accordingly, a package fit-in issue attributable to an increase in the number of stages of memory cell stacks (or memory cell arrays) may be solved.

As illustrated in FIGS. 3, 4B, and 4C, the first embodiment illustrates cases where a plurality of pass transistors in the pass TR unit corresponds to a plurality of transistors that configure the cell string CSTR, respectively. In a modified example, some or all of a plurality of dummy transistors DMCT in the cell string CSTR may share one second pass transistor PTR2. The reason for this is that upon operation, the dummy transistors DMCT only function to provide coupling between an adjacent selection transistor SST, DST and a memory cell transistor MCT and between the memory cell transistors MCT.

Referring to FIG. 4B, the second dummy transistor DMCT2 and the third dummy transistor DMCT3 may be configured to share one second pass transistor PTR2. Accordingly, the area of the entire layout of the pass TR unit in the first direction D1 may be further reduced because the second active region 200 that is positioned between the third active regions 300 is not necessary compared to the first embodiment. The first dummy transistor DMCT1 and the third dummy transistor DMCT3 may be configured to share one second pass transistor PTR2.

Referring to FIG. 4C, a first dummy transistor DMCT1 to a third dummy transistor DMCT3 may be configured to share one second pass transistor PTR2. Accordingly, the area of the entire layout of the pass TR unit in the first direction D1 may be further reduced because any one of the second active region 200 that is positioned between the third active regions 300 and the second active regions 200 that is positioned between the first active region 100 and the third active regions 300 is not necessary compared to the first embodiment.

The first active region 100 and third active region 300 that are adjacent to each other may be spaced apart and may be disposed at a fourth interval S4 in the first direction D1. All of to the first interval S1 to the fourth interval S4 may be the same.

Figure 5A:
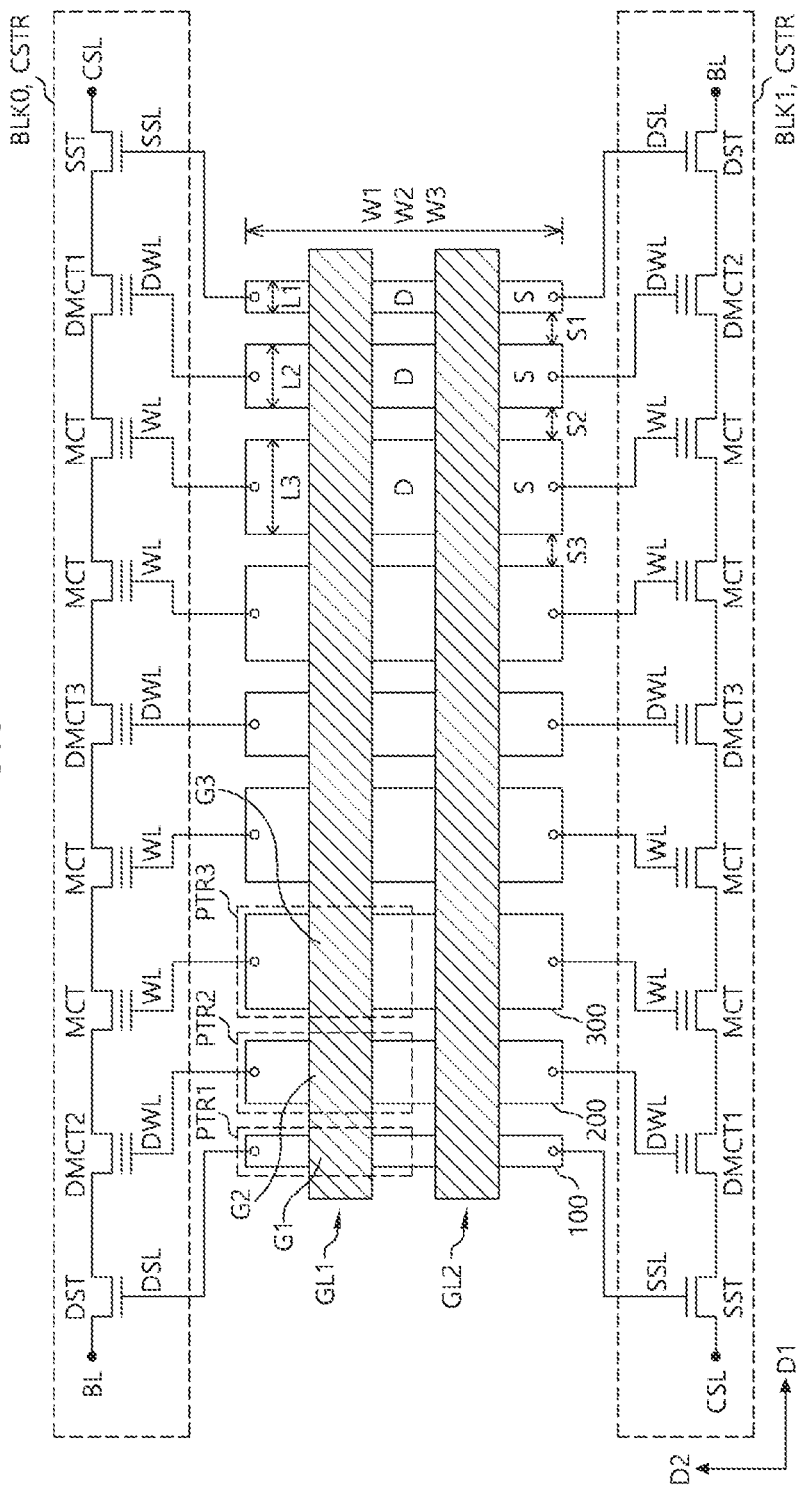
FIG. 5A is a plan view, illustrating a pass TR unit of the semiconductor memory device, according to a second embodiment.
Figure 5B:
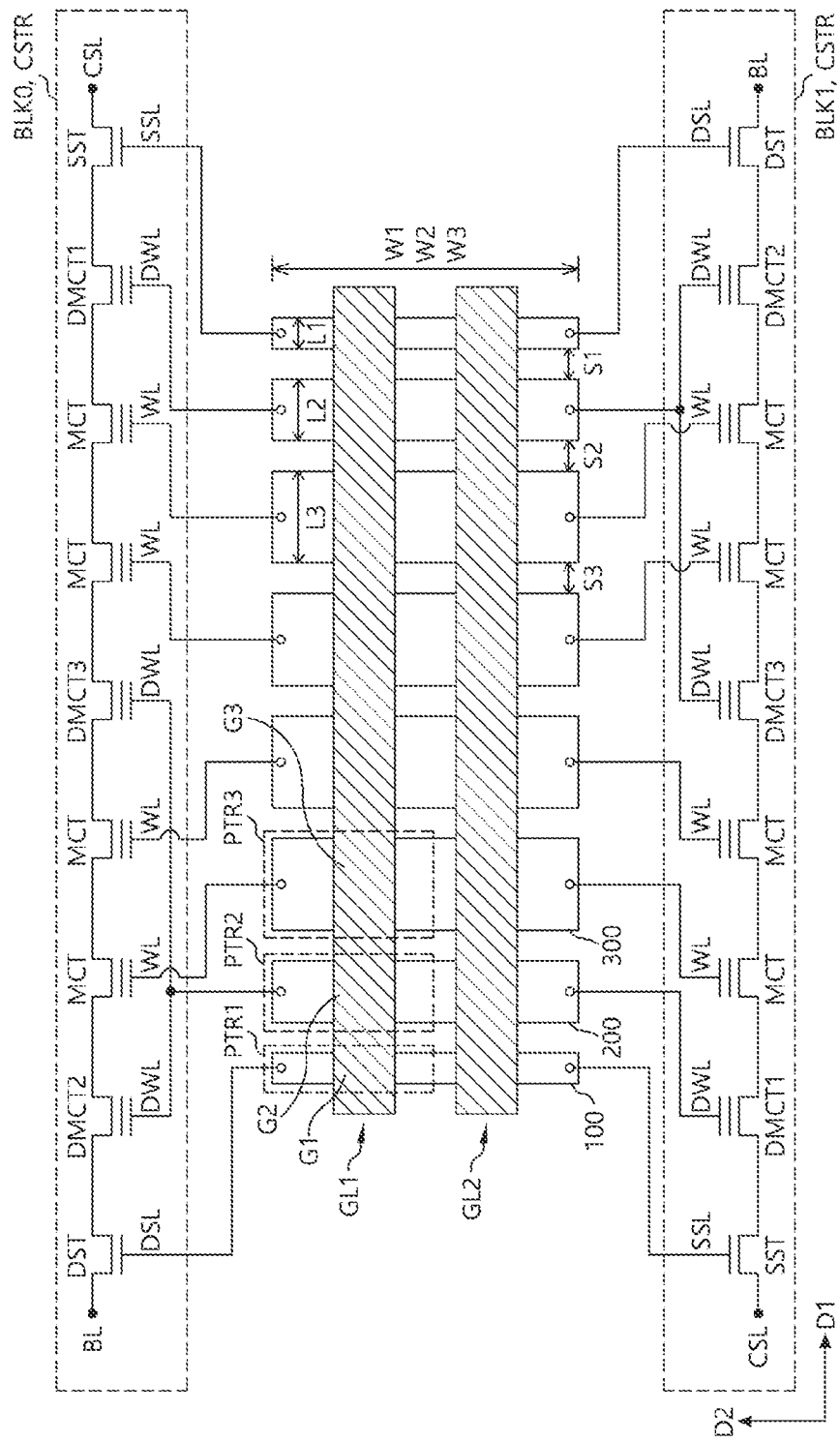
FIGS. 5B and 5C are plan views, illustrating modified examples of the pass TR unit of the semiconductor memory device, according to the second embodiment.
Figure 5C:
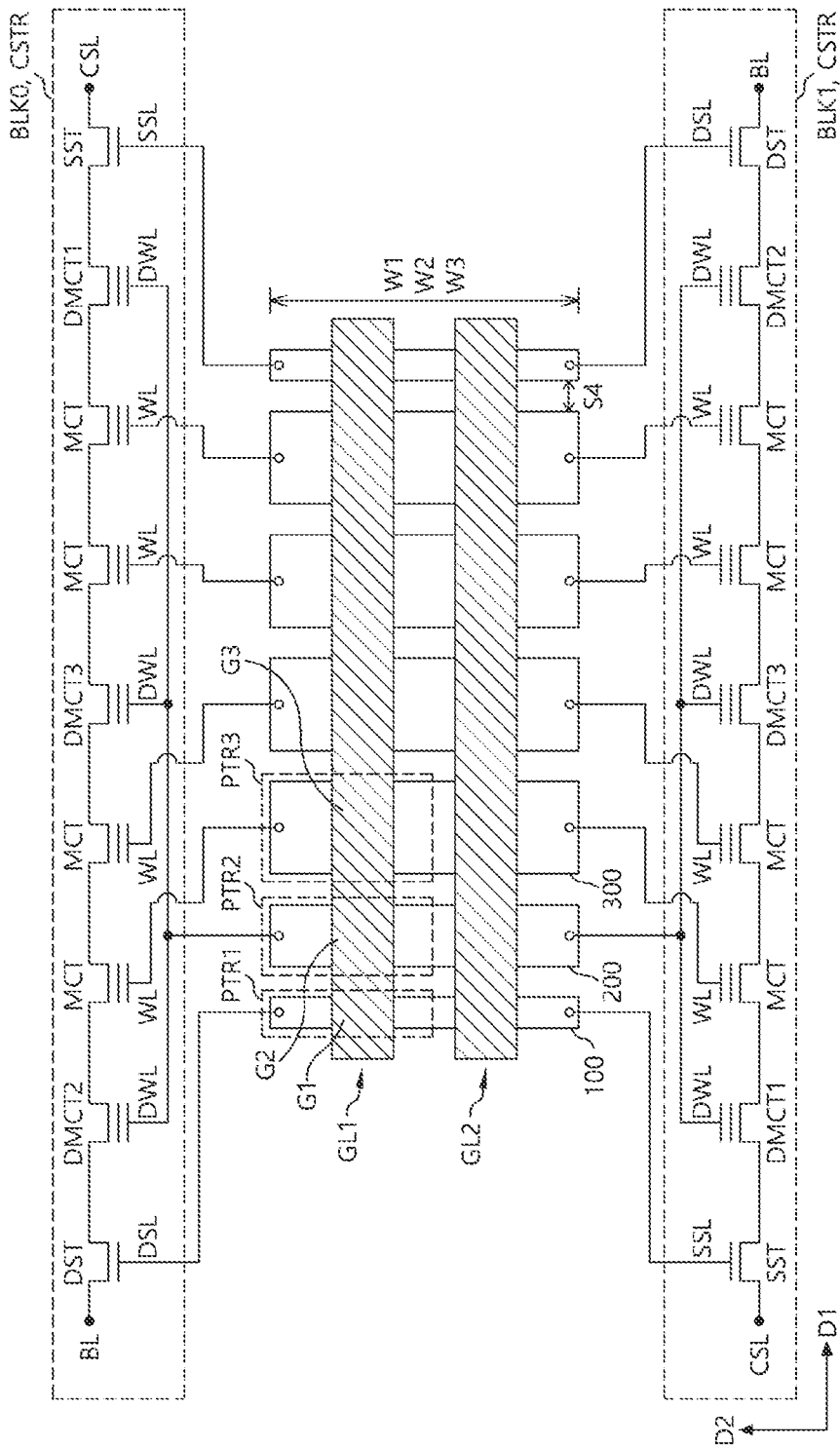

FIG. 5A is a plan view, illustrating a pass TR unit of the semiconductor memory device, according to a second embodiment. FIGS. 5B and 5C are plan views, illustrating modified examples of the pass TR unit of the semiconductor memory device, according to the second embodiment.

As illustrated in FIGS. 3 and 5A, the pass TR unit may include a plurality of first pass transistors PTR1, a plurality of second pass transistors PTR2, and a plurality of third pass transistors PTR3.

Each of the plurality of first pass transistors PTR1 may have a drain D to which the driving signal SS, DS, having a first level voltage, is applied, and may supply the first level voltage to the gate of the source selection transistor SST and the gate of the drain selection transistor DST in response to the block selection signal BS that is applied to a gate thereof. In a pass TR unit or pass transistor array that corresponds to any one of the memory blocks BLK0 and BLK1, the number of first pass transistors PTR1 may be the same as the sum of the number of source selection transistors SST and the number of drain selection transistors DST in the cell string CSTR.

In a pass TR unit that corresponds to any one of the memory blocks BLK0 and BLK1, the plurality of first pass transistors PTR1 may be disposed at the outermost part in the first direction D1. That is, the arrangement of the first pass transistors PTR1 in the first direction D1 in the pass TR unit may correspond to the arrangement of the source selection transistor SST and the drain selection transistor DST in the cell string CSTR that is extended vertically from a surface of the substrate. Among the plurality of first pass transistors PTR1 in the first direction D1, a first pass transistor PTR1 that is coupled to the source selection transistor SST that is positioned at the bottom of the cell string CSTR may be positioned adjacent to the cell string CSTR. A first pass transistor PTR1 that is coupled to the drain selection transistor DST that is positioned at the top of the cell string CSTR may be positioned at the furthest distance from the cell string CSTR.

Each of the plurality of first pass transistors PTR1 may include a first active region 100, a first gate G1 that is formed in the first active region 100 and extended in the first direction D1, and a source S and a drain D that are formed in the first active region 100 on both sides of the first gate G1 in the second direction D2. In this case, two first gates G1 may be formed in the first active region 100. In order to reduce the area, the plurality of first pass transistors PTR1 may have a structure in which a pair of the first pass transistors PTR1 that share the drain D shares one first active region 100.

The first active region 100 may have a bar type shape with a long axis that is extended in the second direction D2 and a short axis that is extended in the first direction D1. The short-axis line width L1 of the first active region 100 may correspond to the channel width of the first pass transistor PTR1.

Each of the plurality of second pass transistors PTR2 may have a drain D to which the driving signal DSI, having a second level voltage that is higher than the first level voltage, is applied, and may supply the second level voltage to the gates of the dummy transistors DMCT in response to the block selection signal BS that is applied to a gate thereof. In a pass TR unit or pass transistor array that corresponds to any one of the memory blocks BLK0 and BLK1, the number of second pass transistors PTR2 may be the same as the number of dummy transistors DMCT in the cell string CSTR.

In a pass TR unit that corresponds to any one of the memory blocks BLK0 and BLK1, some of the plurality of second pass transistors PTR2 may be disposed between the first pass transistor PTR1 and the third pass transistor PTR3 in the first direction D1 and may transmit the driving signal DSI, having the second level voltage, to the first dummy transistor DMCT1 and the second dummy transistor DMCT2. The remainder of the plurality of second pass transistors PTR2 may be disposed in the middle of the pass TR unit, that is, between the third pass transistors PTR3. The second pass transistor PTR2 that is positioned between the third pass transistors PTR3 may transmit the driving signal DSI, having the second level voltage, to the third dummy transistor DMCT3. That is, the arrangement of the second pass transistors PTR2 in the first direction D1 in the pass TR unit may correspond to the arrangement of the dummy transistors DMCT in the cell string CSTR.

Each of the plurality of second pass transistors PTR2 may include a second active region 200, a second gate G2 that is formed in the second active region 200 and extended in the first direction D1, and a source S and a drain D that are formed in the second active region 200 on both sides of the second gate G2 in the second direction D2. In this case, two second gates G2 may be formed in the second active region 200. In order to reduce the area, the plurality of second pass transistors PTR2 may have a structure in which a pair of second pass transistors PTR2 that share the drain D shares one second active region 200. Furthermore, for efficient wiring coupling, the second gates G2 may be coupled to the first gate G1 and may have the same line width in the second direction D2. Accordingly, the first pass transistor PTR1 and the second pass transistor PTR2 may have the same channel length.

The second active region 200 may have a bar type shape with a long axis that is extended in the second direction D2 and a short axis that is extended in the first direction D1. The short-axis line width L2 of the second active region 200 may correspond to the channel width of the second pass transistor PTR2. The long-axis line width W2 of the second active region 200 may be equal to the long-axis line width W1 of the first active region 100 (W1=W2). The short-axis line width L2 of the second active region 200 may be larger than the short-axis line width L1 of the first active region 100 (L1<L2). Accordingly, the first pass transistor PTR1 and the second pass transistor PTR2 may have different channel widths. Accordingly, the channel area of the first pass transistor PTR1 may be smaller than the channel area of the second pass transistor PTR2. The operating characteristics of the first pass transistor PTR1 might not deteriorate although the first pass transistor PTR1 has a smaller channel area than the second pass transistor PTR2 because the first pass transistor PTR1 transmits the driving signal DS, SS, having the first level voltage that is lower than the second level voltage. That is, each of the first pass transistor PTR1 and the second pass transistor PTR2 may be configured to have a channel area that corresponds to a voltage level of a driving signal transmitted by the pass transistor.

Each of the plurality of third pass transistors PTR3 may have a drain D to which the driving signal SI, having a third level voltage that is higher than the second level voltage, is applied, and may supply the third level voltage to the gate of the memory cell transistor MCT in response to the block selection signal BS that is applied to a gate thereof. In a pass TR unit or pass transistor array that corresponds to any one of the memory blocks BLK0 and BLK1, the number of third pass transistors PTR3 may be the same as the number of memory cell transistors MCT in the cell string CSTR.

In a pass TR unit that corresponds to any one of the memory blocks BLK0 and BLK1, the plurality of third pass transistors PTR3 may be disposed between the second pass transistors PTR2, but may be symmetrically disposed on both sides of the second pass transistor PTR2 that is positioned in the middle of the pass TR unit in the first direction D1. That is, the arrangement of the third pass transistors PTR3 in the first direction D1 in the pass TR unit may correspond to the arrangement of the memory cell transistors MCT in the cell string CSTR.

Each of the plurality of third pass transistors PTR3 may include a third active region 300, a third gate G3 that is formed in the third active region 300 and extended in the first direction D1, and a source S and a drain D that are formed in the third active region 300 on both sides of the third gate G3 in the second direction D2. In this case, two third gates G3 may be in the third active region 300. In order to reduce the area, the plurality of third pass transistors PTR3 may have a structure in which a pair of the third pass transistors PTR3 that share the drain D shares one third active region 300. For efficient wiring coupling, the third gates G3 may be coupled to the first gate G1 and the second gate G2 and may have the same line width in the second direction D2. Accordingly, all of the first pass transistor PTR1, the second pass transistor PTR2 and the third pass transistor PTR3 may have the same channel length. Each of gate lines GL1 and GL2 may be a line-type pattern that is extended in the first direction D1 because all of the first gate G1 to the third gate G3 have the same line width in the second direction D2. Accordingly, the design of the gate line GL1, GL2 may become easier, and the level of difficulty in the process may be lowered. Furthermore, the interval between the active regions 100, 200, and 300 may be more effectively reduced because the region in which the gate line GL1, GL2 is branched or branched gate lines GL1, GL2 are merged is not present.

The third active region 300 may have a bar type shape with a long axis that is extended in the second direction D2 and a short axis that is extended in the first direction D1. The short-axis line width L3 of the third active region 300 may correspond to the channel width of the third pass transistor PTR3. The long-axis line width W3 of the third active region 300 may be equal to each of the long-axis line width W1 of the first active region 100 and the long-axis line width W2 of the second active region 200 (W1=W2=W3). The short-axis line width L3 of the third active region 300 may be larger than each of the short-axis line width L1 of the first active region 100 and the short-axis line width L2 of the second active region 200 (L1<L2<L3). Accordingly, the area of the third active region 300 may be the largest, and the area of the first active region 100 may be the smallest. The third pass transistor PTR3 may have a larger channel area than each of the first pass transistor PTR1 and the second pass transistor PTR2. In other words, the channel area of the third pass transistor PTR3 that drives the driving signal SI with the third level voltage may be larger than the channel area of the second pass transistor PTR2 that drives the driving signal DSI with the second level voltage that is lower than the third level voltage. The channel area of the second pass transistor PTR2 may be larger than the channel area of the first pass transistor PTR1 that drives the driving signal SS, DS, having the first level voltage that is lower than the second level voltage.

The first active region 100 and second active region 200 that are adjacent to each other may be spaced apart and disposed at a first interval S1 in the first direction D1. The second active region and third active region 300 that are adjacent to each other may be spaced apart and disposed at a second interval S2 in the first direction D1. The third active regions 300 that are adjacent to each other may be spaced apart and disposed at a third interval S3 in the first direction D1. In this case, all of the first interval S1 to the third interval S3 may be the same. If all of the first interval S1 to the third interval S3 are the same, the layout design may become easier and the level of difficulty in the process may be lowered.

As described above, in the semiconductor memory device, according to the second embodiment, the pass TR unit may be configured with a plurality of pass transistors with different channel areas based on voltage levels of the driving signals DS, SS, SI, and DSI. Accordingly, the area of the entire layout of the pass TR unit may be reduced, and the degradation in operating characteristics attributable to a reduction in the area may also be prevented.

Furthermore, since the pass TR unit is configured with a plurality of pass transistors with different channel areas based on voltage levels of the driving signals DS, SS, SI, and DSI, the length of the entire layout of the pass TR unit in the direction in which the gate lines GL1 and GL2 are extended, that is, in the first direction D1, is reduced. Accordingly, a package fit-in issue attributable to an increase in the number of stages of memory cell stacks (or memory cell arrays) may be solved.

As illustrated in FIGS. 3, 5B, and 5C, the second embodiment illustrates a case where in the pass TR unit, a plurality of pass transistors corresponds to a plurality of transistors that configure the cell string CSTR, respectively. In a modified example, some or all of the plurality of dummy transistors DMCT in the cell string CSTR may share one second pass transistor PTR2. The reason for this is that upon operation, the dummy transistors DMCT only function to provide coupling between the adjacent selection transistors SST and DST and the memory cell transistors MCT and between the memory cell transistors MCT.

Referring to FIG. 5B, the second dummy transistor DMCT2 and the third dummy transistor DMCT3 may be configured to share one second pass transistor PTR2. Accordingly, the area of the entire layout of the pass TR unit in the first direction D1 may be further reduced because the second active region 200 that is positioned between the third active regions 300 is not necessary compared to the second embodiment. The first dummy transistor DMCT1 and the third dummy transistor DMCT3 may be configured to share one second pass transistor PTR2.

Referring to FIG. 5C, the first dummy transistor DMCT1 to the third dummy transistor DMCT3 may be configured to share one second pass transistor PTR2. Accordingly, the area of the entire layout of the pass TR unit in the first direction D1 may be further reduced because any one of the second active region 200 that is positioned between the third active regions 300 and the second active regions 200 that is positioned between the first active region 100 and the third active regions 300 is not necessary compared to the first embodiment.

The first active region 100 and third active region 300 that are adjacent to each other may be spaced apart and disposed at a fourth interval S4 in the first direction D1. All of the first interval S1 to the fourth interval S4 may be the same.

Figure 6A:
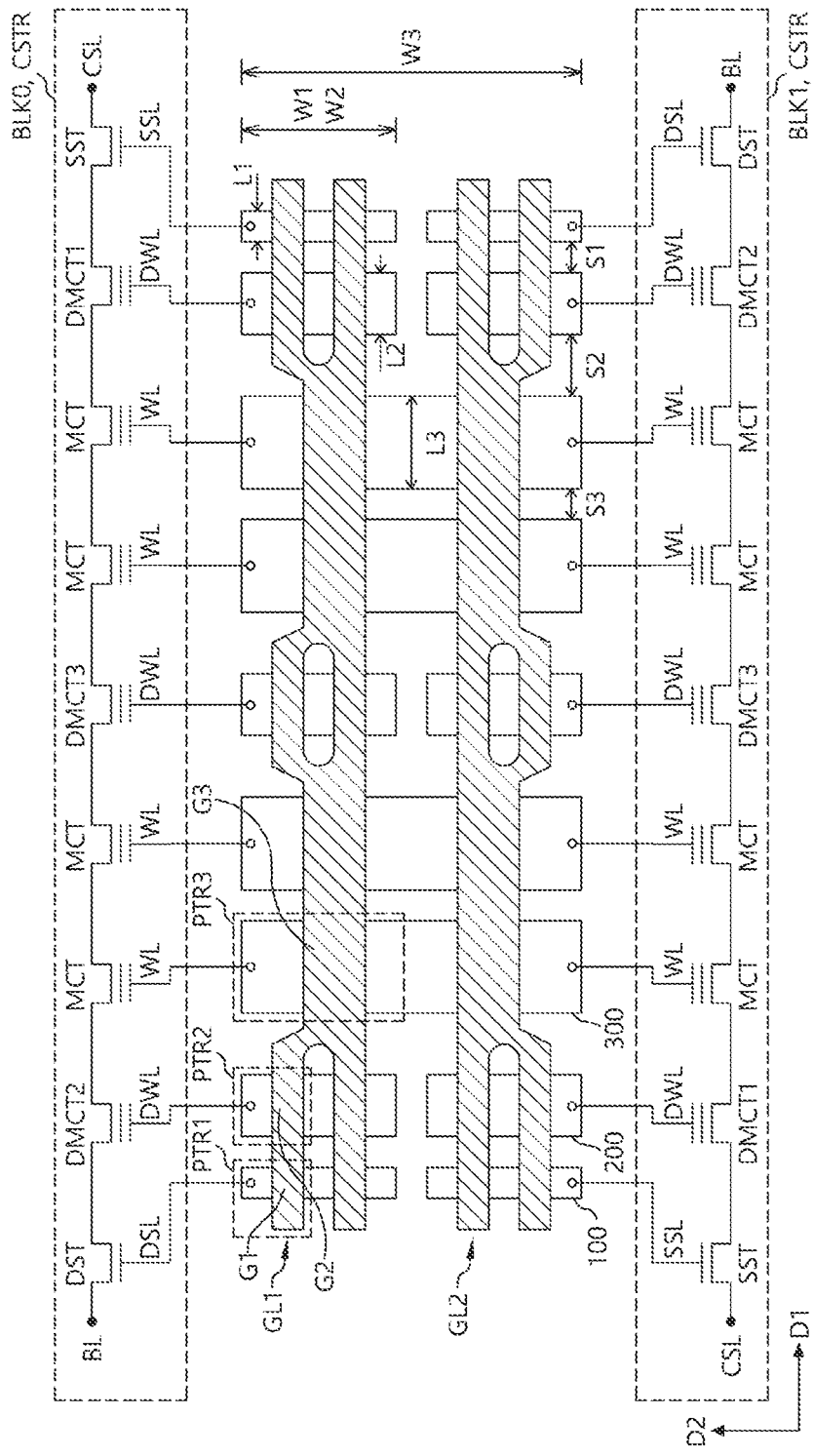
FIG. 6A is a plan view, illustrating a pass TR unit of the semiconductor memory device, according to a third embodiment.
Figure 6B:
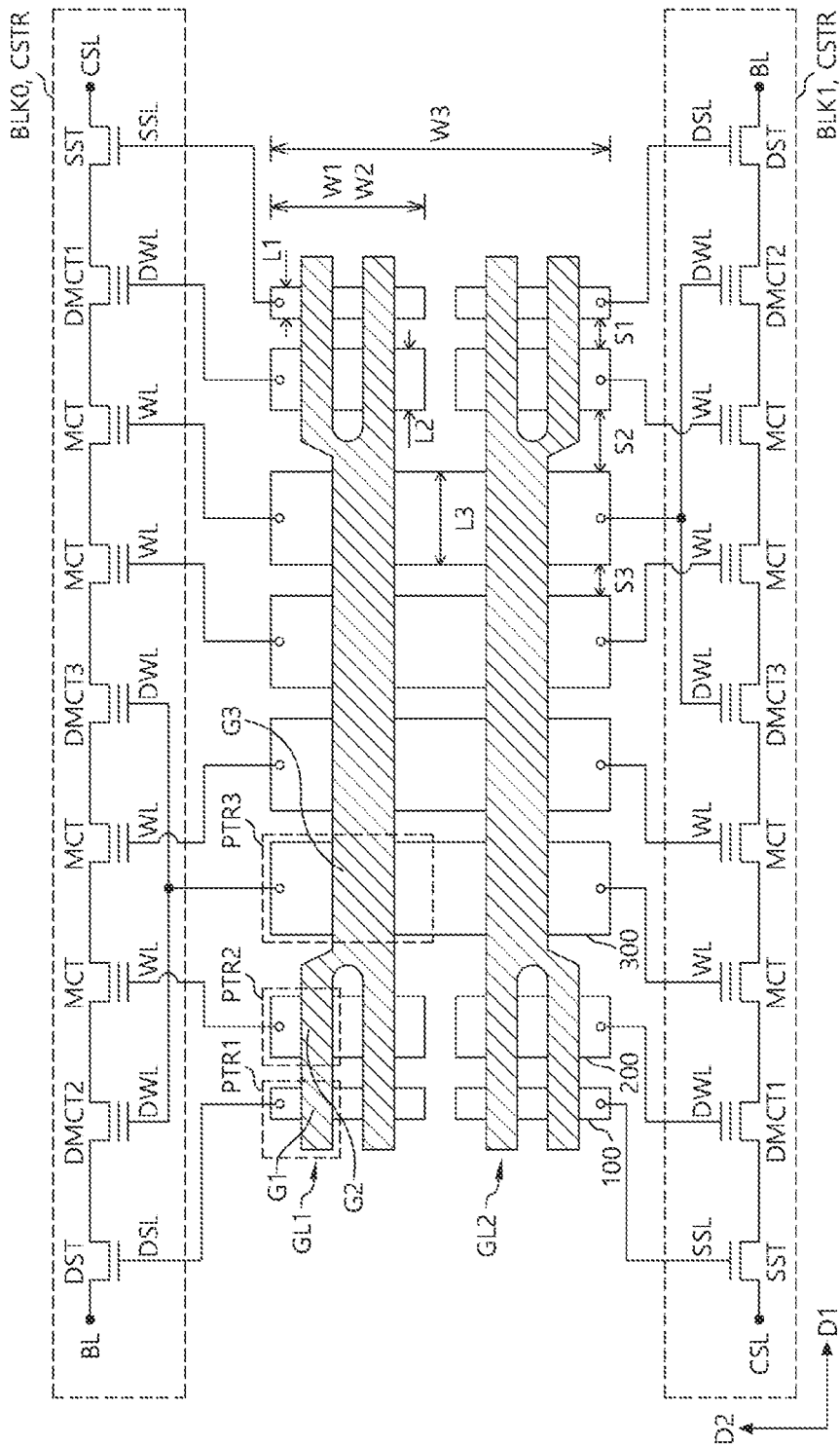
FIG. 6B is a plan view, illustrating a modified example of the pass TR unit of the semiconductor memory device, according to the third embodiment.

FIG. 6A is a plan view, illustrating a pass TR unit of the semiconductor memory device, according to a third embodiment. FIG. 6B is a plan view, illustrating a modified example of the pass TR unit of the semiconductor memory device, according to the third embodiment.

As illustrated in FIGS. 3 and 6A, the pass TR unit may include a plurality of first pass transistors PTR1, a plurality of second pass transistors PTR2, and a plurality of third pass transistors PTR3.

Each of the plurality of first pass transistors PTR1 may have a drain D to which the driving signal SS, DS, having a first level voltage, is applied, and may supply the first level voltage to the gate of the source selection transistor SST and the gate of the drain selection transistor DST in response to the block selection signal BS that is applied to a gate thereof. In a pass TR unit or pass transistor array that corresponds to any one of the memory blocks BLK0 and BLK1, the number of first pass transistors PTR1 may be the same as the sum of the number of source selection transistors SST and the number of drain selection transistors DST in the cell string CSTR.

In a pass TR unit that corresponds to any one of the memory blocks BLK0 and BLK1, the plurality of first pass transistors PTR1 may be disposed at the outermost part in the first direction D1. That is, the arrangement of the first pass transistors PTR1 in the first direction D1 in the pass TR unit may correspond to the arrangement of the source selection transistor SST and the drain selection transistor DST in the cell string CSTR that is extended vertically from a surface of the substrate. Among the plurality of first pass transistors PTR1 in the first direction D1, a first pass transistor PTR1 that is coupled to the source selection transistor SST positioned at the bottom of the cell string CSTR may be positioned to be adjacent to the cell string CSTR. A first pass transistor PTR1 that is coupled to the drain selection transistor DST positioned at the top of the cell string CSTR may be positioned at the furthest distance from the cell string CSTR.

Each of the plurality of first pass transistors PTR1 may include a first active region 100, a first gate G1 that is formed in the first active region 100 and extended in the first direction D1, and a source S and a drain D that are formed in the first active region 100 on both sides of the first gate G1 in the second direction D2. In this case, two first gates G1 may be formed in the first active region 100. In order to reduce the area, the plurality of first pass transistors PTR1 may have a structure in which a pair of the first pass transistors PTR1 that share the drain D shares one first active region 100. FIG. 6A illustrates a case where only one of the pair of first pass transistors PTR1 sharing the first active region 100 is coupled to the selection transistor, for convenience of a description, but the other first pass transistor PTR1 may also be coupled to the selection transistor. In this case, the pair of first pass transistors PTR1 may be coupled to the same selection transistor or different selection transistors.

The first active region 100 may have a bar type shape with a long axis that is extended in the second direction D2 and a short axis that is extended in the first direction D1. The short-axis line width L1 of the first active region 100 may correspond to the channel width of the first pass transistor PTR1.

Each of the plurality of second pass transistors PTR2 may have a drain D to which the driving signal DSI, having a second level voltage that is higher than the first level voltage, is applied, and may supply the second level voltage to the gates of the dummy transistors DMCT in response to the block selection signal BS that is applied to a gate thereof. In a pass TR unit or pass transistor array that corresponds to any one of the memory blocks BLK0 and BLK1, the number of second pass transistors PTR2 may be the same as the number of dummy transistors DMCT in the cell string CSTR.

In a pass TR unit that corresponds to any one of the memory blocks BLK0 and BLK1, some of the plurality of second pass transistors PTR2 may be disposed between the first pass transistor PTR1 and the third pass transistor PTR3 in the first direction D1 and may transmit the driving signal DSI, having the second level voltage, to the first dummy transistor DMCT1 and the second dummy transistor DMCT2. The remainder of the plurality of second pass transistors PTR2 may be disposed in the middle of the pass TR unit, that is, between the third pass transistors PTR3. The second pass transistor PTR2 positioned between the third pass transistors PTR3 may transmit the driving signal DSI, having the second level voltage, to the third dummy transistor DMCT3. That is, the arrangement of the second pass transistors PTR2 in the first direction D1 in the pass TR unit may correspond to the arrangement of the dummy transistors DMCT in the cell string CSTR.

Each of the plurality of second pass transistors PTR2 may include a second active region 200, a second gate G2 that is formed in the second active region 200 and extended in the first direction D1, and a source S and a drain D that are formed in the second active region 200 on both sides of the second gate G2 in the second direction D2. In this case, two second gates G2 may be formed in the second active region 200. In order to reduce the area, the plurality of second pass transistors PTR2 may have a structure in which a pair of the second pass transistors PTR2 that share the drain D shares one second active region 200. Furthermore, for efficient wiring coupling, the second gates G2 may be coupled to the first gate G1 and may have the same line width in the second direction D2. Accordingly, the first pass transistor PTR1 and the second pass transistor PTR2 may have the same channel length. FIG. 6A illustrates a case where only one of the pair of second pass transistors PTR2 sharing the second active region 200 is coupled to the dummy transistor DMCT, for convenience of a description, but the other second pass transistor PTR2 may also be coupled to the dummy transistor DMCT. In this case, the pair of second pass transistors PTR2 may be coupled to the same dummy transistor DMCT or different dummy transistors DMCT.

The second active region 200 may have a bar type shape with a long axis that is extended in the second direction D2 and a short axis that is extended in the first direction D1. The short-axis line width L2 of the second active region 200 may correspond to the channel width of the second pass transistor PTR2. The long-axis line width W2 of the second active region 200 may be equal to the long-axis line width W1 of the first active region 100 (W1=W2). The short-axis line width L2 of the second active region 200 may be larger than the short-axis line width L1 of the first active region 100 (L1<L2). Accordingly, the first pass transistor PTR1 and the second pass transistor PTR2 may have different channel widths. Accordingly, the channel area of the first pass transistor PTR1 may be smaller than the channel area of the second pass transistor PTR2. The operating characteristics of the first pass transistor PTR1 might not deteriorate although the first pass transistor PTR1 has a smaller channel area than the second pass transistor PTR2 because it transmits the driving signal DS, SS, having the first level voltage that is lower than the second level voltage. That is, each of the first pass transistor PTR1 and the second pass transistor PTR2 may be configured to have a channel area that corresponds to a voltage level of a driving signal transmitted by the pass transistor.

Each of the plurality of third pass transistors PTR3 may have a drain D to which the driving signal SI, having a third level voltage that is higher than the second level voltage, is applied, and may supply the third level voltage to the gate of the memory cell transistor MCT in response to the block selection signal BS that is applied to a gate thereof. In a pass TR unit or pass transistor array that corresponds to any one of the memory blocks BLK0 and BLK1, the number of third pass transistors PTR3 may be the same as the number of memory cell transistors MCT in the cell string CSTR.

In a pass TR unit that corresponds to any one of the memory blocks BLK0 and BLK1, the plurality of third pass transistors PTR3 may be disposed between the second pass transistors PTR2, but may be symmetrically disposed on both sides of the second pass transistor PTR2 positioned in the middle of the pass TR unit in the first direction D1. That is, the arrangement of the third pass transistors PTR3 in the first direction D1 in the pass TR unit may correspond to the arrangement of the memory cell transistors MCT in the cell string CSTR.

Each of the plurality of third pass transistors PTR3 may include a third active region 300, a third gate G3 that is formed in the third active region 300 and extended in the first direction D1, and a source S and a drain D that are formed in the third active region 300 on both sides of the third gate G3 in the second direction D2. In this case, two third gates G3 may be formed in the third active region 300. In order to reduce the area, the plurality of third pass transistors PTR3 may have a structure in which a pair of the third pass transistors PTR3 that share the drain D shares one third active region 300. For efficient wiring coupling, the third gate G3 may be coupled to the first gate G1 and the second gate G2, but the pair of first gate G1 and second gate G2 may be coupled to one third gate G3 to form gate lines GL1 and GL2. In this case, different block selection signals BS may be applied to the first gate line GL1 and the second gate line GL2. For example, a block selection signal BS for selecting the first memory block BLK0 may be applied to the first gate line GL1. A block selection signal BS for selecting the second memory block BLK1 may be applied to the second gate line GL2. Furthermore, the line width of the third gate G3 in the second direction D2 may be larger than each of the line width of the first gate G1 and the line width of the second gate G2. Accordingly, the third pass transistor PTR3 may have a longer channel length than each of the first pass transistor PTR1 and the second pass transistor PTR2.

The third active region 300 may have a bar type shape with a long axis that is extended in the second direction D2 and a short axis that is extended in the first direction D1. The short-axis line width L3 of the third active region 300 may correspond to the channel width of the third pass transistor PTR3. The long-axis line width W3 of the third active region 300 may be larger than each of the long-axis line width W1 of the first active region 100 and the long-axis line width W2 of the second active region 200 (W3>W1=W2). In this case, the long-axis line width W3 of the third active region 300 may be more than twice as large as each of the long-axis line width W1 of the first active region 100 and the long-axis line width W2 of the second active region 200. The short-axis line width L3 of the third active region 300 may be larger than each of the short-axis line width L1 of the first active region 100 and the short-axis line width L2 of the second active region 200 (L1<L2<L3). Accordingly, the third pass transistor PTR3 may have a larger channel area than each of the first pass transistor PTR1 and the second pass transistor PTR2. In other words, the channel area of the third pass transistor PTR3 that drives the driving signal SI with the third level voltage may be larger than the channel area of the second pass transistor PTR2 that drives the driving signal DSI with the second level voltage that is lower than the third level voltage. The channel area of the second pass transistor PTR2 may be larger than the channel area of the first pass transistor PTR1 that drives the driving signal SS, DS, having the first level voltage that is lower than the second level voltage. Furthermore, two second active regions 200 may be disposed in an area that corresponds to one third active region 300, and two or more first active regions 100 may be disposed in the area.

The first active region 100 and second active region 200 that are adjacent to each other may be spaced apart and disposed at a first interval S1 in the first direction D1. The second active region and third active region 300 that are adjacent to each other may be spaced apart and disposed at a second interval S2 in the first direction D1. The third active regions 300 that are adjacent to each other may be spaced apart and disposed at a third interval S3 in the first direction D1. In this case, the first interval S1 and the third interval S3 may be the same, and the second interval S2 may be larger than each of the first interval S1 and the third interval S3. In this case, the second interval S2 is for providing a region in which a gate line is branched or branched gate lines are merged. The first interval S1 and the third interval S3 are provided to reduce the line width of the entire layout of the pass TR unit in the first direction D1. Accordingly, a stable structure may be obtained, and the degree of integration may be improved.

As described above, in the semiconductor memory device according to the third embodiment, the pass TR unit is configured with a plurality of pass transistors with different channel areas based on voltage levels of the driving signals DS, SS, SI, and DSI. Accordingly, the area of the entire layout of the pass TR unit may be reduced, and degradation in operating characteristics attributable to a reduction in the area may also be prevented.

Furthermore, since the pass TR unit is configured with the plurality of pass transistors with different channel areas based on voltage levels of the driving signals DS, SS, SI, and DSI, a package fit-in issue attributable to an increase in the number of stages of memory cell stacks (or memory cell arrays) may be solved by reducing the length of the entire layout of the pass TR unit in the direction in which the gate lines GL1 and GL2 are extended, that is, in the first direction D1.

As illustrated in FIGS. 3 and 6B, the third embodiment illustrates a case where a plurality of pass transistors in a pass TR unit corresponds to a plurality of transistors configuring a cell string CSTR, respectively. In a modified example, some or all of a plurality of dummy transistors DMCT in the cell string CSTR may share one second pass transistor PTR2. The reason for this is that upon operation, the dummy transistors DMCT only function to provide coupling between an adjacent selection transistor SST, DST and a memory cell transistor MCT and between the memory cell transistors MCT.

Referring to FIG. 6B, the second dummy transistor DMCT2 and the third dummy transistor DMCT3 may be configured to share one second pass transistor PTR2. Accordingly, the area of the entire layout of the pass TR unit in the first direction D1 may be further reduced because the second active region 200 positioned between the third active regions 300 is not necessary compared to the third embodiment.

Figure 7:
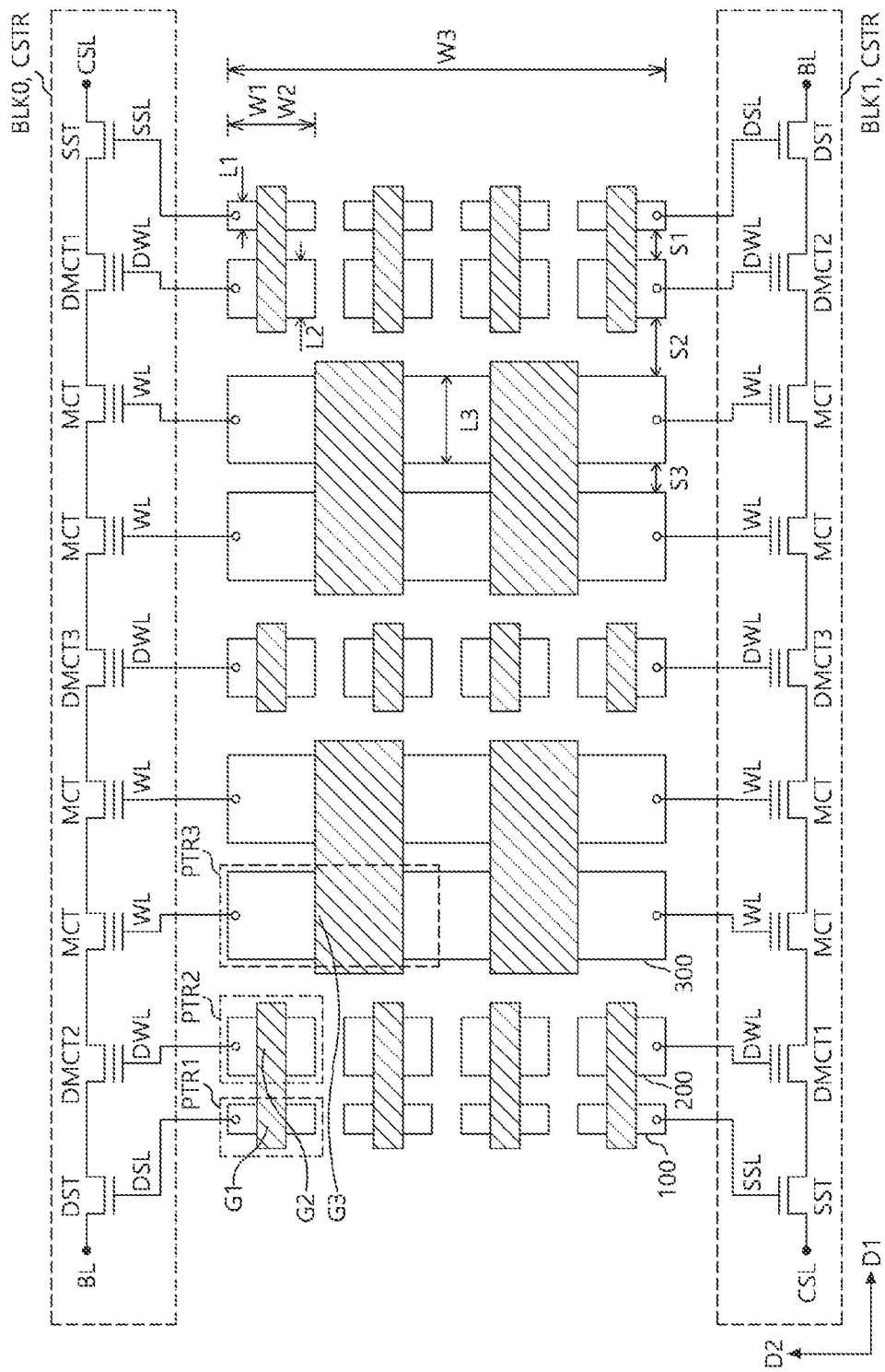
FIG. 7 is a plan view, illustrating a pass TR unit of the semiconductor memory device, according to a fourth embodiment.

FIG. 7 is a plan view illustrating a pass TR unit of the semiconductor memory device according to a fourth embodiment.

As illustrated in FIGS. 3 and 7, the pass TR unit according to the fourth embodiment may include a plurality of first pass transistors PTR1, a plurality of second pass transistors PTR2 and a plurality of third pass transistors PTR3.

Each of the plurality of first pass transistors PTR1 may have a drain D to which the driving signal SS, DS, having a first level voltage, is applied, and may supply the first level voltage to the gate of the source selection transistor SST and the gate of the drain selection transistor DST in response to the block selection signal BS that is applied to a gate thereof. In a pass TR unit or pass transistor array that corresponds to any one of the memory blocks BLK0 and BLK1, the number of first pass transistors PTR1 may be the same as the sum of the number of source selection transistors SST and the number of drain selection transistors DST in the cell string CSTR.

In a pass TR unit that corresponds to any one of the memory blocks BLK0 and BLK1, the plurality of first pass transistors PTR1 may be positioned at the outermost part in the first direction D1. That is, the arrangement of the first pass transistors PTR1 in the first direction D1 in the pass TR unit may correspond to the arrangement of the source selection transistor SST and the drain selection transistor DST in the cell string CSTR that is extended vertically from a surface of the substrate. Among the plurality of first pass transistors PTR1 in the first direction D1, a first pass transistor PTR1 that is coupled to the source selection transistor SST positioned at the bottom of the cell string CSTR may be positioned adjacent to the cell string CSTR, and a first pass transistor PTR1 that is coupled to the drain selection transistor DST positioned at the top of the cell string CSTR may be positioned at the furthest distance from the cell string CSTR.

Each of the plurality of first pass transistors PTR1 may include a first active region 100, a first gate G1 that is formed in the first active region 100 and extended in the first direction D1, and a source S and a drain D that are formed in the first active region 100 on both sides of the first gate G1 in the second direction D2. In this case, one first gate G1 may be formed in the first active region 100.

The first active region 100 may have a bar type shape with a long axis that is extended in the second direction D2 and a short axis that is extended in the first direction D1. The short-axis line width L1 of the first active region 100 may correspond to the channel width of the first pass transistor PTR1.

Each of the plurality of second pass transistors PTR2 may have a drain D to which the driving signal DSI, having a second level voltage that is higher than the first level voltage, applied, and may supply the second level voltage to the gates of the dummy transistors DMCT in response to the block selection signal BS that is applied to a gate thereof. In a pass TR unit or pass transistor array that corresponds to any one of the memory blocks BLK0 and BLK1, the number of second pass transistors PTR2 may be the same as the number of dummy transistors DMCT in the cell string CSTR.

In a pass TR unit that corresponds to any one of the memory blocks BLK0 and BLK1, some of the plurality of second pass transistors PTR2 may be disposed between the first pass transistor PTR1 and the third pass transistor PTR3 in the first direction D1 and may transmit the driving signal DSI, having the second level voltage, to the first dummy transistor DMCT1 and the second dummy transistor DMCT2. The remainder of the plurality of second pass transistors PTR2 may be disposed in the middle of the pass TR unit, that is, between the third pass transistors PTR3. The second pass transistor PTR2 positioned between the third pass transistors PTR3 may transmit the driving signal DSI, having the second level voltage, to the third dummy transistor DMCT3. That is, the arrangement of the second pass transistors PTR2 in the first direction D1 in the pass TR unit may correspond to the arrangement of the dummy transistors DMCT in the cell string CSTR.

Each of the plurality of second pass transistors PTR2 may include a second active region 200, a second gate G2 that is formed in the second active region 200 and extended in the first direction D1, and a source S and a drain D that are formed in the second active region 200 on both sides of the second gate G2 in the second direction D2. In this case, one second gate G2 may be formed in the second active region 200. Furthermore, for efficient wiring coupling, the second gate G2 may be coupled to the first gate G1 and may have the same line width in the second direction D2. Accordingly, the first pass transistor PTR1 and the second pass transistor PTR2 may have the same channel length.

The second active region 200 may have a bar type shape with a long axis that is extended in the second direction D2 and a short axis that is extended in the first direction D1. The short-axis line width L2 of the second active region 200 may correspond to the channel width of the second pass transistor PTR2. The long-axis line width W2 of the second active region 200 may be the same as the long-axis line width W1 of the first active region 100 (W1=W2). The short-axis line width L2 of the second active region 200 may be larger than the short-axis line width L1 of the first active region 100 (L1<L2). Accordingly, the first pass transistor PTR1 and the second pass transistor PTR2 may have different channel widths. Accordingly, the channel area of the first pass transistor PTR1 may be smaller than the channel area of the second pass transistor PTR2. The operating characteristics of the first pass transistor PTR1 might not deteriorate although the first pass transistor PTR1 has a smaller channel area than the second pass transistor PTR2 because it transmits the driving signal DS, SS, having the first level voltage that is lower than the second level voltage. That is, each of the first pass transistor PTR1 and the second pass transistor PTR2 may be configured to have a channel area that corresponds to a voltage level of a driving signal transmitted by the pass transistor.

Each of the plurality of third pass transistors PTR3 may have a drain D to which the driving signal SI, having a third level voltage that is higher than the second level voltage, is applied, and may supply the third level voltage to the gate of the memory cell transistor MCT in response to the block selection signal BS that is applied to a gate thereof. In a pass TR unit or pass transistor array that corresponds to any one of the memory blocks BLK0 and BLK1, the number of third pass transistors PTR3 may be the same as the number of memory cell transistors MCT in the cell string CSTR.

In a pass TR unit that corresponds to any one of the memory blocks BLK0 and BLK1, the plurality of third pass transistors PTR3 may be disposed between the second pass transistors PTR2, but may be symmetrically disposed on both sides of the second pass transistor PTR2 that is positioned in the middle of the pass TR unit in the first direction D1. That is, the arrangement of the third pass transistors PTR3 in the first direction D1 in the pass TR unit may correspond to the arrangement of the memory cell transistors MCT in the cell string CSTR.

Each of the plurality of third pass transistors PTR3 may include a third active region 300, a third gate G3 that is formed in the third active region 300 and extended in the first direction D1, and a source S and a drain D that are formed in the third active region 300 on both sides of the third gate G3 in the second direction D2. In this case, two third gates G3 may be formed in one third active region 300. In order to reduce the area, the plurality of third pass transistors PTR3 may have a structure in which a pair of the third pass transistors PTR3 that share the drain D shares one third active region 300. The third gate G3 may be separated from the first gate G1 and the second gate G2, and the first gate G1 to the third gate G3 may be coupled by wiring and formed in a layer that is higher than the first gate G1 to the third gate G3. Furthermore, the line width of the third gate G3 in the second direction D2 may be larger than each of the line width of the first gate G1 and the line width of the second gate G2. Accordingly, the third pass transistor PTR3 may have a longer channel length than each of the first pass transistor PTR1 and the second pass transistor PTR2.

The third active region 300 may have a bar type shape with a long axis that is extended in the second direction D2 and a short axis that is extended in the first direction D1. The short-axis line width L3 of the third active region 300 may correspond to the channel width of the third pass transistor PTR3. The long-axis line width W3 of the third active region 300 may be larger than each of the long-axis line width W1 of the first active region 100 and the long-axis line width W2 of the second active region 200 (W3>W1=W2). In this case, the long-axis line width W3 of the third active region 300 may be more than four times as large as each of the long-axis line width W1 of the first active region 100 and the long-axis line width W2 of the second active region 200. The short-axis line width L3 of the third active region 300 may be larger than each of the short-axis line width L1 of the first active region 100 and the short-axis line width L2 of the second active region 200 (L1<L2<L3). Accordingly, the third pass transistor PTR3 may have a larger channel area than each of the first pass transistor PTR1 and the second pass transistor PTR2. In other words, the channel area of the third pass transistor PTR3 that drives the driving signal SI with the third level voltage may be larger than the channel area of the second pass transistor PTR2 that drives the driving signal DSI with the second level voltage that is lower than the third level voltage. The channel area of the second pass transistor PTR2 may be larger than the channel area of the first pass transistor PTR1 that drives the driving signal SS, DS, having the first level voltage that is lower than the second level voltage. Furthermore, four second active regions 200 and four first active regions 100 may be disposed in an area that corresponds to one third active region 300.

The first active region 100 and second active region 200 that are adjacent to each other may be spaced apart and disposed at a first interval S1 in the first direction D1. The second active region and third active region 300 that are adjacent to each other may be spaced apart and disposed at a second interval S2 in the first direction D1. The third active regions 300 that are adjacent to each other may be spaced apart and disposed at a third interval S3 in the first direction D1. In this case, the first interval S1 and the third interval S3 may be the same, and the second interval S2 may be larger than each of the first interval S1 and the third interval S3.

As described above, in the semiconductor memory device according to the fourth embodiment, the pass TR unit is configured with a plurality of pass transistors with different channel areas based on voltage levels of the driving signals DS, SS, SI, and DSI. Accordingly, the area of the entire layout of the pass TR unit may be reduced, and the degradation in operating characteristics attributable to a reduction in the area may also be prevented.

Furthermore, since the pass TR unit is configured with a plurality of pass transistors with different channel areas based on voltage levels of the driving signals DS, SS, SI, and DSI, a package fit-in issue attributable to an increase in the number of stages of memory cell stacks (or memory cell arrays) may be solved by reducing the length of the entire layout of the pass TR unit in the direction in which the gate lines GL1 and GL2 are extended, that is, in the first direction D1.

Hereinafter, a structure of a pass transistor and a method of fabricating the same, which may be applied to the pass transistor of the semiconductor memory device, according to an embodiment, are described below in detail with reference to drawings.

Figure 8A:
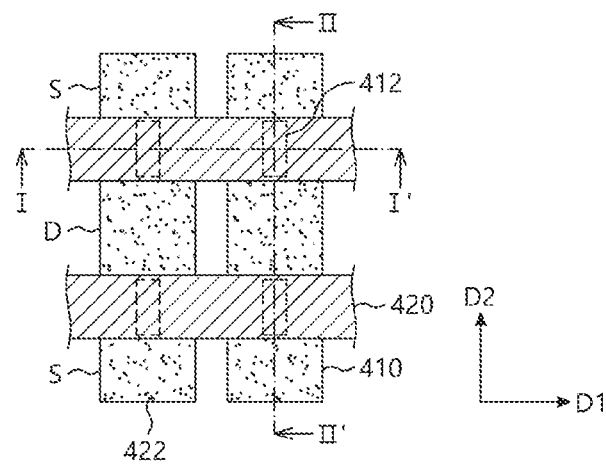
FIG. 8A is a plan view, illustrating a pass transistor of the semiconductor memory device, according to the first embodiment.
Figure 8B:
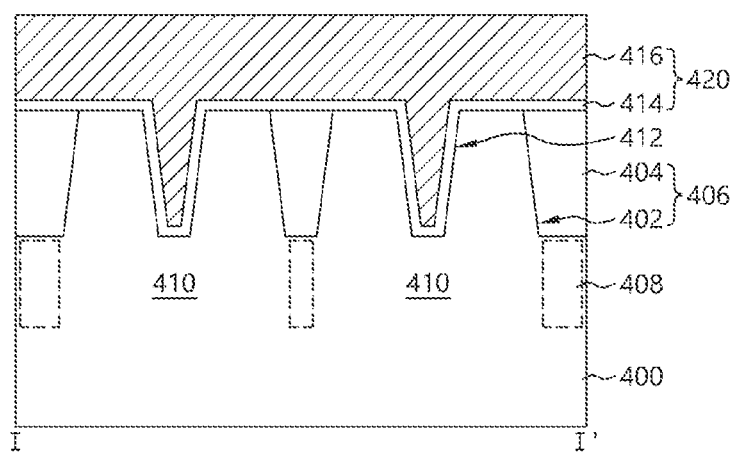
FIGS. 8B and 8C are cross-sectional views, illustrating the pass transistor of the semiconductor memory device, according to the first embodiment, taken along lines I-I' and II-II' in FIG. 8A.
Figure 8C:
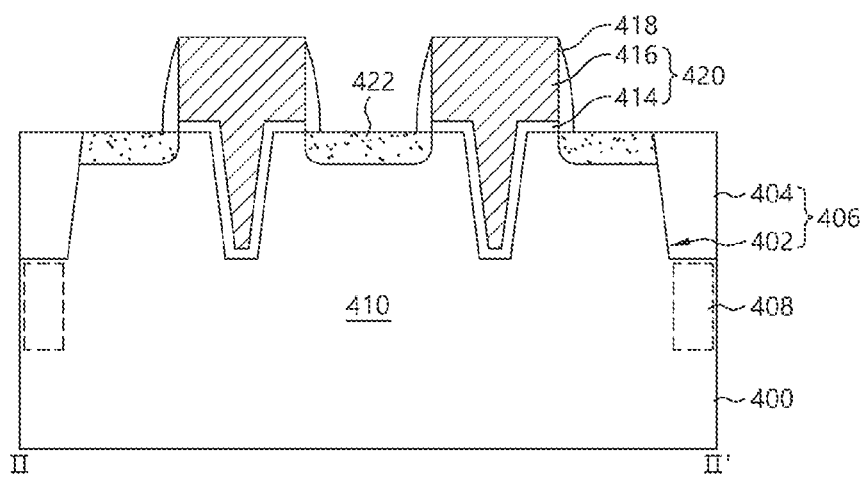

FIG. 8A is a plan view, illustrating a pass transistor of the semiconductor memory device, according to the first embodiment. FIGS. 8B and 8C are cross-sectional views, illustrating the pass transistor of the semiconductor memory device, according to the first embodiment, taken along lines I-I' and II-II' in FIG. 8A.

As illustrated in FIGS. 8A to 8C, the pass transistor may include a substrate 400, an isolation film 406 that is formed in the substrate 400 and configured to define an active region 410, a field stop region 408 that is formed in the substrate 400 under the isolation film 406, a gate 420 that is formed over the substrate 400 and that traverses both the active region 410 and the isolation film in a first direction D1, at least one channel trench 412 that is formed in the substrate 400 under the gate 420, having the gate 420 buried therein and configured to increase the channel area of the pass transistor, and a source S and drain D that is formed in the active region 410 on both sides of the gate 420 in a second direction D2.

The substrate 400 may be a single crystalline semiconductor film. For example, the substrate 400 may be any one of a bulk silicon substrate, a silicon-on-insulator substrate, a germanium substrate, a germanium-on-insulator substrate, a silicon-germanium substrate and an epitaxial thin film that is formed by using a selective epitaxial growth method.

The isolation film 406 may include an isolation trench that is formed in the substrate 400 and a gap-fill insulating film that is configured to gap-fill the isolation trench 402. The gap-fill insulating film 404 may be any single film selected from a group consisting of an oxide film, a nitride film and an oxynitride film or may be a multi-layer film in which two or more of the oxide film, the nitride film and the oxynitride film are stacked. The field stop region that is formed in the substrate 400 under the isolation film 406 may be formed by implanting impurity ions into the substrate 400 under the isolation film 406 and may function to electrically isolate adjacent active regions 410 along with the isolation film 406.

The channel trench 412 that is formed in the active region 410 functions to increase the channel area of the pass transistor. The channel trench may be formed to overlap the gate 420 and may be formed by using a process of forming the isolation trench 402. As the channel trench 412 is formed by using the process of forming the isolation trench 402, a channel width may be more easily increased than a channel length, and further improved current driving power may be secured because a channel area is increased through the increase in channel width.

As the channel trench 412 is formed by using the process of forming the isolation trench 402, the line width of the channel trench 412 in the first direction D1 may be the same as the line width of the isolation trench 402 in the first direction D1, and the line width of the channel trench 412 in the second direction D2 may be equal to or smaller than the line width of the gate 420 in the second direction D2. Accordingly, the pass transistor according to the first embodiment may be applied to a case where the line width of the active region 410 in the first direction D1 is at least more than twice as large as the line width of the isolation film 406 that is positioned between the active regions 410.

Furthermore, the depth of the channel trench 412 from a surface of the substrate 400 may be the same as the depth of the isolation trench 402. This is for securing a maximum channel area within a limited area and also improving process efficiency by using the process of forming the isolation trench 402. In this case, although the channel trench 412 with the same depth as the isolation trench is formed, an interference phenomenon with a pass transistor that is formed in an adjacent active region 410 may be prevented by the field stop region 408.

The gate 420 may have a structure on which a gate insulating film 414 and a gate electrode 416 are stacked. Gate spacers 418 may be formed on both the sidewalls of the gate 420. The gate 420 may be formed to traverse both the isolation film 406 and the active region 410 in the first direction D1, and some of the gate 420 may be formed to bury the channel trench 412 that is formed in the active region 410.

The source S and the drain D may include respective impurity regions 422 that is formed by implanting impurity ions into the substrate 400 on both sides of the gate 420. The impurity region 422 may have a conductive type different from that of the field stop region 408.

As described above, the pass transistor according to the first embodiment includes the channel trench 412 overlapping the gate 420, thus effectively increasing the channel area of the pass transistor, preventing the deterioration in characteristics of the pass transistor within a limited area, and also effectively decreasing the area of the entire layout of a pass TR unit.

Figure 9A:
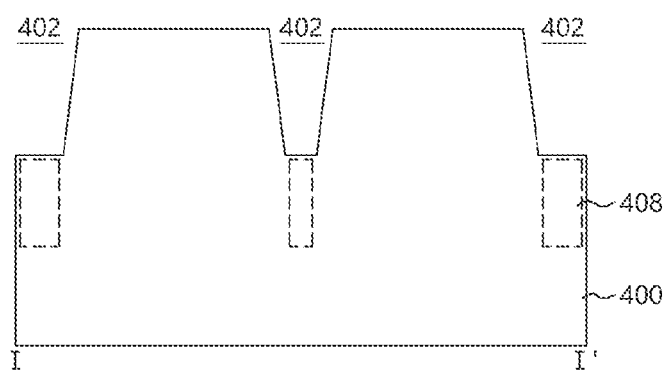
FIGS. 9A to 9C are cross-sectional views, illustrating the pass transistor of the semiconductor memory device, according to the first embodiment, taken along line I-I' in FIG. 8A.
Figure 9B:
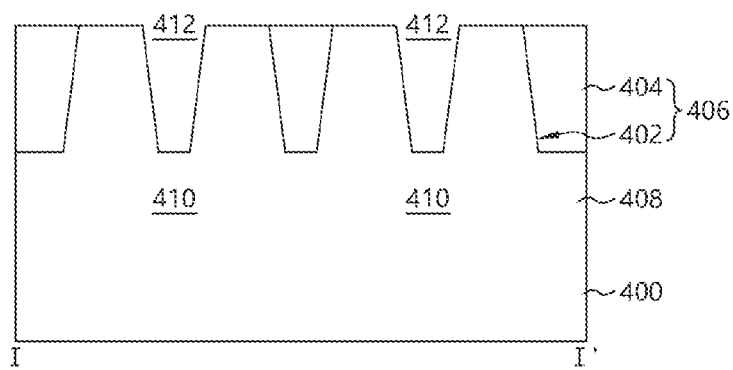
Figure 9C:
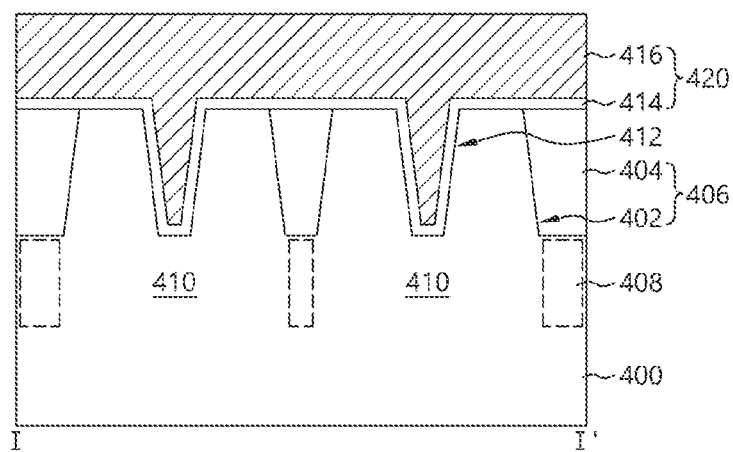

FIGS. 9A to 9C are cross-sectional views illustrating the pass transistor of the semiconductor memory device according to the first embodiment, taken along line I-I' in FIG. 8A.

As illustrated in FIG. 9A, after a mask pattern (not illustrated) for isolation is formed in the substrate 400, the isolation trench 402 is formed by etching the substrate 400 by using the mask pattern as an etch barrier.

Next, after impurity ions are implanted into the substrate 400 under the bottom of the isolation trench 402, the field stop region 408 is formed by performing an annealing process for activating the implanted impurity ions.

As illustrated in FIG. 9B, the isolation film 406 is formed by burying the gap-fill insulating film 404 in the isolation trench 402. The gap-fill insulating film 404 may be any single film selected from a group consisting of an oxide film, a nitride film and an oxynitride film or may be a multi-layer film in which two or more of the oxide film, the nitride film and the oxynitride film are stacked.

Accordingly, the plurality of active regions 410 may be defined.

Next, a mask pattern (not illustrated) for forming the channel trench 412 is formed on the isolation film 406 and the substrate 400 that is formed in the active region 410. The channel trench 412 is formed by etching the substrate 400 of the active region 410 by using the mask pattern as an etch barrier. The channel trench 412 may be formed by using a process of forming the isolation trench 402 and may be formed to have the same depth as the isolation trench 402 with respect to a surface of the substrate 400. The line width of the channel trench 412 in the first direction D1 may be the same as the line width of the isolation trench 402 in the first direction D1. Furthermore, the line width of the channel trench 412 in the second direction D2 may be equal to or smaller than the line width of the gate 420 to be formed through a subsequent process in the second direction D2.

As illustrated in FIG. 9C, after a gate stack film in which the gate insulating film 414 and a conductive film for the gate 420 are sequentially stacked is formed on the substrate 400 in which the channel trench 412 has been formed, the gate 420 that traverses both the isolation film 406 and the active region 410 and partially buried in the channel trench 412 is formed by selectively etching the gate stack film.

Next, the gate spacers 418 are formed on both the sidewalls of the gate 420. The impurity regions 422 functioning as the source S and the drain D are formed by implanting impurity ions into the active region 410 on both sides of the gate 420.

The pass transistor of the semiconductor memory device according to the first embodiment may be formed through the aforementioned process.

Figure 10A:
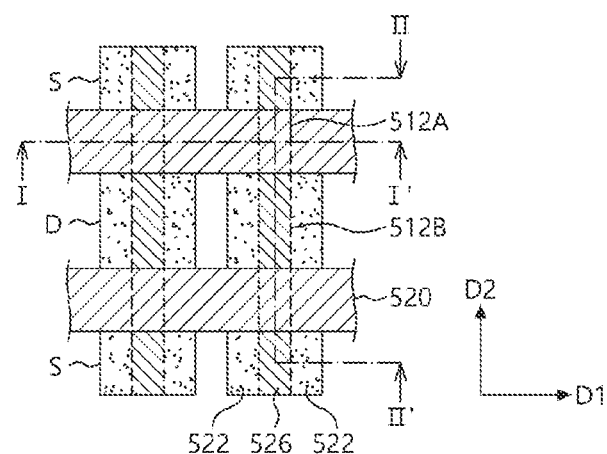
FIG. 10A is a plan view, illustrating a pass transistor of the semiconductor memory device, according to the second embodiment.
Figure 10B:
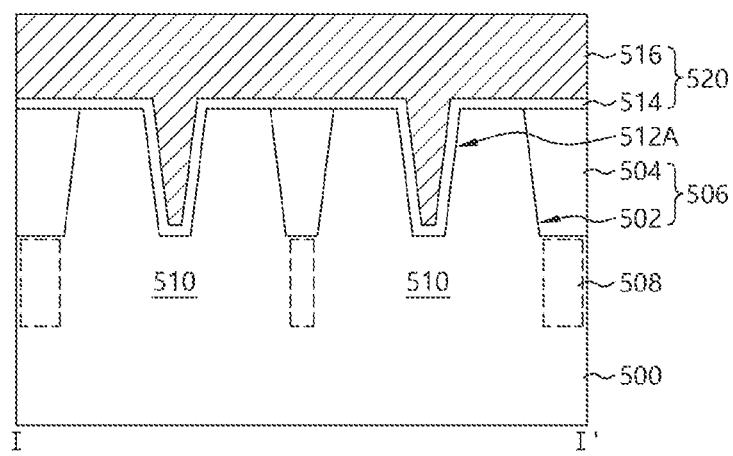
FIGS. 10B and 10C are cross-sectional views, illustrating the pass transistor of the semiconductor memory device, according to the second embodiment, taken along line I-I' and II-II' in FIG. 10A.
Figure 10C:
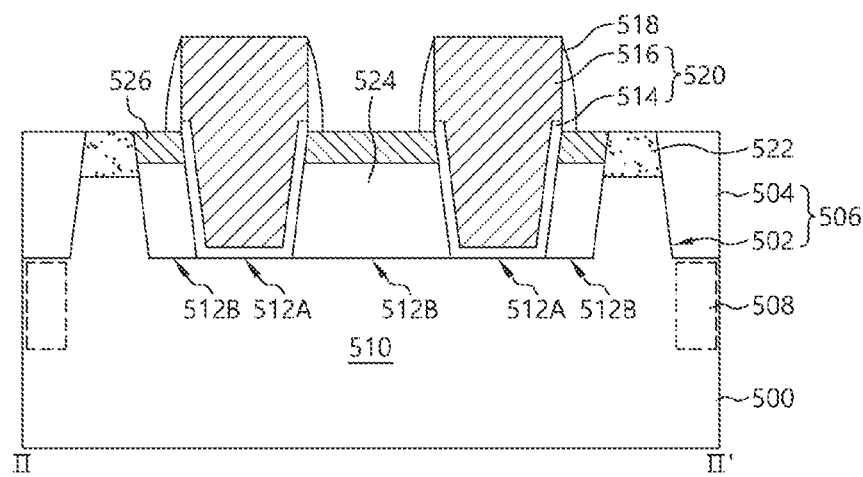

FIG. 10A is a plan view illustrating a pass transistor of the semiconductor memory device according to the second embodiment. FIGS. 10B and 10C are cross-sectional views illustrating the pass transistor of the semiconductor memory device according to the second embodiment, taken along line I-I' and II-II' in FIG. 10A.

As illustrated in FIGS. 10A to 10C, the pass transistor according to the second embodiment may include a substrate 500, an isolation film 506 that is formed in the substrate 500 and configured to define an active region 510, a field stop region 508 that is formed in the substrate 500 under the isolation film 506, a gate 520 that is formed over the substrate 500 and that traverses both the active region 510 and the isolation film 506 in a first direction D1, at least one channel trench 512A that is formed in the substrate 500 under the gate 520, having the gate 520 buried therein and configured to increase the channel area of the pass transistor, and a source S and drain D that is formed in the active region 510 on both sides of the gate 520 in a second direction D2.

The substrate 500 may be a single crystalline semiconductor film. For example, the substrate 500 may be any one of a bulk silicon substrate, a silicon-on-insulator substrate, a germanium substrate, a germanium-on-insulator substrate, a silicon-germanium substrate and an epitaxial thin film that is formed by using a selective epitaxial growth method.

The isolation film 506 may include an isolation trench that is formed in the substrate 500 and a gap-fill insulating film 504 that is configured to gap-fill the isolation trench 502. The gap-fill insulating film 504 may be any single film selected from a group consisting of an oxide film, a nitride film and an oxynitride film or may be a multi-layer film in which two or more of the oxide film, the nitride film and the oxynitride film are stacked. The field stop region 508 that is formed in the substrate 500 under the isolation film 506 may be formed by implanting impurity ions into the substrate 500 under the isolation film 506. The field stop region 508 may function to electrically isolate adjacent active regions 510 along with the isolation film 506.

The channel trench 512A that is formed in the active region 510 is for increasing the channel area of the pass transistor. The channel trench 512A may be formed to overlap the gate 520 and may be formed by using a process of forming the isolation trench 502. As the channel trench 512A is formed by using the process of forming the isolation trench 402, a channel width may be more easily increased than a channel length, and further improved current driving power may be secured because a channel area is increased through the increase in channel width. Since the channel trench 512A is formed by using the process of forming the isolation trench 502, the line width of the channel trench 512A in the first direction D1 may be the same as the line width of the isolation trench 502 in the first direction D1, and the line width of the channel trench 512A in the second direction D2 may be the same as the line width of the gate in the second direction D2. Accordingly, the pass transistor according to the second embodiment may be applied to a case where the line width of the active region 510 in the first direction D1 is at least more than twice as large as the line width of the isolation film that is positioned between the active regions 510.

Furthermore, the depth of the channel trench 512A from a surface of the substrate 500 may be the same as the depth of the isolation trench 502. This is for securing a maximum channel area within a limited area and also improving process efficiency by using the process of forming the isolation trench 502. In this case, although the channel trench 512A with the same depth as the isolation trench 502 is formed, an interference phenomenon with a pass transistor that is formed in an adjacent active region 510 may be prevented by the field stop region 408.

The gate 520 may have a structure on which a gate insulating film 514 and a gate electrode 516 are stacked. Gate spacers 518 may be formed on both the sidewalls of the gate 520. The gate 520 may be formed to traverse both the isolation film 506 and the active region 510 in the first direction D1, and some of the gate 520 may be formed to bury the channel trench 512A that is formed in the active region 510.

The source S and the drain D may each include an impurity region 522 that is formed by implanting impurity ions into the substrate 500 on both sides of the gate 520. The source S and the drain D may also each include a junction trench 512B that is extended in the second direction D2 from the channel trench 512A, configured to divide the impurity region 522 in the first direction D1, and coupled to the isolation trench 502, a junction insulation film 524 that is configured to gap-fill a part of the junction trench 512B, and a conductive film that is formed on the junction insulation film 524 and configured to gap-fill the remaining junction trench 512B and to electrically couple the impurity regions 522 that are divided in the first direction D1.

The junction trench 512B may be formed simultaneously with a process of forming the channel trench 512A and may be formed by using the process of forming the isolation trench 502. Accordingly, the line width of the junction trench 512B in the first direction D1 may be the same as each of the line width of the isolation trench 502 and the line width of the channel trench 512A in the first direction D1. Furthermore, the depth of the junction trench 512B from a surface of the substrate 500 may be the same as each of the depth of the isolation trench 502 and the depth of the channel trench 512A. The junction trench 512B and the channel trench 512A may be coupled to have a line-type pattern that is extended in the second direction D2.

The junction insulation film 524 that gap-fills a part of the junction trench 512B may include a material with an etch selectivity to the gap-fill insulating film 504. The junction insulation film 524 may include any single film selected from a group consisting of an oxide film, a nitride film and an oxynitride film or a multi-layer film in which two or more of the oxide film, the nitride film and the oxynitride film are stacked. The junction insulation film 524 may be formed under the impurity region 522 and may function to physically prevent an excessive extension of a depletion region and to prevent punch through when a high voltage, for example, a second level voltage or a third level voltage is applied to the source S and the drain D.

The conductive film 526 that gap-fills the remaining junction trench 512B on the junction insulation film 524 may function to prevent the contact area of the source S and the drain D from being reduced and to decrease contact resistance between the source S and the drain D through the junction insulation film 524. To this end, the conductive film 526 may form an ohmic contact with the impurity region 522 and may include a conductive material with a lower resistance than the impurity region 522. Furthermore, an interface where the junction insulation film 524 and the conductive film 526 adjoin may be located at a position that is higher than the bottom of the impurity region 522. This is for fundamentally blocking the generation of a leakage current attributable to the conductive film 526.

As described above, the pass transistor according to the second embodiment includes the channel trench 512A overlapping the gate 520. Accordingly, the channel area of the pass transistor may be effectively increased, the deterioration in characteristics of the pass transistor within a limited area may be prevented, and the area of the entire layout of a pass TR unit may also be effectively reduced.

Furthermore, the operating characteristics of the pass transistor may be further improved because the source S and the drain D include the impurity regions 522, the conductive films 526, the junction trenches 512B and the junction insulation films 524.

Figure 11A:
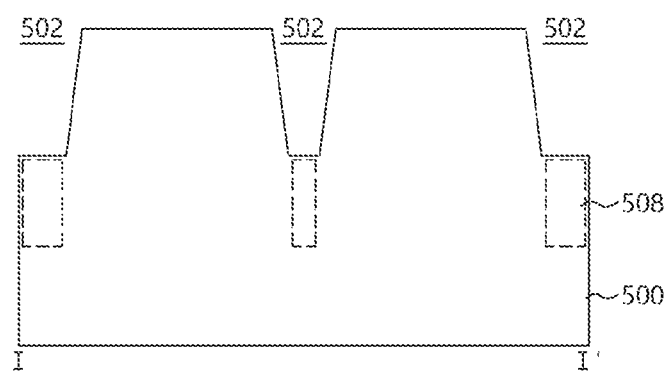
FIGS. 11A to 11C are cross-sectional views, illustrating the pass transistor of the semiconductor memory device, according to the second embodiment, taken along line I-I' in FIG. 10A.
Figure 11B:
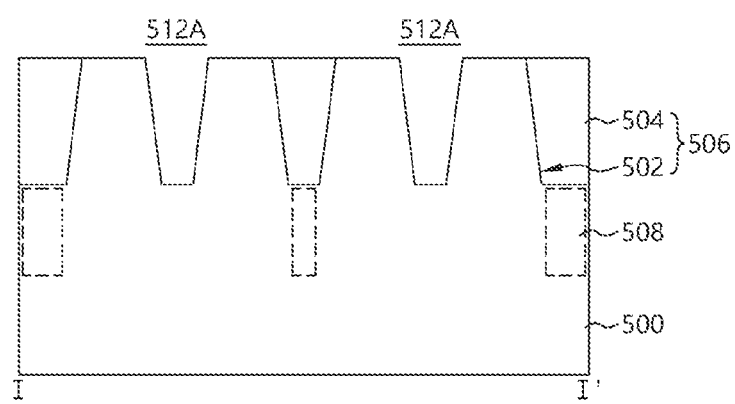
Figure 11C:
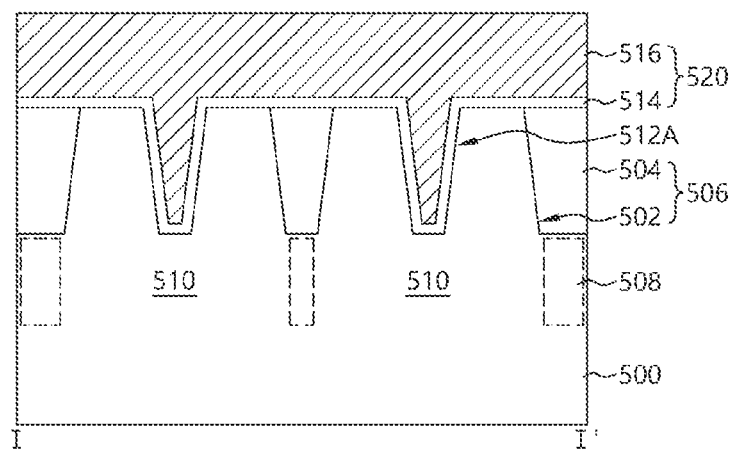

FIGS. 11A to 11C are cross-sectional views illustrating the pass transistor of the semiconductor memory device according to the second embodiment, taken along line I-I' in FIG. 10A. FIGS. 12A to 12D are cross-sectional views illustrating the pass transistor of the semiconductor memory device according to the second embodiment, taken along line II-II' in FIG. 10A.

Figure 12A:
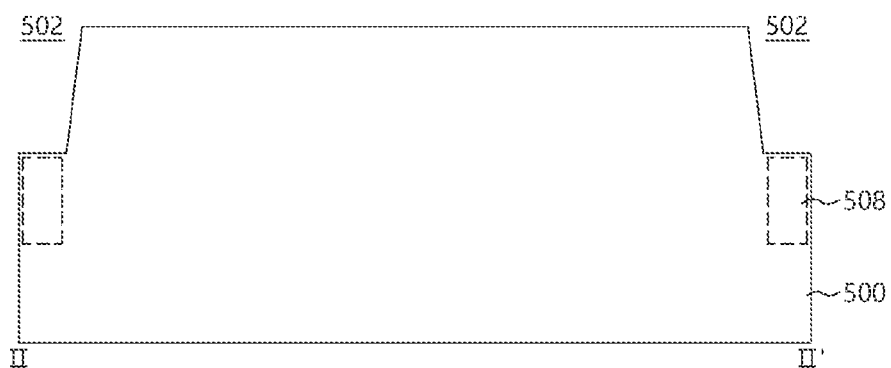
FIGS. 12A to 12D are cross-sectional views, illustrating the pass transistor of the semiconductor memory device, according to the second embodiment, taken along line II-II' in FIG. 10A.

As illustrated in FIGS. 11A and 12A, after a mask pattern (not illustrated) for isolation is formed on the substrate 500, the isolation trench 502 is formed by etching the substrate 500 by using the mask pattern as an etch barrier.

Next, after impurity ions are implanted into the substrate 500 under the bottom of the isolation trench 502, the field stop region 508 is formed by performing an annealing process for activating the implanted impurity ions.

Figure 12B:
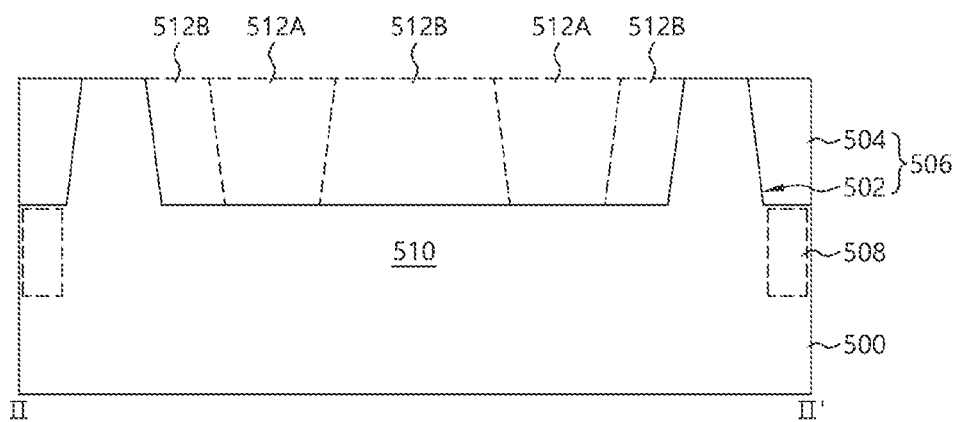

As illustrated in FIGS. 11B and 12B, the isolation film 506 is formed by burying the gap-fill insulating film 504 in the isolation trench 502. The gap-fill insulating film 504 may be formed by using any single film selected from a group consisting of an oxide film, a nitride film and an oxynitride film or a multi-layer film in which two or more of the oxide film, the nitride film and the oxynitride film are stacked Accordingly, the plurality of active regions 510 may be defined.

Next, a mask pattern (not illustrated) for forming channel trench 512A and the junction trench 512B is formed on the isolation film 506 and the substrate 500 that is formed in the active region 510. The channel trench 512A and the junction trench 512B are formed by etching the substrate 500 of the active region 510 by using the mask pattern as an etch barrier. The channel trench 512A and the junction trench 512B may be formed by using a process of forming the isolation trench 502 and may be formed to have the same depth as the isolation trench 502 with respect to a surface of the substrate 500. The line width of each of the channel trench 512A and junction trench 512B in the first direction D1 may be the same as the line width of the isolation trench 502 in the first direction D1. Furthermore, the line width of the channel trench 512A in the second direction D2 may be the same as the line width of the gate 520 to be formed through a subsequent process in the second direction D2. The line width of the junction trench 512B may be the same as the line width of each of the source S and the drain D to be formed through a subsequent process in the second direction D2. That is, the channel trench 512A and the junction trench 512B may have a shape in which they traverse the active region 510 in the second direction D2.

Figure 12C:
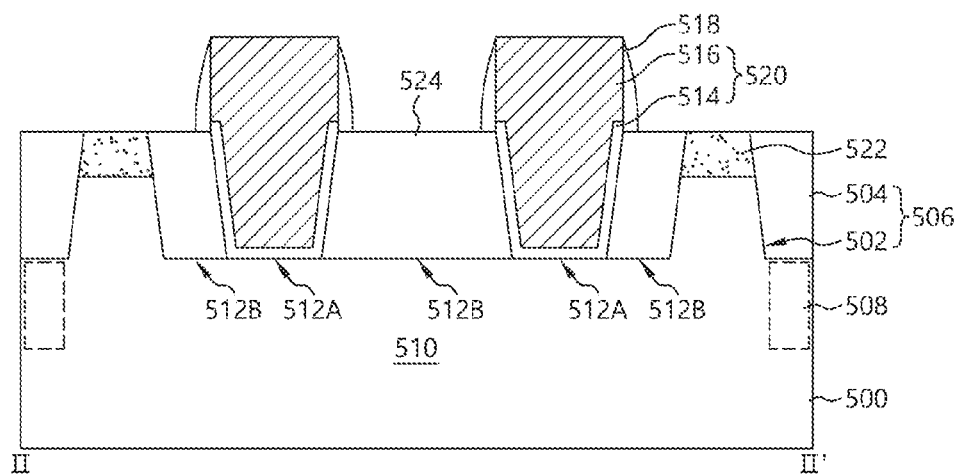

As illustrated in FIGS. 11C and 12C, the junction insulation film 524 is formed to bury the channel trench 512A and the junction trench 512B. The junction insulation film 524 may be formed by using a material film with an etch selectivity to the gap-fill insulating film 504 and may be formed by using any single film selected from a group consisting of an oxide film, a nitride film and an oxynitride film or may be a multi-layer film in which two or more of the oxide film, the nitride film and the oxynitride film are stacked.

Next, the channel trench 512A is re-opened by selectively removing the junction insulation film 524 buried in a region in which the gate 520 will be formed, that is, the channel trench 512A. Next, after a gate stack film on which the gate insulating film 514 and a conductive film for the gate 520 are sequentially stacked is formed on the substrate 500 with the channel trench 512A, the gate 520 that traverses both the isolation film 506 and the active region 510 and partially buried in the channel trench 512A is formed by selectively etching the gate stack film.

Next, the gate spacers 518 are formed on both the sidewalls of the gate 520. The impurity regions 522 are formed by implanting impurity ions into the active region 510 on both sides of the gate 520. The impurity regions 522 may function as the source S and the drain D.

Figure 12D:
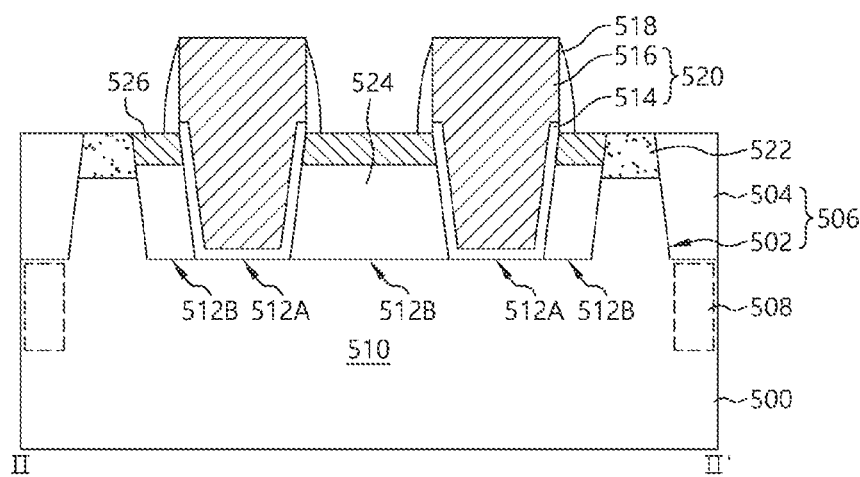

As illustrated in FIGS. 11C and 12D, the junction insulation films 524 that correspond to the regions of the source S and the drain D are each recessed to a given thickness. The conductive films 526 are buried in the regions in which the junction insulation films 524 are recessed. The conductive film 526 may function to prevent the contact area of the source S and the drain D from being reduced and to decrease contact resistance between the source S and the drain D through the junction insulation film 524. To this end, the conductive film 526 may form an ohmic contact with the impurity region 522 and may be formed by using a conductive material with a lower resistance than the impurity region 522. Furthermore, an interface where the junction insulation film 524 and the conductive film 526 adjoin may be formed to be located at a position that is higher than the bottom of the impurity region 522. The pass transistor of the semiconductor memory device according to the second embodiment may be formed through the aforementioned process.

The aforementioned embodiments have illustrated cases where the technical spirit of the present disclosure is applied to a 3D nonvolatile semiconductor memory device, for example, a 3D NAND, but the technical spirit of the present disclosure may be applied to various types of semiconductor devices, such as a transistor configuring a logic circuit or a peripheral circuit, a memory device by using a phase change material, and a memory device by using a magnetoresistance material.

This technology has effects in that it may reduce the area of the entire layout of a pass TR unit and also prevent the degradation in operating characteristics attributable to a reduction in the area, because the pass TR unit is configured with a plurality of pass transistors with different channel areas based on voltage levels of driving signals.

Furthermore, this technology has an effect in that it may solve a package fit-in issue attributable to an increase in the number of stages of memory cell stacks (or memory cell arrays) by reducing the length of the entire layout of a pass TR unit in the direction in which gate lines are extended, because the pass TR unit is configured with a plurality of pass transistors with different channel areas based on voltage levels of driving signals.

Figure 13:
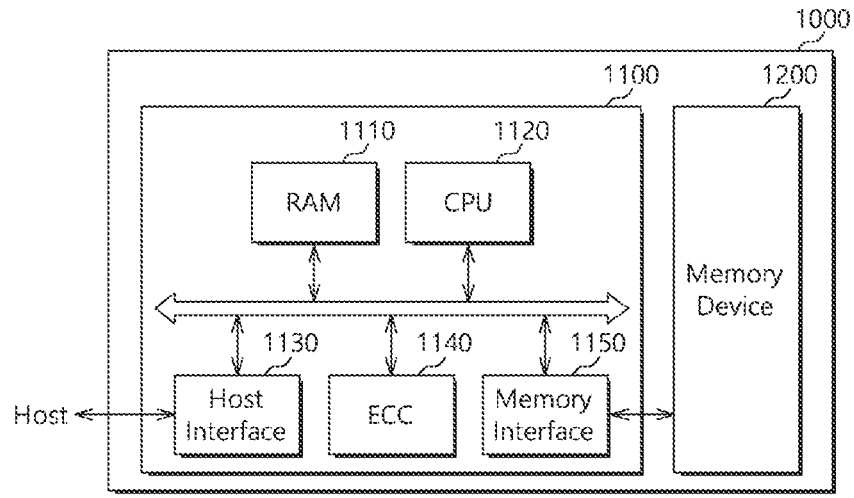
FIG. 13 is a block diagram of the configuration of a memory system according to an embodiment of the present invention.

FIG. 13 is a block diagram of the configuration of a memory system according to an embodiment of the present invention.

As illustrated in FIG. 13, a memory system 1000 may include a memory device 1200 and a controller 1100.

The memory device 1200 may be used to store various data types such as text, graphic and software code. The memory device 1200 may be a non-volatile memory. The memory device may be the semiconductor device described above with reference to FIGS. 1 to 7. In addition, the memory device 1200 may include a cell string in which a plurality of selection transistors, a plurality of dummy transistors and a plurality of memory cell transistors are coupled in series and a pass transistor (TR) unit with a plurality of pass transistors for transmitting a plurality of driving signals to the cell string. The pass TR unit may include a plurality of first pass transistors that are configured to transmit a first driving signal with a first level voltage, among the plurality of driving signals, to the plurality of selection transistors, respectively, and a plurality of second pass transistors that are configured to transmit a second driving signal with a second level voltage that is higher than the first level voltage, among the plurality of driving signals, to the plurality of dummy transistors, respectively. A channel area of each of the plurality of second pass transistors may be larger than a channel area of each of the plurality of first pass transistors. Since the memory device 1200 is formed and manufactured in the above-described manner, a detailed description thereof will be omitted.

The controller 1100 may be couple to a host and the memory device 1200, and the controller 1100 may access the memory device 1200 in response to a request from the host. For example, the controller 1100 may control read, write, erase and background operations of the memory device 1200.

The controller 1100 may include a random access memory (RAM) 1110, a central processing unit (CPU) 1120, a host interface 1130, an error correction code (ECC) circuit 1140 and a memory interface 1150.

The RAM 1110 may function as an operation memory of the CPU 1120, a cache memory between the memory device 1200 and the host, and a buffer memory between the memory device 1200 and the host. The RAM 1110 may be replaced by a static random access memory (SRAM) or a read only memory (ROM).

The host interface 1130 may be interface with the host. For example, the controller 1100 may communicate with the host through one of various interface protocols with a Universal Serial Bus (USB) protocol, a multimedia card (MMC) protocol, a peripheral component interconnection (PCI) protocol, a PCI express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol and a private protocol.

The ECC circuit 1140 may detect and correct errors included in data read from the memory device 1200 by using error correction codes (ECCs).

The memory interface 1150 may interface with the memory device 1200. For example, the memory interface 1150 may include a NAND interface or a NOR interface.

For example, the controller 1100 may further include a buffer memory (not illustrated) configured to temporarily store data. The buffer memory may temporarily store data, externally transferred through the host interface 1130, or temporarily store data, transferred from the memory device 1200 through the memory interface 1150. In addition, the controller 1100 may further include ROM storing code data to interface with the host.

As described above, since the memory system 1000 may become easier to manufacture and includes the memory device with a stable structure and improved characteristics, the characteristics of the memory system 1000 may also be improved.

Figure 14:
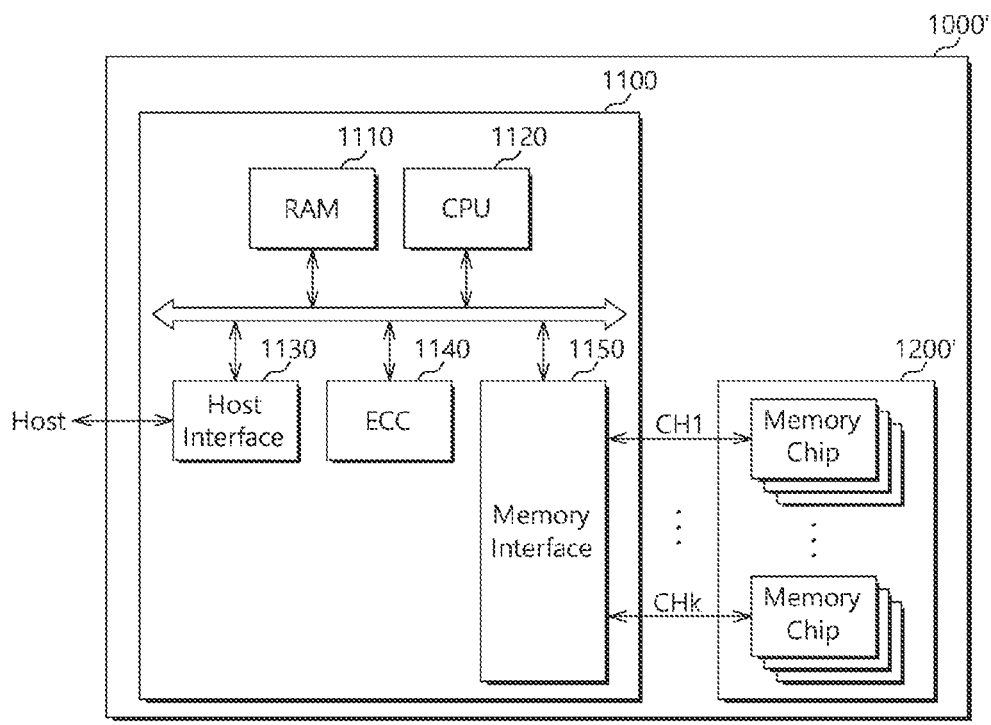
FIG. 14 is a block diagram of the configuration of a memory system according to an embodiment of the present invention.

FIG. 14 is a block diagram of the configuration of a memory system according to an embodiment of the present invention. Hereinafter, a description of common contents with the earlier described embodiment is omitted.

As illustrated in FIG. 14, a memory system 1000' may include a memory device 1200' and the controller 1100. In addition, the controller 1100 may include the RAM 1110, the CPU 1120, the host interface 1130, the ECC circuit 1140 and the memory interface 1150.

The memory device 1200' may be a non-volatile memory device. The memory device 1200' may be the semiconductor device described above with reference to FIGS. 1 to 7. In addition, the memory device 1200' may include a cell string in which a plurality of selection transistors, a plurality of dummy transistors and a plurality of memory cell transistors are coupled in series and a pass transistor (TR) unit with a plurality of pass transistors for transmitting a plurality of driving signals to the cell string. The pass TR unit may include a plurality of first pass transistors configured to transmit a first driving signal with a first level voltage, among the plurality of driving signals, to the plurality of selection transistors, respectively, and a plurality of second pass transistors configured to transmit a second driving signal with a second level voltage that is higher than the first level voltage, among the plurality of driving signals, to the plurality of dummy transistors, respectively. A channel area of each of the plurality of second pass transistors may be larger than a channel area of each of the plurality of first pass transistors. Since the memory device 1200' is formed and manufactured in the above-described manner, a detailed description thereof will be omitted.

In addition, the memory device 1200' may be a multi-chip package composed of a plurality of memory chips. The plurality of memory chips may be divided into a plurality of groups. The plurality of groups may communicate with the controller 1100 through first to k-th channels CH1 to CHk. In addition, memory chips, included in a single group, may be suitable for communicating with the controller 1100 through a common channel. The memory system 1000' may be modified so that a single memory chip may be coupled to a single channel.

As described above, since the memory system 1000' may become easier to manufacture and includes the memory device 1200' with a stable structure and improved characteristics, the characteristics of the memory system 1000' may also be improved. In addition, the data storage capacity of the memory system 1000' may be further increased by forming the memory device 1200' by using a multi-chip package.

Figure 15:
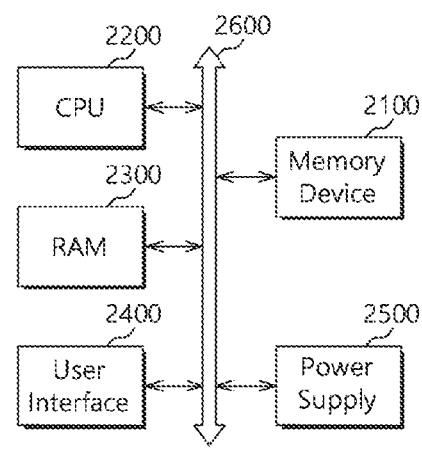
FIG. 15 is a block diagram of the configuration of a computing system according to an exemplary embodiment of the present invention.

FIG. 15 is a block diagram of the configuration of a computing system according to an exemplary embodiment of the present invention. Hereinafter, a description of common contents with the earlier described embodiments is omitted.

As illustrated in FIG. 15, a computing system 2000 may include a memory device 2100, a CPU 2200, a random-access memory (RAM) 2300, a user interface 2400, a power supply 2500 and a system bus 2600.

The memory device 2100 may store data, which is input through the user interface 2400, and data, which is processed by the CPU 2200. In addition, the memory device 2100 may be electrically coupled to the CPU 2200, the RAM 2300, the user interface 2400 and the power supply 2500. For example, the memory device 2100 may be coupled to the system bus 2600 through a controller (not illustrated) or directly coupled to the system bus 2600. When the memory device 2100 is directly coupled to the system bus 2600, functions of the controller may be performed by the CPU 2200 and the RAM 2300.

The memory device 2100 may be a non-volatile memory. In addition, the memory device 2100 may be the semiconductor memory device described above with reference to FIGS. 1 to 7. The memory device 2100 may include a cell string in which a plurality of selection transistors, a plurality of dummy transistors and a plurality of memory cell transistors are coupled in series and a pass transistor (TR) unit with a plurality of pass transistors for transmitting a plurality of driving signals to the cell string. The pass TR unit may include a plurality of first pass transistors configured to transmit a first driving signal with a first level voltage, among the plurality of driving signals, to the plurality of selection transistors, respectively, and a plurality of second pass transistors configured to transmit a second driving signal with a second level voltage that is higher than the first level voltage, among the plurality of driving signals, to the plurality of dummy transistors, respectively. A channel area of each of the plurality of second pass transistors may be larger than a channel area of each of the plurality of first pass transistors. Since the memory device 2100 is formed and manufactured in the above-described manner, a detailed description thereof will be omitted.

In addition, as described above with reference to FIG. 14, the memory device 2100 may be a multi-chip package composed of a plurality of memory chips.

The computing system 2000 having the above-described configuration may be one of various components of an electronic device, such as a computer, an ultra mobile PC (UMPC), a workstation, a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environment, one of various electronic devices for home network, one of various electronic devices for computer network, one of various electronic devices for telematics network, an RFID device, and/or one of various devices for computing systems, etc.

As described above, since the computing system 2000 may become easier to manufacture, and includes a memory device with a stable structure and improved characteristics, the characteristics of the computing system 2000 may also be improved.

Figure 16:
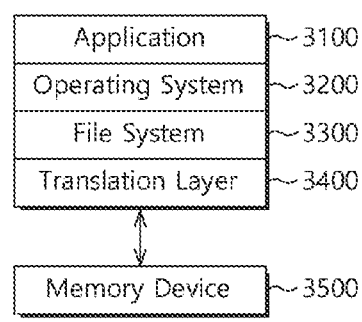
FIG. 16 is a block diagram of a computing system according to an embodiment of the present invention.

FIG. 16 is a block diagram of a computing system according to an embodiment of the present invention.

As illustrated in FIG. 16, a computing system 3000 ray include a software layer that has an operating system 3100 an application 3200, a file system 3300 and a translation layer 3400. In addition, the computing system 3000 may include a hardware layer such as a memory system 3500.

The operating system 3100 manages software and hardware resources of the computing system 3000. The operating system 3100 may control program execution of a central processing unit. The application 3200 may include various application programs executed by the computing system 3000. The application 3200 may be a utility executed by the operating system 3100.

The file system 3300 may refer to a logical structure configured to manage data and files present in the computing system 3000. The file system 3300 may organize files or data to be stored in the memory device 3500 according to rules. The file system 3300 may be determined depending on the operating system 3100 that is used in the computing system 3000. For example, when the operating system 3100 is a Microsoft Windows-based system, the file system 3300 may be a file allocation table (FAT) or an NT file system (NTFS). In addition, when the operating system 3100 is a Unix/Linux-based system, the file system 3300 may be an extended file system (EXT), a Unix file system (UFS) or a journaling file system (JFS).

FIG. 16 illustrates the operating system 3100, the application 3200, and the file system 3300 in separate blocks. However, the application 3200 and the file system 3300 may be included in the operating system 3100.

The translation layer 3400 may translate an address to be suitable for the memory device 3500 in response to a request from the file system 3300. For example, the translation layer 3400 may translate a logic address, generated by the file system 3300, into a physical address of the memory device 3500. Mapping information of the logic address and the physical address may be stored in an address translation table. For example, the translation layer 3400 may be a flash translation layer (FTL), a universal flash storage link layer (ULL) or the like.

The memory device 3500 may be a non-volatile memory. The memory device 3500 may be the semiconductor memory device described above with reference to FIGS. 1 to 7. In addition, the memory device 3500 may include a cell string in which a plurality of selection transistors, a plurality of dummy transistors and a plurality of memory cell transistors are coupled in series and a pass transistor (TR) unit with a plurality of pass transistors for transmitting a plurality of driving signals to the cell string. The pass TR unit may include a plurality of first pass transistors configured to transmit a first driving signal with a first level voltage, among the plurality of driving signals, to the plurality of selection transistors, respectively, and a plurality of second pass transistors configured to transmit a second driving signal with a second level voltage that is higher than the first level voltage, among the plurality of driving signals, to the plurality of dummy transistors, respectively. A channel area of each of the plurality of second pass transistors may be larger than a channel area of each of the plurality of first pass transistors. Since the memory device 3500 is formed and manufactured in the above-described manner, a detailed description thereof will be omitted.

The computing system 3000 with the above-described configuration may be divided into an operating system layer that is operated in an upper layer region and a controller layer that is operated in a lower level region. The operating system 3100, the application 3200, and the file system 3300 may be included in the operating system layer and driven by an operation memory. In addition, the translation layer 3400 may be included in the operating system layer or the controller layer.

As described above, since the computing system 3000 may become easier to manufacture, and includes a memory device with a stable structure and improved characteristics, the characteristics of the computing system 3000 may also be improved.

Figure 17:
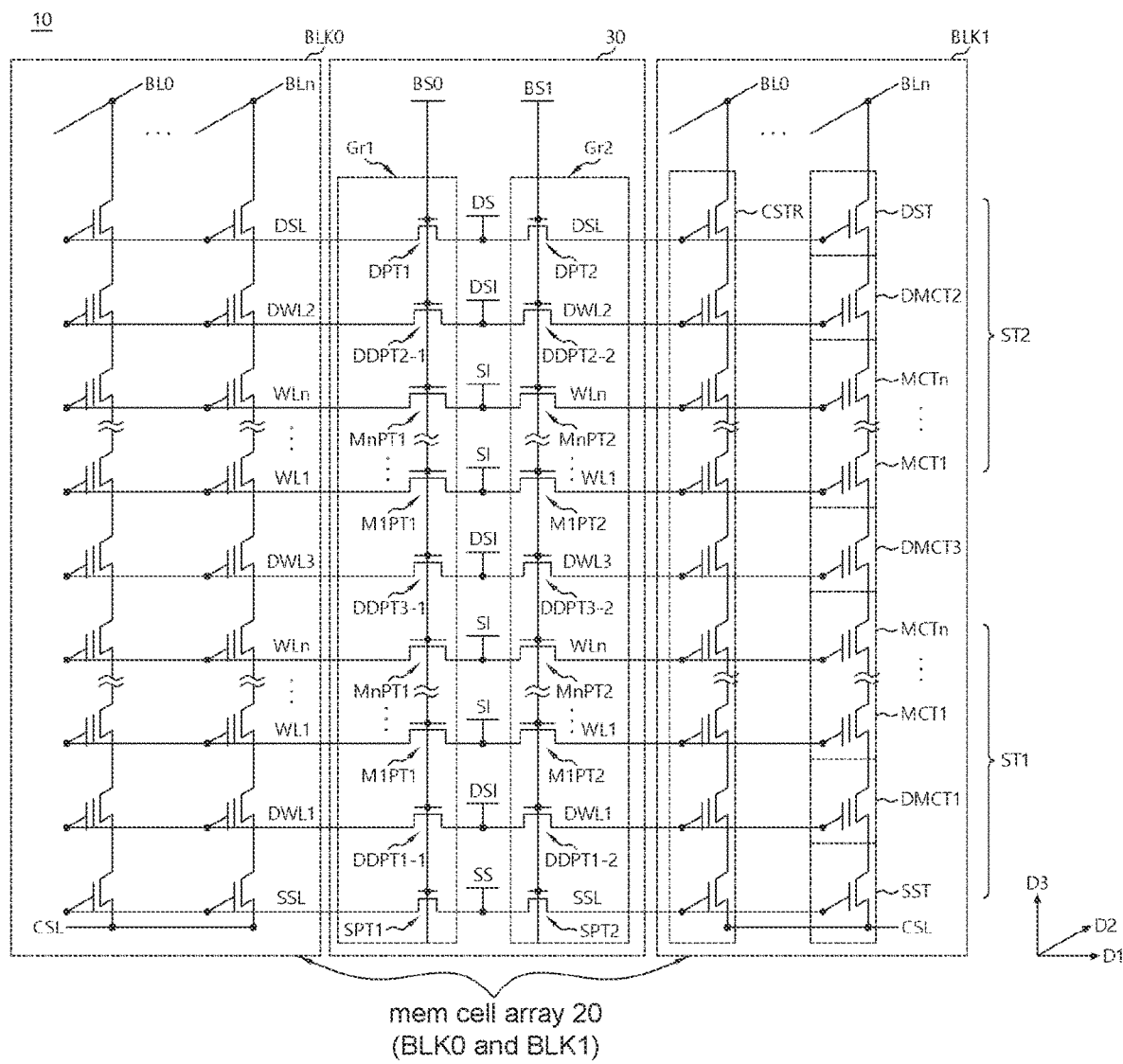
FIG. 17 is a circuit diagram of a semiconductor memory device including a pass TR unit according to an embodiment of the present invention.
Figure 18:
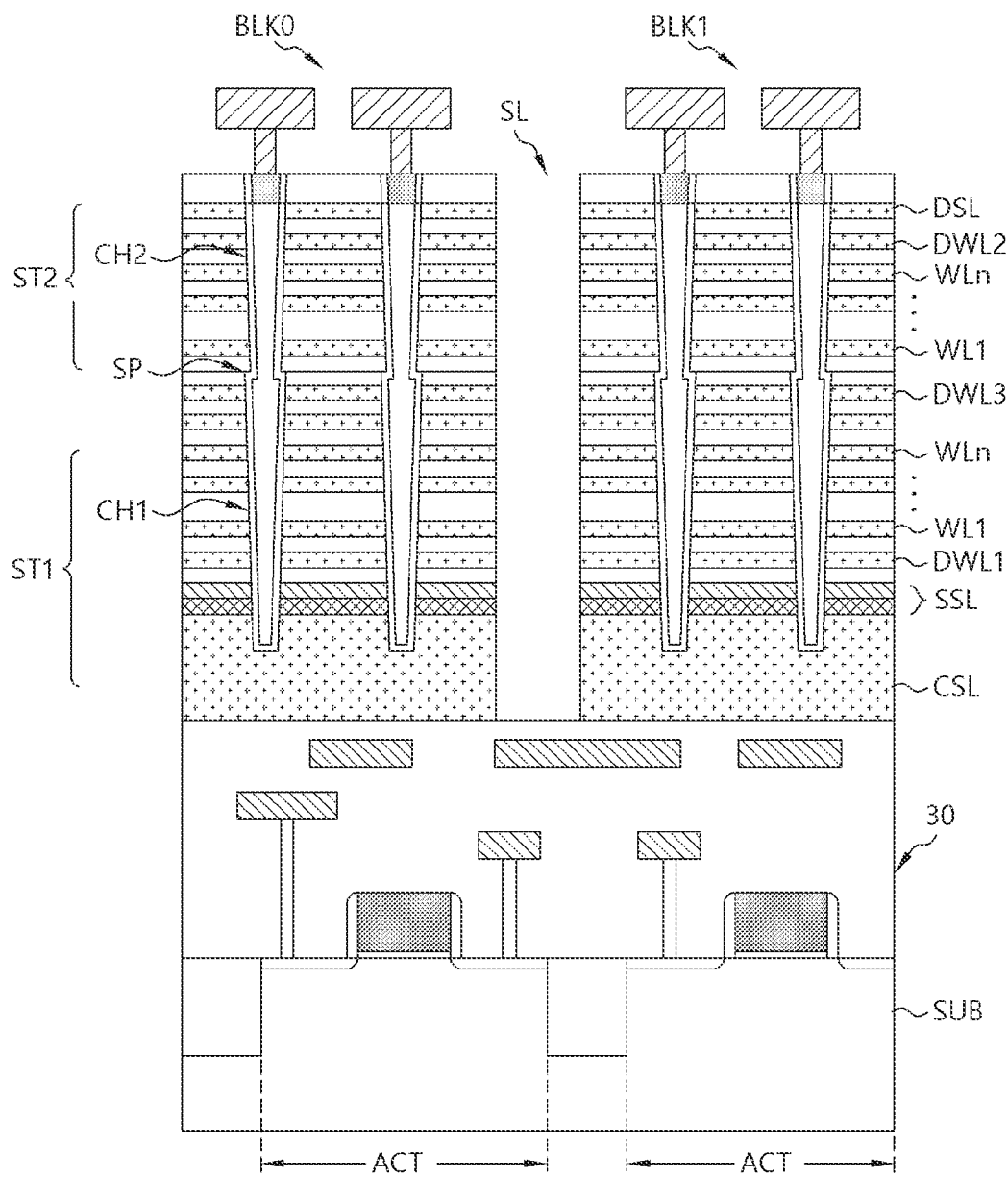
FIG. 18 is a schematic cross-sectional view of the semiconductor memory device including a pass TR unit according to an embodiment of the present invention.

FIG. 17 is a circuit diagram of a semiconductor memory device including a pass TR unit according to an example embodiment of the present invention. FIG. 18 is a schematic cross-sectional view of the semiconductor memory device including a pass TR unit according to an example embodiment of the present invention.

Referring to FIG. 17, a semiconductor memory device may include a memory cell array 20 with a first memory block BLK0 and a second memory block BLK1, as a memory cell array. The semiconductor memory device 10 may include a pass TR unit 30 as a control circuit for controlling the memory cell array 20.

In example embodiments, the first and second memory blocks BLK0 and BLK1 may include substantially the same structure. For example, each of the first memory block BLK0 and the second memory block BLK1 may include a plurality of cell strings CSTRs. Each of the cell strings CSTRs may include at least one source selection transistor SST, a plurality of memory cell transistors MCT1~MCTn, and at least one drain selection transistor DST.

Further, each of the first and second memory blocks BLK0 and BLK1 may include at least one source selection line SSL, a plurality of word lines WL1~WLn, and at least one drain selection DSL. The source selection line SSL may be a gate of the source selection transistor SST. The drain selection line DSL may be a gate of the drain selection transistor DST. The plurality of word lines WLs may be gates of plurality of memory cell transistors MCT1~MCTn, respectively.

In example embodiments, each of the memory blocks BLK0 and BLK1 may include at least two memory stacks. For example, each of the memory blocks BLK0 and BLK1 may include a lower memory stack ST1 and an upper memory stack ST2 disposed over the lower memory stack ST1, as shown in FIG. 18. The lower memory stack ST1 may include at least one source selection transistor SST and a plurality of memory cell transistors MCT1 to MCTn connected in series. The upper memory stack ST2 may include a plurality of memory cell transistors MCT1 to MCTn and at least one drain selection transistor DST connected in series.

For example, the lower memory stack ST1 may include at least one channel contact structure CH1 defined by a first etching process. The upper memory stack ST2 may include at least one channel contact structure CH2 defined by a second etching step different from the first etching step. The lower memory stack ST1 and the upper memory stack ST2 may be stacked to face the channel contact structure CH1 of the lower memory stack ST1 and the channel contact structure CH2 of the upper memory stack ST2.

In example embodiments, each of the memory blocks BLK0 and BLK1 may further include a plurality of dummy memory cell transistors DMCT1 to DMCT3 and a plurality of dummy word lines DWL1 to DWL3 connected to the plurality of dummy memory cell transistors DMCT1 to DMCT3, respectively. For example, the plurality of dummy word lines DWL1 to DWL3 may be electrically connected to gates of the plurality of dummy memory cell transistors DMCT1 to DMCT3, respectively.

The first dummy memory cell transistor DMCT1 may be provided to alleviate a gap between a performance of the source selection transistor SST and a performance of the memory cell transistor MCT1 adjacent to the source selection transistor SST. The second dummy memory cell transistor DMCT2 may be provided to alleviate a gap between a performance of the drain selection transistor DST and a performance of the memory cell transistor MCTn adjacent to the drain selection transistor DST. The third dummy memory cell transistor DMCT3 may be provided between the lower and upper memory stacks ST1 and ST2, to alleviate a process deviation between the lower and upper memory stacks ST1 and ST2.

Due to the process deviation between the lower and upper memory stacks ST1 and ST2, a step portion "sp" may be formed between the channel contact structure CH1 of the lower memory stack ST1 and the channel contact structure CH2 of the upper memory stack ST2. The third dummy memory cell transistor DMCT3 may be designed to have an intermediate performance between the property of the nth memory cell transistor MCTn of the lower memory stack ST1 and the property of the first memory cell transistor MCT1 of the upper memory stack ST2, so that the process deviation between the memory stacks ST1 and ST2 may be reduced.

Further, the first memory block BLK0 and the second memory block BLK1 may be defined by a slit "SL".

The pass TR unit 30 may be selectively connected to one of the first memory block BLK0 and the second memory block BLK1. The pass TR unit 30 may include a first group Gr1 and a second pass group Gr2. The first group Gr1 may include a plurality of pass transistors that are connected to the source selection line SSL, the plurality of word lines WLs, the drain selection DSL and the plurality of dummy word lines DWL1 to DWL3 of the first memory block BLK0, respectively.

The plurality of pass transistors of the first group Gr1 may include at least one source pass transistor SPT1, a plurality of memory pass transistors M1PT1~MnPT1, at least one drain pass transistor DPT1 and a plurality of dummy pass transistors DDPT1-1 to DDPT3-1. In example embodiments, the source pass transistor SPT1, the plurality of memory pass transistors M1PT1~MnPT1, the drain pass transistor DPT1 and the plurality of dummy pass transistors DDPT1-1 to DDPT3-1 may receive the first block selection signal BS0 as their gate signals.

For example, the source pass transistor SPT1 may be electrically connected between the source selection line SSL of the first memory block BLK0 and a source driving signal terminal SS in response to the first block selection signal BS0. The plurality of memory pass transistors M1PT1~MnPT1 may be electrically connected between the plurality of word lines WL1 to WLn of the first memory block BLK0 and a word line driving signal terminal SI, in response to the first block selection signal BS0. The drain pass transistor DPT1 may be electrically connected between the drain selection line DSL of the first memory block BLK0 and a drain driving signal terminal DS in response to the first block selection signal BS0. The plurality of dummy pass transistors DDPT1-1 to DDPT3-1 may be electrically connected between the dummy word lines DWL1 to DWL3 of the first memory block BLK0 and a dummy word line driving signal terminal DSI. In various embodiments and in FIG. 17, for convenience of explanation, each of the driving signal terminals may be denoted by driving signal's name applied to the corresponding driving signal terminal.

The second group Gr2 may include at least one source pass transistor SPT2, a plurality of memory pass transistors M1PT2~MnPT2, at least one drain pass transistor DPT2, and a plurality of dummy pass transistors DDPT1-1 to DDPT3-1 DDPT1-2~DDPT3-2, which ay correspond to the plurality of pass transistors SPT1, M1PT1~MnPT1, DPT1, and DDPT1-1~DDPT3-1 of the first group Gr1. For example, the plurality of pass transistors SPT2, M1PT2~MnPT2, DPT2, and DDPT1-2~DDPT3-2 may be turned on based on a second block selection signal BS1. For example, the first block selection signal BS0 and the second block selection signal BS1 may be alternately enabled. The plurality of pass transistors SPT2, M1PT2~MnPT2, DPT2, and DDPT1-2~DDPT3-2 of the second group Gr2 may be electrically connected between the driving signal terminals SS, SI, DS and DSI and the source selection line SSL, the plurality of word lines WL1~WLn, the drain selection DSL and the plurality of dummy word lines DWL1~DWL3 of the second memory block BLK2.

In example embodiments, referring to FIG. 18, a control circuit may be integrated on a substrate SUB. For example, the control circuit region may include the pass TR unit 30. The memory cell array 20 may be disposed over the control circuit region. For example, the memory cell array 20 may include the first and second memory blocks BLK0 and BLK1. In other word, the pass TR unit 30 may be located between the substrate SUB and the memory blocks BLK0, BLK1. Each of the pass transistors SPT1, SPT2, M1PT1~MnPT1, M1PT2~MnPT2, DPT1, DPT2, DDPT1-1~DDPT3-1 and DDPT1-2~DDPT3-2 in the pass TR unit 30 may include a gate, a source and a drain. The pass transistors SPT1, SPT2, M1PT1~MnPT1, M1PT2~MnPT2, DPT1, DPT2, DDPT1-1~DDPT3-1 and DDPT1-2~DDPT3-2 may be formed in (or over) a plurality of active regions defined in the substrate SUB. For example, sizes of the active regions in which the pass transistors SPT1, SPT2, M1PT1~MnPT1, M1PT2~MnPT2, DPT1, DPT2, DDPT1-1~DDPT3-1 and DDPT1-2~DDPT3-2 are to be formed may be set depending on a magnitude (or voltage level) of the driving signal applied to the drain of each of the pass transistors SPT1, SPT2, M1PT1~MnPT1, M1PT2~MnPT2, DPT1, DPT2, DDPT1-1~DDPT3-1 and DDPT1-2~DDPT3-2.

For example, the source driving signal SS may include a first voltage range from 0V to a first voltage V1. The word line driving signal SI may include a second voltage range from a negative voltage −V2 to a positive voltage +V2, where the voltage of +V2 may be referred to as a second voltage V2. The second voltage V2 may be higher than the first voltage V1. The drain driving signal DS may include a third voltage range from 0V to a third voltage V3. In some example embodiments, the third voltage V3 may be substantially the same as the first voltage V1. In other example embodiments, the third voltage V3 may be different from the first voltage V1 and the third voltage V3 may be lower than the second voltage V2. The dummy word line driving signal DSI may include a fourth voltage range from 0V to a fourth voltage V4. The fourth voltage V4 may not be more than the second voltage V2. For example, the fourth voltage V4 may be a voltage between the third voltage V3 and the first voltage V1. Alternately, the fourth voltage V4 may be a voltage between the first voltage V1 and the second voltage V2.

Accordingly, the first voltage range, the third voltage range, and the fourth voltage range may be independent of each other, albeit within the constraints described above. Therefore, in one embodiment two or more of the voltage ranges may be the same, while in another embodiment all four of the voltage ranges may be different.

FIG. 19A to FIG. 19D are plan views of the pass transistors according to various embodiments of the present invention. For reference, FIG. 19A to FIG. 19D show examples of the layout of the pass transistors of the first group Gr1.

Although the pass transistors of the second group Gr2 are not shown in FIG. 19A to FIG. 19D, a layout of the pass transistors of the second group Gr2 may be substantially same as the layout of the layout of the pass transistors of the first group Gr1.

Figure 19A:
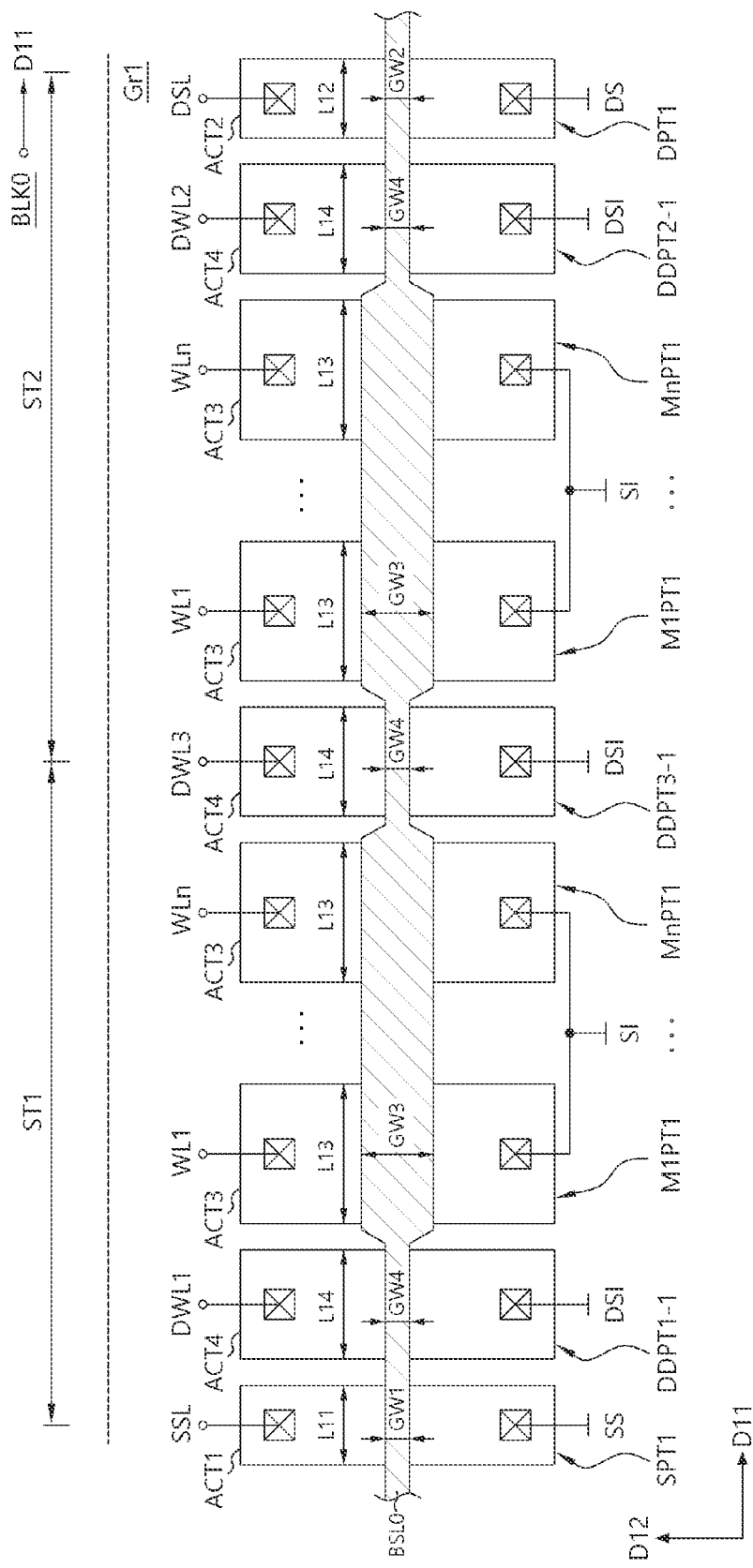
FIG. 19A to FIG. 19D are plan views of the pass transistors according to various embodiments of the present invention.

Referring to FIG. 17, FIG. 18 and FIG. 19A, a first active region ACT1, a second active region ACT 2, a plurality of third active regions ACT3, and a plurality of fourth active regions ACT4 may be defined in the semiconductor substrate SUB. The source pass transistor SPT1 may be formed in the first active region ACT1. The drain pass transistor DPT1 may be formed in the second active region ACT2. The plurality of memory pass transistors M1PT1~MnPT1 may be formed in one or more of the plurality of third active regions ACT3. The plurality of dummy pass transistors DDPT1-1 to DDPT3-1 may be formed in one or more of the plurality of fourth active regions ACT4.

A first block selection line BSL0 may be arranged over the first to fourth active regions ACT1 to ACT4. For example, the first block selection line BSL0 may extend along a first direction D11 over the first to fourth active regions ACT1 to ACT4 without an electrical disconnection. The block selection line BSL0 may be used as gates of the pass transistors SPT1, M1PT1~MnPT1, DPT1 and DDPT1-1~DDPT3-1. The first to fourth active regions ACT1 to ACT4 at one side of the first block selection line BSL0 may respectively be a source of each of the pass transistors SPT1, M1PT1~MnPT1, DPT1 and DDPT1-1~DDPT3-1. The sources of the pass transistors SPT1, M1PT1~MnPT1, DPT1 and DDPT1-1~DDPT3-1 may be connected to the source selection line SSL, the plurality of word lines WL1~WLn, the drain selection DSL and the plurality of dummy word lines DWL1~DWL3, respectively. The first to fourth active regions ACT1 to ACT4 at the other side of the first block selection line BSL0 may respectively be a drain of each of the pass transistors SPT1, M1PT1~MnPT1, DPT1 and DDPT1-1~DDPT3-1. The drains of the pass transistors SPT1, M1PT1~MnPT1, DPT1 and DDPT1-1~DDPT3-1 may be connected to the driving signal terminals SS, SI, DS and DSI, respectively. For reference, the direction D11 of the first group Gr1 in FIG. 19A to FIG. 19D may correspond to the direction D1 of FIG. 17 and the first direction D11 of the first memory block BLK0 in FIG. 19A to FIG. 19D may correspond to the direction D3 of FIG. 17.

In example embodiments, channel widths L11, L12, L13 and L14 of the pass transistors SPT1, DPT1, M1PT1~MnPT1, and DDPT1-1~DDPT3-1 may be set in proportion to the magnitudes (or the voltage levels) of the driving signals SS, DS, SI, and DSI applied to the pass transistors SPT1, DPT1, M1PT1~MnPT1, and DDPT1-1~DDPT3-1, respectively. The channel widths L11, L12, L13 and L14 may correspond to the short-axis of the first to fourth active regions ACT1 to ACT4. For example, if the third voltage V3 is 12V and the first voltage is 6V, the channel width L13 of the third active region ACT3 may be set to be twice as large as the channel width L11 of the first active region ACT1.

In example embodiments, gate widths GW1, GW2, GW3 and GW4 of the pass transistors SPT1, DPT1, M1PT1~MnPT1, and DDPT1-1~DDPT3-1 may be set in proportion to the magnitudes (or the voltage levels) of the driving signals SS, DS, SI, DS, and DSI applied to the pass transistors SPT1, DPT1, M1PT1~MnPT1, and DDPT1-1~DDPT3-1, respectively. For example, if the third voltage V3 12V and the first voltage V1 is 6V, the gate width GW3 of each of the third active regions ACT3 may be set to be twice as large as the gate width GW1 of the first active region ACT1.

Figure 19B:
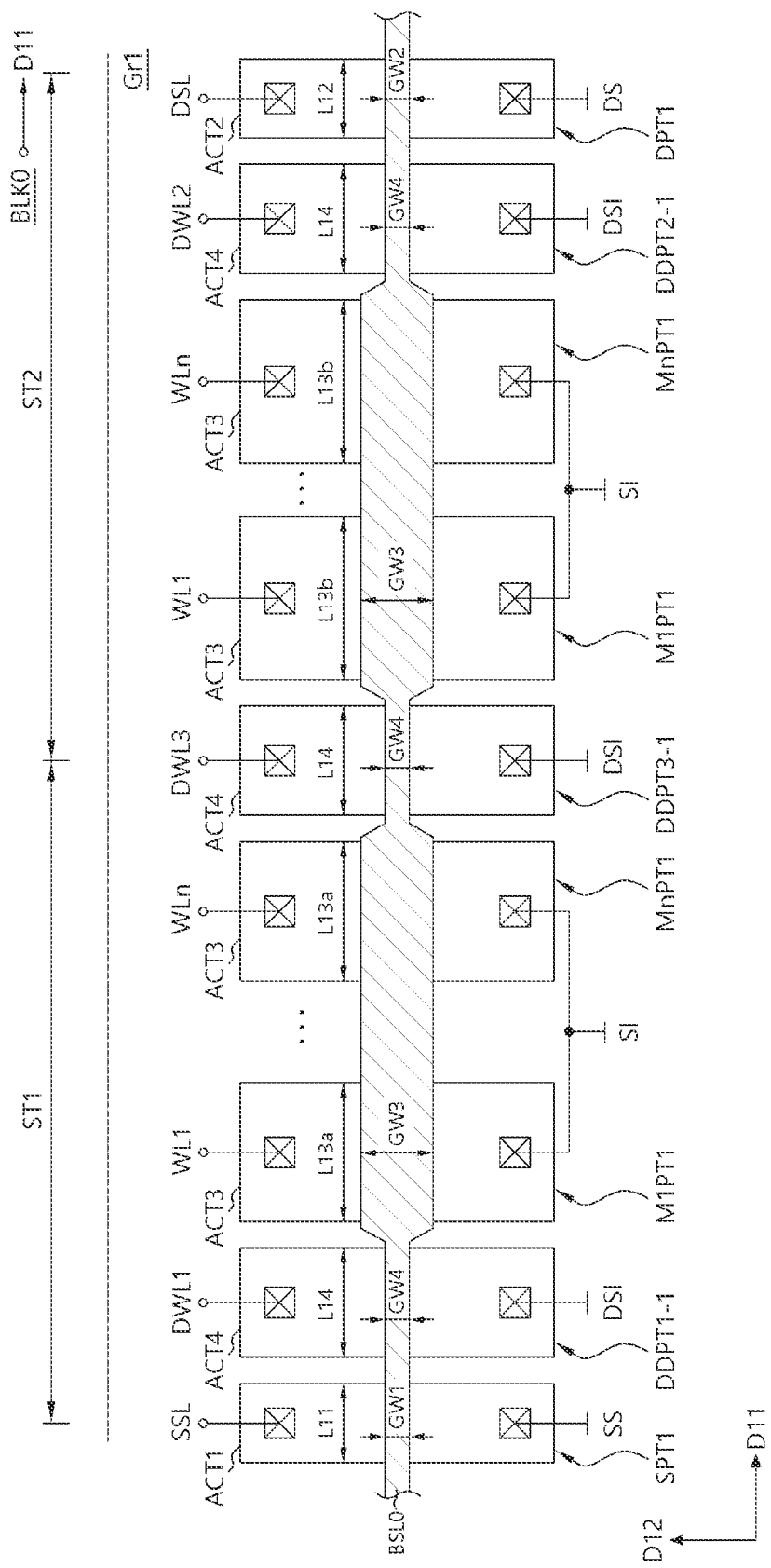

Referring to FIG. 19B, the channel widths L13b of the third active regions ACT3 connected to the plurality of word lines WL1~WLn of the upper memory stack ST2 may be larger than the channel widths L13a of the third active regions ACT3 connected to the plurality of word lines WL1~WLn of the lower memory stack ST1.

Since the plurality of word lines WL1~WLn of the upper memory stack ST2 is arranged farther from the memory pass transistors M1PT1~MnPT1 than the plurality of word lines WL1~WLn of the lower memory stack ST1, a signal delay of the upper memory stack ST2 may be greater than the signal delay of the lower memory stack ST1.

According to the embodiments, the signal delay of the upper memory stack ST2 may be reduced by expanding the channel widths L13b of the plurality of memory pass transistors M1PT1~MnPT1 connected to the plurality of word lines WL1~WLn of the upper memory stack ST2. Similarly, when the first voltage range and the third voltage range are substantially equal, the channel width L12 of the drain pass transistor DPT1 for controlling the upper memory stack ST2 may be larger than the channel width L11 of the source pass transistor SPT1 for controlling the lower memory stack ST1.

Figure 19C:
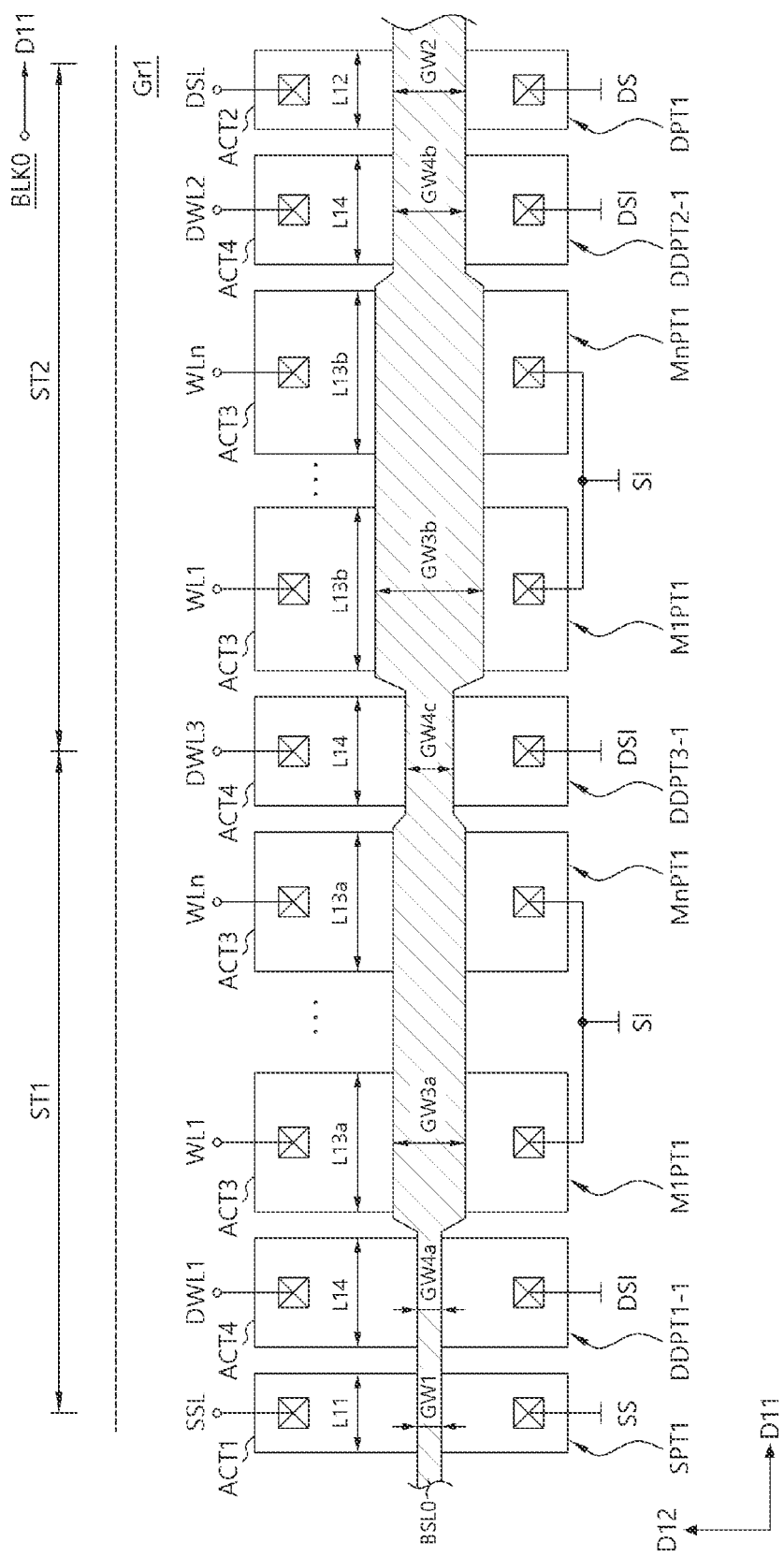

Referring to FIG. 19C, the gate widths GW3b, GW2 and GW4b of the pass transistors M1PT1~MnPT1, DPT1 and DDPT2-1 of the upper memory stack ST2 may be larger than the gate widths GW3a, GW1 and GW4a of the pass transistors M1PT1~MnPT1, SPT1 and DDPT1-1 of the lower memory stack ST1. For example, the gate widths GW3b of the memory pass transistors M1PT1~MnPT1 for controlling the upper memory stack ST2 may be larger than the gate widths GW3a of the memory pass transistors M1PT1~MnPT1 for controlling the lower memory stack ST1. As well known, the gate width of a transistor may correspond to a channel length of the transistor. As the channel length of the transistor increases, a driving force of the transistor may increase. Thus, the driving forces of the memory pass transistors M1PT1~MnPT1 for controlling the upper memory stack ST2 that is farther than the lower memory stack ST1 may be greater than the driving forces of the memory pass transistors M1PT1~MnPT1 for controlling the lower memory stack ST1. Accordingly, the signal delay of the upper memory stack ST2 may be reduced by adjusting the corresponding gate widths of the pass transistors SPT1, M1PT1~MnPT1, DPT1 and DDPT1-1~DDPT3-1.

According to the embodiments, the gate widths of the pass transistors may be adjusted based on positions of target signal lines to be controlled in the memory blocks BLK0 and BLK1. For example, the "position(s)" may be interpreted as a distance or height from the substrate SUB (or the pass transistor formed in the substrate SUB) to the corresponding signal line SSL or DSL.

In addition, the channel width L12 of the drain pass transistor DPT1 for controlling the upper memory stack ST2 may be larger than the channel width 11 of the source pass transistor SPT1 for controlling the lower memory stack ST1 to compensate for the positions of the source selection line SSL and the drain selection line DSL.

Although the first to third dummy pass transistors DDPT1-1~DDPT3-1 receive the same dummy word line driving signal DSI as the drain signals, the gate widths GW4a, GW4b and GW4c and the channel lengths L14 of the first to third dummy pass transistors DDPT1-1~DDPT3-1 may be set to be different from the each other based on the positions of the dummy word lines DWL1~DWL3 connected to the dummy pass transistors DDPT1-1~DDPT3-1 and the driving forces of other transistors adjacent to each of the dummy pass transistors DDPT1-1~DDPT3-1.

In the example embodiments, areas (or size) of the active regions and the gate widths of the pass transistors may be adjusted according to positions of signal lines connected to their sources, even if the pass transistors receive the same gate signal and the same drain signal.

Figure 19D:
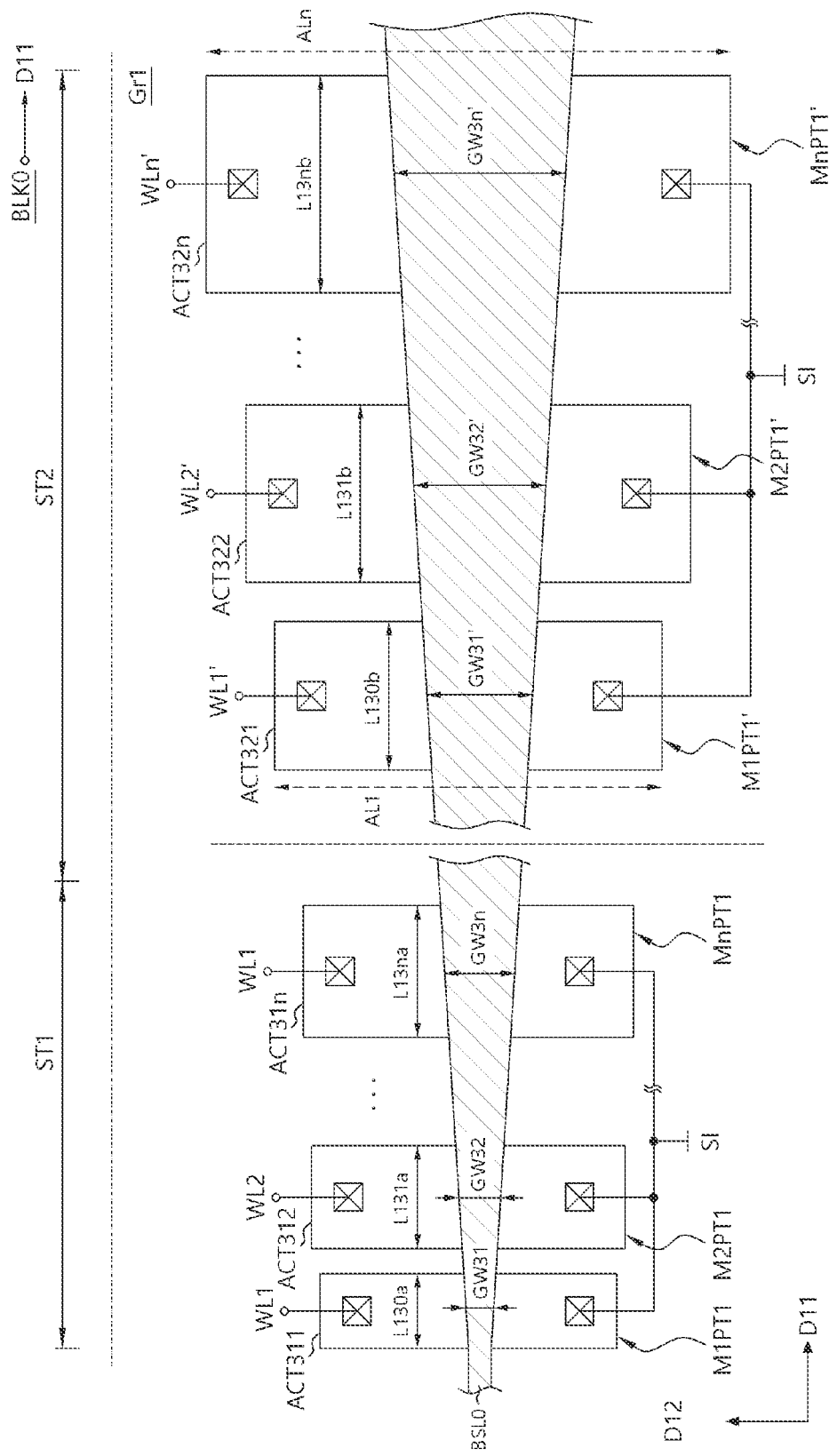

Referring to FIG. 19D, third active regions ACT311~ACT31n and ACT321~ACT32n of the memory pass transistors M1PT1~MnPT1 and M1PT1'~MnPT1' may be defined to have different areas (sizes) based on the positions of the word lines WL1~WLn of the lower memory stack ST1 that are connected to sources of the memory pass transistors M1PT1~MnPT1, and the positions of the word lines WL1'~WLn' of the upper memory stack ST2 that are connected to sources of the memory pass transistors M1PT1'~MnPT1'.

In example embodiments, the areas of the third active regions ACT311~ACT31n and ACT321~ACT32n of the memory pass transistors M1PT1~MnPT1 and M1PT1'~MnPT1' may be set to gradually increase in proportion to distances between each of word lines WL1~WLn and WL1'~WLn' connected thereto and the substrate SUB. For example, a channel width L13na of the third active region ACT31n may be larger than the channel widths L131a~L13n-1a of the third active regions ACT311 to ACT31n-1.

Further, a channel width L13nb and a length ALn of the third active region ACT32n may be larger than channel widths L130b~L13n-1b and lengths AL1~ALn-1 of the third active regions ACT321 to ACT32n-1.

In example embodiments, a line width of the first block selection line BSL0 may be set to gradually increase from the first memory pass transistor M1PT1 for controlling the lower memory stack ST1 toward the nth memory pass transistor MnPT1' for controlling the upper memory stack ST2. For example, the gate width GW3n of the nth memory transistor MnPT1 for controlling the lower memory stack ST1 may be larger than the gate widths GW31 to GW3n-1 of the memory pass transistors M1PT1 to M1PTn-1 for controlling the lower memory stack ST1. For example, the gate width GW3n' of the nth memory transistor MnPT1' for controlling the upper memory stack ST2 may be larger than the gate widths GW31 to GW3n of the memory pass transistors M1PT1 to M1PTn for controlling the lower memory stack ST1 and the gate widths GW31' to GW3n-1' of the memory pass transistors M1PT1' to M1PTn-1' for controlling the upper memory stack ST2.

Accordingly, signal delay characteristics of multi stacks may be improved by adjusting the gate widths and of the pass transistors.

The example embodiment of FIG. 19D shows linearly increasing BSL0. However, various embodiments of the disclosure need not be so limited. For example, other embodiments have step-wise increasing BSL0, or other non-linear increase, at appropriate locations. Still other embodiments may show other means of increasing BSL0, including combinations of various linear and/or non-linear increases.

Although various embodiments have been described for illustrative purposes, it will be apparent to those skilled in the art that various changes and modifications may be made without departing from the spirit and scope of the disclosure as defined in the following claims.

What is claimed is:

1. A semiconductor memory device comprising:
   a memory cell array including at least one memory block, the memory block including at least one source selection line, a plurality of word lines, at least one drain selection line, and at least one dummy word line, which are stacked, and
   a pass transistor (TR) unit including: at least one source pass transistor configured to selectively transmit a source driving signal to the source selection line, a plurality of memory pass transistors configured to selectively transmit a word line driving signal to the plurality of word lines, respectively, at least one drain pass transistor configured to selectively transmit a drain driving signal to the drain selection line, and at least one dummy pass transistor configured to selectively transmit a dummy word line driving signal to the at least one dummy word line,
   wherein the source driving signal, the word line driving signal, the drain driving signal, and the dummy word line driving signal are each associated with a respective voltage range, and
   wherein sizes of the source pass transistor, the plurality of memory pass transistors, the drain pass transistor, and the at least one dummy pass transistor are set based on the respective voltage ranges.

2. The semiconductor memory device according to claim 1,
   wherein the sizes of the source pass transistor, the plurality of memory pass transistors, the drain pass transistor, and the at least one dummy pass transistor are set in proportion to the respective voltage ranges of the source driving signal, the word line driving signal, the drain driving signal, and the dummy word line driving signal.

3. The semiconductor memory device according to claim 1,
   wherein the source pass transistor, the plurality of memory pass transistors, the drain pass transistor, and the at least one dummy pass transistor are configured to be simultaneously turned on based on a selection signal.

4. The semiconductor memory device according to claim 1, wherein the sizes of the source pass transistor, the plurality of memory pass transistors, the drain pass transistor, and the at least one dummy pass transistor include areas of active regions in which the source pass transistor, the plurality of memory pass transistors, the drain pass transistor, and the at least one dummy pass transistor are respectively formed.

5. The semiconductor memory device according to claim 1, wherein the sizes of the source pass transistor, the plurality of memory pass transistors, the drain pass transistor, and the at least one dummy pass transistor include gate widths of source pass transistor, the plurality of memory pass transistors, the drain pass transistor, and the at least one dummy pass transistor.

6. The semiconductor memory device according to claim 1, wherein at least two of the respective voltage ranges are independent of each other.

7. The semiconductor memory device according to claim 1, wherein each of the respective voltage ranges is different from the others of the respective voltage ranges.

8. A semiconductor memory device comprising:
a memory cell array including a lower memory stack and an upper memory stack arranged over the lower memory stack, each of the lower and the upper memory stacks including at least one selection line and a plurality of word lines that are stacked, and
a pass transistor (TR) unit disposed under the memory cell array, the pass TR unit including at least one first pass transistor configured to selectively transmit a first driving signal to the selection line of the lower memory stack, a plurality of first memory pass transistors configured to selectively transmit a word line driving signal to the plurality of word lines of the lower memory stack, a plurality of second memory pass transistors configured to selectively transmit the word line driving signal to the plurality of word lines of the upper memory stack, and at least one second pass transistor configured to selectively transmit a second driving signal to the selection line of the upper memory stack,
wherein the at least one first pass transistor, the plurality of first memory pass transistors, the plurality of second memory pass transistors, and the at least one second memory pass transistor are configured to be simultaneously turned on in response to a selection signal, and
wherein driving forces of the plurality of second memory pass transistors are greater than driving forces of the plurality of first memory pass transistors.

9. The semiconductor memory device according to claim 8,
wherein the driving forces of the first and second memory pass transistors are determined by areas of active regions in which the first and second memory pass transistors are formed.

10. The semiconductor memory device according to claim 9,
wherein the active regions of the plurality of second memory pass transistors are larger than the active regions of the plurality of first memory pass transistors.

11. The semiconductor memory device according to claim 9,
wherein gate widths of the plurality of second memory pass transistors are larger than gate widths of the plurality of first memory pass transistors.

12. The semiconductor memory device according to claim 8,
wherein areas of the active regions of the first and second memory pass transistors are variable based on a position of each word line of the lower and upper stacks which is connected to each of the first and second memory pass transistors variable based on a position of.

13. The semiconductor memory device according to claim 8,
wherein gate widths of the first and second memory pass transistors are variable based on a position of each word line of the lower and upper stacks which is connected to each of the first and second memory pass transistors in the memory cell array.

14. The semiconductor memory device according to claim 8, further comprising:
a dummy memory cell transistor disposed between the lower memory stack and the upper memory stack, configured to reduce a gap between a performance of the lower memory stack and a performance of the upper memory stack.

15. The semiconductor memory device according to claim 14, wherein the memory cell array further includes a plurality of memory cell strings connected to the selection lines of the lower and upper memory stacks, and the plurality of word lines of the lower and upper memory stacks,
wherein each of the memory cell strings includes:
at least one source selection transistor connected to the selection line of the lower memory stack;
a plurality of memory cell transistors connected to the word lines of the lower memory stack and the word lines of the upper memory stack, respectively; and
at least one drain selection transistor connected to the selection line of the upper memory stack, and
wherein the dummy memory transistor is connected between the memory cell transistors located at the boundaries of the lower memory stack and the upper memory stack.

* * * * *